US008968990B2

(12) United States Patent
Yokoya et al.

(10) Patent No.: US 8,968,990 B2
(45) Date of Patent: *Mar. 3, 2015

(54) METHOD OF FORMING RESIST PATTERN

(75) Inventors: Jiro Yokoya, Kawasaki (JP); Tsuyoshi Nakamura, Kawasaki (JP); Hiroaki Shimizu, Kawasaki (JP); Hideto Nito, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 79 days.

This patent is subject to a terminal disclaimer.

(21) Appl. No.: 13/614,017

(22) Filed: Sep. 13, 2012

(65) Prior Publication Data
US 2013/0189618 A1   Jul. 25, 2013

(30) Foreign Application Priority Data

Sep. 15, 2011 (JP) ................ 2011-202030
Sep. 22, 2011 (JP) ................ 2011-208013
Sep. 28, 2011 (JP) ................ 2011-212490

(51) Int. Cl.
| G03F 7/26 | (2006.01) |
| G03F 7/20 | (2006.01) |
| G03F 7/004 | (2006.01) |
| G03F 7/38 | (2006.01) |
| G03F 7/039 | (2006.01) |

(52) U.S. Cl.
CPC ...... G03F 7/20 (2013.01); G03F 7/004 (2013.01); G03F 7/0045 (2013.01); G03F 7/38 (2013.01); G03F 7/0397 (2013.01)
USPC .......................... 430/330; 430/322

(58) Field of Classification Search
CPC ......... G03F 7/004; G03F 7/0045; G03F 7/20; G03F 7/38
USPC ................................ 430/322, 330
See application file for complete search history.

(56) References Cited

U.S. PATENT DOCUMENTS

| 5,595,856 A | 1/1997 | Mochizuki et al. |
| 5,627,010 A | 5/1997 | Pai et al. |
| 5,650,261 A | 7/1997 | Winkle |
| 5,945,517 A | 8/1999 | Nitta et al. |
| 6,153,733 A | 11/2000 | Yukawa et al. |
| 6,420,503 B1 | 7/2002 | Jayaraman et al. |
| 6,653,043 B1 | 11/2003 | Hanabata |
| 6,815,142 B1 | 11/2004 | Kimura et al. |
| 7,625,690 B2 | 12/2009 | Mizutani et al. |
| 7,968,276 B2 | 6/2011 | Takeshita |
| 8,268,529 B2 | 9/2012 | Dazai et al. |
| 8,486,605 B2 | 7/2013 | Takeshita et al. |
| 2002/0160316 A1 | 10/2002 | Richter et al. |
| 2002/0187436 A1 | 12/2002 | Richter et al. |
| 2003/0211417 A1* | 11/2003 | Fryd et al. ............. 430/270.1 |
| 2004/0110085 A1 | 6/2004 | Iwai et al. |
| 2006/0234164 A1 | 10/2006 | Rhodes et al. |
| 2007/0105040 A1* | 5/2007 | Toukhy et al. ............. 430/270.1 |
| 2008/0153030 A1 | 6/2008 | Kobayashi et al. |
| 2009/0197204 A1 | 8/2009 | Shiono et al. |
| 2009/0317743 A1 | 12/2009 | Shiono et al. |
| 2010/0035192 A1 | 2/2010 | Ando et al. |
| 2010/0047724 A1 | 2/2010 | Takeshita et al. |
| 2010/0178618 A1 | 7/2010 | Hatakeyama et al. |
| 2010/0304297 A1 | 12/2010 | Hatakeyama et al. |
| 2010/0310985 A1 | 12/2010 | Mori et al. |
| 2011/0014570 A1 | 1/2011 | Mizutani et al. |
| 2011/0091812 A1 | 4/2011 | Hatakeyama et al. |
| 2011/0117499 A1 | 5/2011 | Matsumiya et al. |
| 2011/0233048 A1 | 9/2011 | Kuramoto et al. |
| 2012/0177891 A1 | 7/2012 | Millward et al. |
| 2012/0202158 A1 | 8/2012 | Hatakeyama et al. |
| 2013/0017500 A1 | 1/2013 | Yokoya et al. |
| 2013/0078572 A1 | 3/2013 | Shimizu et al. |
| 2013/0164693 A1 | 6/2013 | Takeshita |

FOREIGN PATENT DOCUMENTS

| JP | A-06-194847 | 7/1994 |
| JP | A-09-208554 | 8/1997 |
| JP | A-11-035551 | 2/1999 |
| JP | A-11-035552 | 2/1999 |

(Continued)

OTHER PUBLICATIONS

Office Action issued on Dec. 18, 2013 in U.S. Appl. No. 13/467,549.
Office Action issued on Aug. 23, 2013 for U.S. Appl. No. 13/667,237.
Office Action issued on Sep. 13, 2013 for U.S. Appl. No. 13/624,639.
Office Action issued on Oct. 24, 2013 for U.S. Appl. No. 13/624,638.
Borodovsky, "Marching to the beat of Moore's Law", Proceedings of SPIE, vol. 6153, pp. 615301-1-615301-19, 2006.
Ebihara et al., "Beyond $k_1=0.25$ lithography: 70nm L/S patterning using KrF scanners", Proceedings of SPIE, vol. 5256, pp. 985-994, 2003.
Gil et al., "First Microprocessors with Immersion Lithography", Proceedings of SPIE, vol. 5754, pp. 119-128, 2005.

(Continued)

*Primary Examiner* — Kathleen Duda
(74) *Attorney, Agent, or Firm* — Knobbe Martens Olson & Bear LLP

(57) ABSTRACT

A method of forming a resist pattern, including: step (1) in which a resist composition including a base component, a photobase generator component and an acid supply component is applied to a substrate to form a resist film; step (2) in which the resist film is subjected to exposure without being subjected to prebaking; step (3) in which baking is conducted after step (2), such that, at an exposed portion of the resist film, the base generated from the photobase generator component upon the exposure and an acid derived from the acid supply component are neutralized, and at an unexposed portion of the resist film, the solubility of the base component in an alkali developing solution is increased by the action of the acid derived from the acid supply component; and step (4) in which the resist film is subjected to an alkali development, thereby forming a negative-tone resist pattern.

12 Claims, 1 Drawing Sheet

(56) References Cited

FOREIGN PATENT DOCUMENTS

| | | |
|---|---|---|
| JP | A-11-035573 | 2/1999 |
| JP | A-11-322707 | 11/1999 |
| JP | A-2000-235263 | 8/2000 |
| JP | A-2000-330270 | 11/2000 |
| JP | A-2003-241385 | 8/2003 |
| JP | A-2006-291177 | 10/2006 |
| JP | A-2007-279493 | 10/2007 |
| JP | A-2008-174515 | 7/2008 |
| JP | A-2009-025723 | 2/2009 |
| JP | A-2010-002870 | 1/2010 |
| JP | A-2010-032994 | 2/2010 |
| JP | A-2010-040849 | 2/2010 |
| JP | A-2010-152299 | 7/2010 |
| JP | A-2010-217855 | 9/2010 |
| JP | A-2010-277043 | 12/2010 |
| JP | A-2011-008001 | 1/2011 |
| JP | A-2011-013569 | 1/2011 |
| JP | A-2011-102974 | 5/2011 |
| JP | A-2011-128226 | 6/2011 |
| JP | A-2011-225645 | 11/2011 |
| WO | WO 2004/074242 A2 | 9/2004 |

OTHER PUBLICATIONS

Landie et al., "Fundamental Investigation of Negative Tone Development (NTD) for the 22nm node (and beyond)", Proceedings of SPIE, vol. 7972, pp. 797206-1-797206-12, 2011.
Office Action issued in U.S. Appl. No. 13/732,632 on Jun. 5, 2014.
Office Action issued in U.S. Appl. No. 13/718,269 on Jun. 18, 2014.
Office Action mailed Mar. 27, 2014 in U.S. Appl. No. 13/667,237.
Office Action mailed Apr. 2, 2014 in U.S. Appl. No. 13/626,549.
Notice of Allowance in U.S. Appl. No. 13/732,632, mailed on Oct. 7, 2014.
Office Action in U.S. Appl. No. 13/850,685 mailed on Oct. 20, 2014.
Office Action in U.S. Appl. No. 13/624,639 mailed on Oct. 30, 2014.
Cho et al., Polymer Bound Photobase Generators and Photoacid Generators for Pitch Division Lithography. Apr. 16, 2011, Proc. of SPIE vol. 7972 pp. 797221-1 to 797221-8.

* cited by examiner

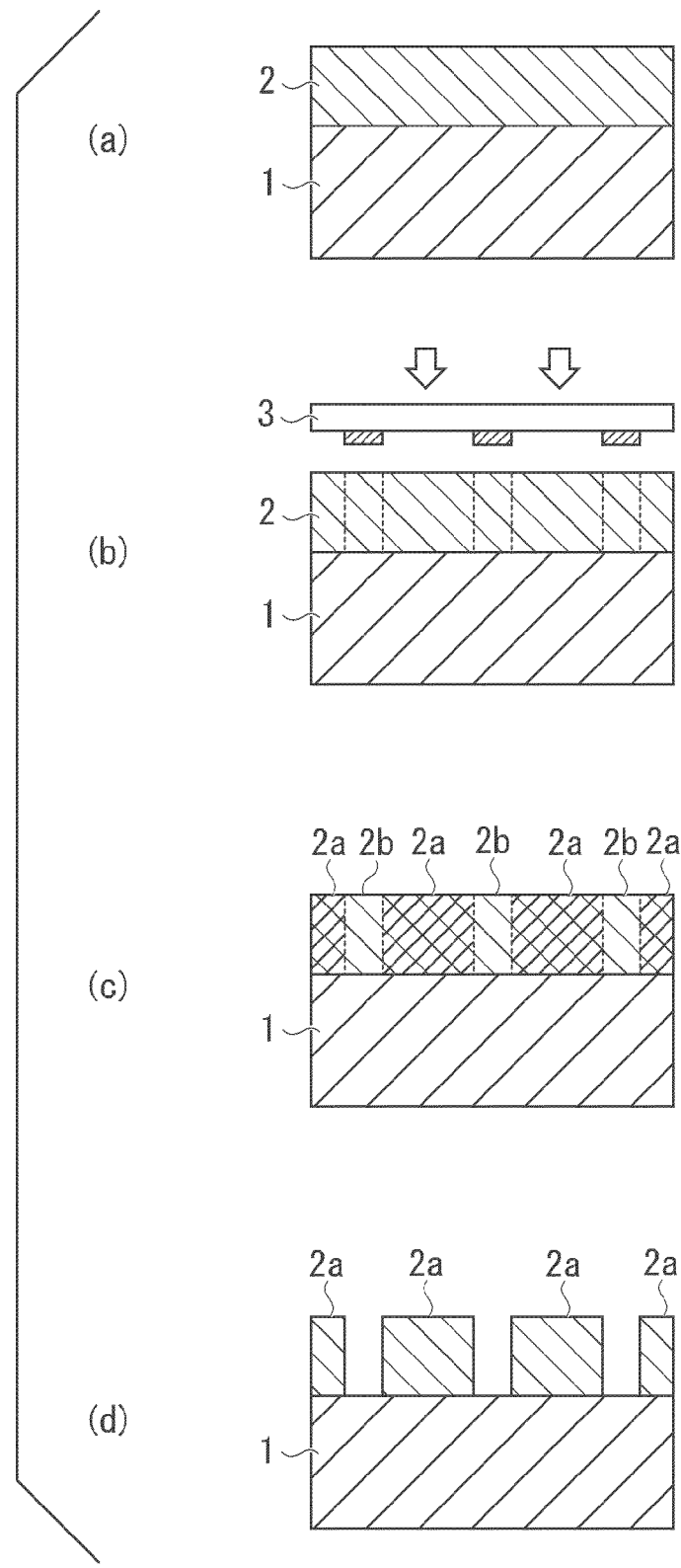

METHOD OF FORMING RESIST PATTERN

TECHNICAL FIELD

The present invention relates to a method of forming a resist pattern in which a negative resist pattern is formed by developing with an alkali developing solution.

Priority is claimed on Japanese Patent Application No. 2011-202030, filed Sep. 15, 2011, Japanese Patent Application No. 2011-208013, filed Sep. 22, 2011, and Japanese Patent Application No. 2011-212490, filed Sep. 28, 2011, the contents of which are incorporated herein by reference.

BACKGROUND ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed, for example, using a lithography method or a nanoimprint method or the like. In lithography techniques, for example, a resist film composed of a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution. Alternatively, organic solvents such as aromatic solvents, aliphatic hydrocarbon solvents, ether solvents, ketone solvents, ester solvents, amide solvents and alcohol solvents are used as the developing solution (for example, see Patent Documents 1 and 2).

In recent years, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, it is required to improve various lithography properties of the resist material, such as the sensitivity to the exposure light source and a resolution capable of reproducing patterns of minute dimensions. As resist materials which satisfy such requirements, chemically amplified resists are known.

As a chemically amplified composition, a composition including a base material component that exhibits a changed solubility in a developing solution under the action of acid and an acid-generator component that generates acid upon exposure is generally used. For example, in the case where an alkali developing solution is used as a developing solution (alkali developing process), a base component which exhibits increased solubility in an alkali developing solution under action of acid is used.

Conventionally, a resin (base resin) is typically used as the base component of a chemically amplified resist composition. Resins that contain structural units derived from (meth)acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin contains a plurality of structural units for improving lithography properties and the like. For example, a structural unit having a lactone structure and a structural unit having a polar group such as a hydroxy group are used, as well as a structural unit having an acid decomposable group which is decomposed by the action of an acid generated from the acid generator to form an alkali soluble group (for example, see Patent Document 3). When the base resin is an acrylic resin, as the acid decomposable group, in general, resins in which the carboxy group of (meth)acrylic acid or the like is protected with an acid dissociable group such as a tertiary alkyl group or an acetal group are used.

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted by applying a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

As a lithography technique which has been recently proposed, a double patterning method is known in which patterning is conducted two or more times to form a resist pattern (for example, see Non-Patent Documents 2 and 3). There are several different types of double patterning process, for example, (1) a method in which a lithography step (from application of resist compositions to exposure and developing) and an etching step are performed twice or more to form a pattern and (2) a method in which the lithography step is successively performed twice or more. According to the double patterning method, a resist pattern with a higher level of resolution can be formed, as compared to the case where a resist pattern is formed by a single lithography step (namely, a single patterning process), even when a light source with the same exposure wavelength is used, or even when the same resist composition is used. Furthermore, double patterning process can be conducted using a conventional exposure apparatus.

Moreover, a double exposure process has also been proposed in which a resist film is formed, and the resist film is subjected to exposure twice or more, followed by development to form a resist pattern (for example, see Patent Document 4). Like the double patterning process described above, this type of double exposure process is also capable of forming a resist pattern with a high level of resolution, and also has an advantage in that fewer number of steps is required than the above-mentioned double patterning process.

In a positive tone development process using a positive type, chemically amplified resist composition (i.e., a chemically amplified resist composition which exhibits increased alkali solubility in an alkali developing solution upon exposure) in combination with an alkali developing solution, as described above, the exposed portions of the resist film are dissolved and removed by an alkali developing solution to thereby form a resist pattern. The positive tone process using a combination of a positive chemically amplified resist composition and an alkali developing solution is advantageous over a negative tone development process in which a negative type, chemically amplified resist composition is used in combination with an alkali developing solution in that the structure of the photomask can be simplified, a satisfactory contrast for forming an image can be reliably obtained, and the characteristics of the formed resist pattern are excellent. For these reasons, currently, positive-tone development process using a combination of a positive chemically amplified resist composition and an alkali developing solution is mainly employed in the formation of an extremely fine resist pattern.

DOCUMENTS OF RELATED ART

Patent Document

[Patent Document 1] Japanese Unexamined Patent Application, First Publication No. Hei 6-194847
[Patent Document 2] Japanese Unexamined Patent Application, First Publication No. 2009-025723
[Patent Document 3] Japanese Unexamined Patent Application, First Publication No. 2003-241385
[Patent Document 4] Japanese Unexamined Patent Application, First Publication No. 2010-040849

Non-Patent Documents

[Non-Patent Document 1] Proceedings of SPIE (U.S.), vol. 5754, pp. 119-128 (2005)
[Non-Patent Document 2] Proceedings of SPIE (U.S.), vol. 5256, pp. 985-994 (2003)
[Non-Patent Document 3] Proceedings of SPIE (U.S.), vol. 6153, pp. 615301-1-19 (2006)

SUMMARY OF THE INVENTION

However, as further progress is made in lithography techniques and the application field for lithography techniques expand, further improvement in various lithography properties is demanded in a positive-tone developing process using a combination of a positive chemically amplified resist composition and an alkali developing solution.

For example, in the formation of an extremely small pattern (such as an isolated trench pattern, an extremely small, dense contact hole pattern, or the like), a region where the optical strength becomes weak is likely to be generated especially in the film thickness direction, thereby deteriorating the resolution of the resist pattern.

In the formation of the aforementioned extremely small pattern, a method of forming a resist pattern (negative pattern) in which regions where the optical strength becomes weak are selectively dissolved and removed is useful. For forming a negative pattern with a chemically amplified resist composition used in a positive-tone developing process which is the mainstream, a method in which a developing solution containing an organic solvent (organic developing solution) is used in combination with a chemically amplified resist composition is known. However, negative-tone developing process is inferior to a positive-tone developing process using an alkali developing solution in combination with a chemically amplified resist composition in terms of environment, apparatus and cost. Thus, a novel method of forming a resist pattern has been demanded which is capable of forming a negative-tone pattern with a high contrast image.

In addition, in order to perform patterning of a minute pattern with a high precision, it becomes important to control the film thickness to be uniform in the formation of a resist film on a substrate. In particular, as the film thickness of a resist film becomes smaller, the uniformity of the film thickness has great influence on the lithography properties and the pattern shape.

Further, as a result of the studies of the present inventors, in the working examples of the Patent Documents 1 to 4, baking (prebaking; PAB) is conducted after applying the materials (resist composition). Such prebaking after the application is a heating treatment generally conducted. However, in the method of forming a negative pattern, since such treatment has been omitted, a new problem arose in terms of film formability.

Moreover, when there is a problem in terms of film formability, in the aforementioned immersion exposure process, there is a problem that the resist composition is eluted to the immersion medium during the immersion exposure, thereby increasing the risk of generation of defects and delamination of the film (pattern). The term "defects" refers to general deficiencies within a resist film that are detected when observed from directly above the developed resist pattern using, for example, a surface defect detection apparatus (product name: "KLA") manufactured by KLA-TENCOR Corporation. Examples of these deficiencies include deficiencies caused by adhesion of foreign matters and precipitates on the surface of the resist pattern, such as post-developing scum (residual resist), foam and dust; deficiencies related to resist pattern shape, such as bridges formed between line patterns, and filling-up of holes of a contact hole pattern; and color irregularities of a pattern.

The present invention takes the above circumstances into consideration, with an object of providing a method of forming a resist pattern which enables formation of a negative-tone resist pattern with a high resolution.

Further, the present invention has an object of providing a method of forming a resist composition which can form a negative-tone resist pattern, and a resist composition which is usable in the method and is capable of forming a resist film on a substrate with an excellent uniformity of film thickness.

Furthermore, the present invention has an object of providing a method of forming a resist pattern which enables formation of a negative-tone pattern by an alkali developing process and suppression of elution.

As a result of intensive studies, the present inventors have found a method capable of forming a negative pattern in which a resist film formed by a resist composition containing a base component that exhibits increased solubility in an alkali developing solution by the action of an acid has the exposed portions remaining and the unexposed portions dissolved and removed by an "alkali developing solution" (Japanese Patent Application No. 2011-106577). As a result of further studies, the present inventors have found a method in which a negative-tone pattern can be formed with a higher contrast image. The present invention has been completed based on this finding.

The method of forming a resist pattern according to a first aspect of the present invention includes: a step (1) in which a resist composition including a base component that exhibits increased solubility in an alkali developing solution, a photobase generator component that generates base upon exposure and an acid supply component is applied to a substrate to form a resist film; a step (2) in which the resist film is subjected to exposure without being subjected to prebaking; a step (3) in which baking is conducted after the step (2), such that, at an exposed portion of the resist film, the base generated from the photobase generator component upon the exposure and an acid derived from the acid supply component are neutralized, and at an unexposed portion of the resist film, the solubility of the base component in an alkali developing solution is increased by the action of the acid derived from the acid supply component; and a step (4) in which the resist film is subjected to an alkali development, thereby forming a negative-tone resist pattern in which the unexposed portion of the resist film has been dissolved and removed.

Further, as a result of intensive studies, the present inventors have found another method capable of forming a negative pattern in which a resist film formed by a resist composition containing a base component that exhibits increased solubility in an alkali developing solution by the action of an acid has the exposed portions remaining and the unexposed portions dissolved and removed by an "alkali developing solution" (Japanese Patent Application No. 2011-202030). In this method, the prebaking after the application of the resist composition on a substrate is omitted, so as to improve the resolution of the resist pattern. As a result of further studies of the present inventors, they found a new method in which a resist film can be more reliably formed on a substrate with a uniform film thickness, and is capable of forming a negative-tone pattern with a higher contrast image. The present invention has been completed based on this finding.

The resist composition according to a second aspect of the present invention is a resist composition used in a method including: a step (1') in which a resist composition including a base component that exhibits increased solubility in an alkali developing solution, a photobase generator component that generates base upon exposure and an acid supply component dissolved in an organic solvent component (S) is applied to a substrate to form a resist film; a step (2') in which the resist film is subjected to exposure without being subjected to prebaking; a step (3') in which baking is conducted after the step (2'), such that, at an exposed portion of the resist film, the base generated from the photobase generator component upon the exposure and an acid derived from the acid supply component are neutralized, and at an unexposed portion of the resist film, the solubility of the base component in an alkali developing solution is increased by the action of the acid derived from the acid supply component; and a step (4') in which the resist film is subjected to an alkali development, thereby forming a negative-tone resist pattern in which the unexposed portion of the resist film has been dissolved and removed, wherein the resist composition is the resist composition used in step (1'), and a sum $[\Sigma(T \times r/100)]$ of a product of the boiling point T (° C.) of an organic solvent within the organic solvent component (S) and the proportion r (weight %) of the organic solvent within the organic solvent component (S) is 160° C. or lower.

The method of forming a resist pattern according to a third aspect of the present invention includes: a step (1') in which a resist composition including a base component that exhibits increased solubility in an alkali developing solution, a photobase generator component that generates base upon exposure and an acid supply component dissolved in an organic solvent component (S) is applied to a substrate to form a resist film, wherein a sum $[\Sigma(T \times r/100)]$ of a product of the boiling point T (° C.) of an organic solvent within the organic solvent component (S) and the proportion r (weight %) of the organic solvent within the organic solvent component (S) is 160° C. or lower; a step (2') in which the resist film is subjected to exposure without being subjected to prebaking; a step (3') in which baking is conducted after the step (2'), such that, at an exposed portion of the resist film, the base generated from the photobase generator component upon the exposure and an acid derived from the acid supply component are neutralized, and at an unexposed portion of the resist film, the solubility of the base component in an alkali developing solution is increased by the action of the acid derived from the acid supply component; and a step (4') in which the resist film is subjected to an alkali development, thereby forming a negative-tone resist pattern in which the unexposed portion of the resist film has been dissolved and removed.

Furthermore, as a result of intensive studies, the present inventors have found that, in a method capable of forming a negative pattern in which a resist film formed by a resist composition containing a base component that exhibits increased solubility in an alkali developing solution by the action of an acid has the exposed portions remaining and the unexposed portions dissolved and removed by an "alkali developing solution", even when the prebaking treatment is omitted, the risk of elution in this method can be reduced. The present invention has been completed based on this finding.

The method of forming a resist pattern according to a fourth aspect of the present invention includes: a step (1") in which a resist composition including a base component that exhibits increased solubility in an alkali developing solution, a photobase generator component that generates base upon exposure and an acid supply component is applied to a substrate by a spin-coat method to form a resist film; a step (2") in which the resist film is subjected to exposure without being subjected to prebaking; a step (3") in which baking is conducted after the step (2"), such that, at an exposed portion of the resist film, the base generated from the photobase generator component upon the exposure and an acid derived from the acid supply component are neutralized, and at an unexposed portion of the resist film, the solubility of the base component in an alkali developing solution is increased by the action of the acid derived from the acid supply component; and a step (4") in which the resist film is subjected to an alkali development, thereby forming a negative-tone resist pattern in which the unexposed portion of the resist film has been dissolved and removed, wherein, in application of the resist composition in step (1"), a rotation time after supplying the resist composition on the substrate is 50 seconds or more.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic divalent saturated hydrocarbon, unless otherwise specified.

A "halogenated alkyl group" is a group in which part or all of the hydrogen atoms of an alkyl group is substituted with a halogen atom, and a "halogenated alkylene group" is a group in which part or all of the hydrogen atoms of an alkylene group is substituted with a halogen atom. Examples of the halogen atom include a fluorine atom, a chlorine atom, a bromine atom and an iodine atom.

A "hydroxyalkyl group" is a group in which part or all of the hydrogen atoms within an alkyl group have been substituted with a hydroxyl group.

The term "structural unit" refers to a monomer unit that contributes to the formation of a polymeric compound (resin, polymer, copolymer).

The term "exposure" is used as a general concept that includes irradiation with any form of radiation.

"Prebake" refers to a heat treatment of 70° C. or higher that is conducted after applying the resist composition to the substrate and before conducting exposure using a hot plate or the like.

According to the first aspect of the present invention, there is provided a method of forming a resist pattern in which a negative-tone pattern can be formed with a high resolution.

Further, according to the second and third aspects of the present invention, there are provided a method of forming a resist composition which can form a negative-tone resist pattern, and a resist composition which is usable in the method and is capable of forming a resist film on a substrate with an excellent uniformity of film thickness.

Furthermore, according to the fourth aspect of the present invention, there is provided a method of forming a resist pattern which enables formation of a negative-tone pattern with suppressed elution.

BRIEF DESCRIPTION OF THE DRAWINGS

FIG. 1 is a schematic diagram showing an example of one embodiment of the method of forming a resist pattern according to the present invention.

DETAILED DESCRIPTION OF THE INVENTION

<<First Aspect: Method of Forming Resist Pattern (I)>>

The method of forming a resist pattern according to a first aspect of the present invention (hereafter, sometimes referred to as "method of forming resist pattern (I)") includes: a step (1) in which a resist composition including a base component that exhibits increased solubility in an alkali developing solution, a photobase generator component that generates base upon exposure and an acid supply component is applied to a substrate to form a resist film; a step (2) in which the resist film is subjected to exposure without being subjected to prebaking; a step (3) in which baking is conducted after the step (2), such that, at an exposed portion of the resist film, the base generated from the photobase generator component upon the exposure and an acid derived from the acid supply component are neutralized, and at an unexposed portion of the resist film, the solubility of the base component in an alkali developing solution is increased by the action of the acid derived from the acid supply component; and a step (4) in which the resist film is subjected to an alkali development, thereby forming a negative-tone resist pattern in which the unexposed portion of the resist film has been dissolved and removed.

In the present invention, "prebake" refers to a heat treatment of 70° C. or higher that is conducted after applying the resist composition to the substrate and before conducting exposure using a hot plate or the like.

A "negative-tone resist pattern" refers to a resist pattern in which an unexposed portion of the resist film is dissolved and removed by an alkali developing solution, and an exposed portion remains as a pattern.

Hereinbelow, the method of forming a resist pattern according to the present invention will be described, with reference to the drawings. However, the present invention is not limited to these embodiments.

FIG. 1 shows an example of one embodiment of the method of forming a resist pattern according to the present invention.

In this embodiment, a resist composition containing a base component that exhibits increased solubility in an alkali developing solution, a photobase generator component that generates a base upon exposure, and an acidic compound as an acid supply component is used.

Firstly, as shown in FIG. 1(a), the resist composition is applied to a substrate 1 to form a resist film 2 (step (1); FIG. 1(a)).

Next, as shown in FIG. 1(b), without subjecting the formed resist film 2 to prebaking (PAB), the resist film 2 is subjected to exposure through a photomask 3 having a predetermined pattern formed thereon. As a result, in the exposed region (exposed portions) of the resist film 2, a base is generated from the photobase generator component upon exposure (step (2); FIG. 1(b)).

After exposure, baking (post exposure bake (PEB)) is conducted. By this baking, at the unexposed portions 2b of the resist film 2, the solubility of the base component in an alkali developing solution can be increased by the action of the acid (acidic compound) supplied to the resist film 2 by adding the acidic compound to the resist composition. On the other hand, at exposed portions 2a, a neutralization reaction between the base generated from the photobase generator component upon exposure and the acid supplied to the resist film 2 proceeds, so that the solubility of the base component in an alkali developing is either unchanged or only slightly changed. As a result, a difference in the dissolution rate in an alkali developing solution (dissolution contrast) occurs between the exposed portions 2a and the unexposed portions 2b (step (3); FIG. 1(c)).

Thereafter, developing is conducted using an alkali developing solution. By conducting development, the exposed portions 2a of the resist film 2 remains, and the unexposed portions 2b of the resist film 2 are dissolved and removed. As a result, as shown in FIG. 1(d), a resist pattern including a plurality of resist patterns 2a arranged at intervals is formed on the substrate 1 (step (4); FIG. 1(d)).

[Step (1)]

In this embodiment, a resist composition containing a base component that exhibits increased solubility in an alkali developing solution, a photo-base generator component that generates a base upon exposure, and an acidic compound as an acid supply component is applied to the substrate 1 to form a resist film 2.

The substrate 1 is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate 1, any one of the above-mentioned substrates provided with an inorganic and/or organic film on the surface thereof may be used, and a substrate provided with an organic film is preferable. As the inorganic film, an inorganic antireflection film (inorganic BARC) can be used. As the organic film, an organic antireflection film (organic BARC) and an organic film such as a lower-layer organic film used in a multilayer resist method can be used. It is particularly desirable that an organic film is provided because a pattern can be reliably formed on the substrate with a high aspect ratio which is useful in the production of semiconductors.

Here, a "multilayer resist method" is method in which at least one layer of an organic film (lower-layer film) and at least one layer of a resist film are provided on a substrate, and a resist pattern formed on the upper resist film is used as a mask to conduct patterning of the lower-layer film. This method is considered as being capable of forming a pattern with a high aspect ratio. The multilayer resist method is broadly classified into a method in which a double-layer structure consisting of an upper-layer resist film and a lower-layer film is formed, and a method in which a multilayer structure having at least three layers composed of an upper-layer resist film, a lower-layer film and at least one intermediate layer (thin metal film or the like) provided between the upper-layer resist film and the lower-layer film. In the multilayer resist method, a desired thickness can be ensured by the lower-layer film, and as a result, the thickness of the resist film can be reduced, and an extremely fine pattern with a high aspect ratio can be formed.

An inorganic film can be formed, for example, by coating an in organic anti-reflection film composition such as a silicon-based material on a substrate, followed by baking.

An organic film can be formed, for example, by dissolving a resin component and the like for forming the film in an organic solvent to obtain an organic film-forming material, coating the organic film-forming material on a substrate using a spinner or the like, and baking under heating conditions preferably in the range of 200 to 300° C. for 30 to 300 seconds, more preferably for 60 to 180 seconds. The organic film-forming material does not need to have susceptibility to light or electron beam like a resist film, and the organic film-forming material may or may not have such susceptibility. More specifically, a resist or a resin generally used in the production of a semiconductor device or a liquid crystal display device can be used.

Further, it is preferable that the organic film-forming material can be subjected to etching, particularly dry etching, so that, by etching the organic film using a resist pattern, the resist pattern can be transferred to the organic film, and an organic film pattern can be formed. It is particularly desirable to use an organic film-forming material which can be subjected to oxygen plasma etching or the like. As such an organic film-forming material, a material conventionally used for forming an organic film such as an organic BARC can be used. Examples of such an organic film-forming material include the ARC series manufactured by Brewer Science Ltd., the AR series manufactured by Rohm and Haas Company, and the SWK series manufactured by Tokyo Ohka Kogyo Co., Ltd.

In the present embodiment, the resist composition contains a base component that exhibits increased solubility in an alkali developing solution, a photobase generator component that generates a base upon exposure, and an acidic compound as an acid supply component.

The acidic compound acts as an acid by baking (PEB) in step (3) described later. Further, at exposed portions 2a of the resist film 2, the acid (acidic compound) is neutralized by a base generated from the photobase generator component upon exposure. On the other hand, at unexposed portions 2b, the acid (acidic compound) acts on the base component, thereby increasing the solubility of the base component in an alkali developing solution.

Specific examples of the resist composition are described later in detail.

The method of applying the resist composition to the substrate 1 to form a resist film 2 is not particularly limited, and the resist film 2 can be formed by a conventional method.

For example, the resist composition can be applied to the substrate 1 by a conventional method using a spinner or the like, followed by drying at room temperature on a cooling plate or the like, so as to volatilize the organic solvent, thereby forming a resist film 2.

In the present invention, by virtue of not conducting the prebaking after applying the resist composition to the substrate and until exposure, so as not to act the acid supply component as acid, the contrast between the exposed portions 2a and the unexposed portions 2b of the resist film 2 is improved, such that a negative-tone resist pattern can be formed with a high resolution.

The present invention does not exclude the case where, after applying the resist composition to the substrate and until exposure, heating is conducted at a temperature lower than the "prebake" temperature (lower than 70° C.). (By heating at a temperature lower than the prebake temperature, for example, the surface segregation effect of the component (F) described later on the resist film can be improved without deteriorating the contrast.)

The film thickness of the resist film 2 formed in step (1) is preferably 300 nm or less, more preferably 200 nm or less, and most preferably from 50 to 150 nm.

When the film thickness of the resist film 2 is no more than the upper limit of the preferable range, by a coating method such as a spin-coating method at room temperature without prebaking, the resist composition can be more uniformly applied to the substrate 1; the organic solvent is less likely to remain in the resist film, so that the resist film can be more reliably dried; and the in-plane uniformity of the resist film 2 on the substrate 1 can be improved. In addition, by virtue of the thickness of the resist film 2 satisfying the above-mentioned preferable range, a resist pattern with a high level of resolution can be formed, and a satisfactory level of etching resistance can be achieved.

[Step (2)]

In the present embodiment, the resist film 2 formed in the step (1) without conducting prebaking is selectively exposed through a photomask 3. As a result, at exposed portions 2a, base is generated from the photobase generator component upon exposure.

With respect to the exposure dose, an amount capable of generating a base from the photobase generator component in an amount necessary to neutralize the acid present in the exposed portions 2a is sufficient.

The wavelength to be used for exposure is not particularly limited and the exposure can be conducted using radiation such as KrF excimer laser, ArF excimer laser, $F_2$ excimer laser, extreme ultraviolet rays (EUV), vacuum ultraviolet rays (VUV), electron beam (EB), X-rays, and soft X-rays. In terms of forming a fine resist pattern, ArF excimer laser, EUV or EB is preferable, and ArF excimer laser is particularly desirable.

The photomask 3 is not particularly limited, and a conventional mask can be used. For example, a binary mask in which the transmittance of the light shielding portion is 0% or a halftone-phase shift mask (HT-mask) in which the transmittance of the light shielding portion is 6% can be used. The unexposed portions can be selectively formed by using a halftone-phase shift mask.

As a binary mask, those in which a chromium film, a chromium oxide film, or the like is formed as a light shielding portion on a quartz glass substrate are generally used.

A phase shift mask is a photomask provided with a portion (shifter) which changes the phase of light. Thus, by using a phase shift mask, incidence of light to unexposed portions can be suppressed, and the dissolution contrast to an alkali developing solution can be improved between unexposed portions and exposed portions. As a phase shift mask other than a halftone-phase shift mask, a Levenson-phase shift mask can be mentioned. As any of these phase shift masks, commercially available masks can be used.

Specific examples of the half-tone type phase shift masks include those in which an MoSi (molybdenum silicide) film, a chromium film, a chromium oxide film, an silicon oxynitride film, or the like is formed as a light shielding portion (shifter) exhibiting a transmittance of about several 10% (generally 6%) on a substrate generally made of quartz glass.

In the present embodiment, exposure is conducted through a photomask 3, but the present invention is not limited to this embodiment. For example, the exposure may be conducted without using a mask, e.g., selective exposure by drawing with electron beam (EB) or the like.

The exposure of the resist film 2 can be either a general exposure (dry exposure) conducted in air or an inert gas such as nitrogen, or immersion exposure (immersion lithography) through an immersion medium. In step (2), in terms of forming a resist pattern with a high resolution, it is preferable to conduct exposure through an immersion medium.

In immersion lithography, exposure (immersion exposure) is conducted in a state where the region between the lens and the resist film 2 formed on the substrate 1 (which was conventionally filled with air or an inert gas such as nitrogen) is filled with a solvent (a immersion medium) that has a larger refractive index than the refractive index of air.

More specifically, in immersion lithography, the region between the resist film 2 formed in the above-described manner and lens at the lowermost portion of the exposure apparatus is filled with a solvent (an immersion medium) that has a larger refractive index than the refractive index of air, and in this state, the resist film 2 is subjected to exposure (immersion exposure) through a predetermined photomask 3.

The immersion medium preferably exhibits a refractive index larger than the refractive index of air but smaller than the refractive index of the resist film 2 to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film 2 include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the immersion medium after the exposure can be removed by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

[Step (3)]

In the present embodiment, after the step (2), baking (post exposure bake (PEB)) is conducted.

In the baking, the temperature conditions is preferably from 50 to 200° C., more preferably from 80 to 150° C., and still more preferably from 90 to 130° C. The baking time is preferably from 10 to 300 seconds, more preferably from 40 to 120 seconds, and still more preferably from 60 to 90 seconds.

In this manner, by conducting baking of the resist film 2 after exposure, in the entire resist film 2, the acidic compound blended within the resist composition acts as acid, and at unexposed portions 2b, by the action of the acid (acidic compound), the solubility of the base component in an alkali developing solution is increased. On the other hand, at exposed portions 2a, a neutralization reaction between the base generated from the photobase generator component upon exposure and the acid (acidic compound) proceeds, so that the amount of acid which would act on the base component decreases. As a result, the solubility of the base component in an alkali developing is either unchanged or only slightly changed. As such, a difference in the dissolution rate in an alkali developing solution (dissolution contrast) occurs between the exposed portions 2a and the unexposed portions 2b.

The baking in this step (3) does not necessarily control the start of the neutralization reaction.

[Step (4)]

In the present embodiment, after the step (3), by conducting alkali developing, the unexposed portions 2b of the resist film 2 are dissolved and removed, and the exposed portions 2a are retained, thereby forming a negative resist pattern.

Specific examples of the alkali developing solution include inorganic alkalis, such as sodium hydroxide, potassium hydroxide, sodium carbonate, sodium silicate, sodium metasilicate and aqueous ammonia; primary amines, such as ethylamine and n-propyl amine; secondary amines, such as diethylamine and di-n-butylamine; tertiary amines, such as triethylamine and methyldiethylamine; alcoholamines, such as dimethylethanolamine and triethanolamine; quaternary ammonium salts, such as tetramethylammonium hydroxide and tetraethylammonium hydroxide; and cyclic amines, such as pyrrole and piperidine.

Among these examples, as the alkali developing solution, an aqueous alkali solution containing at least one member selected from the group consisting of primary amines, secondary amines, tertiary amines and quaternary ammonium salts is preferable, and an aqueous solution of tetramethylammonium hydroxide (TMAH) is particularly desirable.

Further, the aforementioned aqueous alkali solution having alcohols, surfactants added thereto in an appropriate amount may be used.

In general, the alkali concentration within the alkali developing solution (i.e., concentration of inorganic alkalis, quaternary ammonium salts or amine compounds, based on the total weight of the alkali developing solution) is from 0.01 to 20% by weight.

The alkali developing treatment can be performed by a conventional method.

After the alkali development, a rinse treatment using pure water or the like may be conducted.

In addition, after the alkali development, a further baking (post bake) may be conducted. Post bake (which is performed in order to remove water content after the alkali developing and rinsing) is generally conducted at about 100° C. preferably for 30 to 90 seconds.

In the present embodiment described above, a resist composition containing, in addition to a base component and a photobase generator component, an acidic compound as an acid supply component is used. However, a resist composition containing an acid generator component (a thermal acid generator, a photoacid generator or the like) instead of the acidic compound or together with the acidic compound may be used. Further, an acid amplifier component may be used in combination with at least one of the acidic compound and the acid generator component, since the acid concentration can be enhanced by a bake treatment such as PEB.

As the acid generator component, either or both of a compound which generates acid upon heating (thermal acid generator) and a compound which generates acid upon exposure (photoacid generator) can be used.

In the case where a resist composition containing a thermal acid generator as the acid generator component is used, by the baking (PEB) in the step (3), in the entire resist film 2, acid is generated from the thermal acid generator. At the unexposed portions 2b of the resist film 2, by the action of the acid generated from the thermal acid generator by the baking (PEB), the solubility of the base component in an alkali developing solution is increased. On the other hand, at exposed portions 2a of the resist film 2, a neutralization reaction between the acid generated from the thermal acid generator by the baking (PEB) and the base generated from the photobase generator component upon exposure in the step (2) proceeds, so that the solubility of the base component in an alkali developing is either unchanged or only slightly changed. As such, a difference in the dissolution rate in an alkali developing solution (dissolution contrast) occurs between the exposed portions 2a and the unexposed portions 2b. Therefore, even in the case where a resist composition containing a thermal acid generator is used, by virtue of not conducting the prebaking, acid derived from the thermal acid generator does not act on the base component after applying the resist composition on the substrate and until exposure. As a result, the contrast between the exposed portions 2a and the unexposed portions 2b of the resist film 2 is improved, such that a negative-tone resist pattern can be formed with a high resolution.

Further, by appropriately selecting the photomask, the base component, the photobase generator component and the like, a photoacid generator can be used as the acid generator component. For example, an embodiment in which a resist composition containing a photoacid generator having a relatively long diffusion length and a photobase generator having a relatively short diffusion length is used, and a photomask having transparency (a halftone-phase shift mask) can be mentioned. With respect to the diffusion length of acid or base, the diffusion length of acid can be controlled by skeleton or polarity of the anion moiety of the photoacid generator, and the diffusion length of base can be controlled by molecular weight and skeleton of the base after photodecomposition of the photobase generator.

In such an embodiment, by exposure in the step (2), at exposed portions 2a, base is generated from the photobase generator component, and acid is generated from the photoacid generator. At unexposed portions 2b, by the baking in the step (3), acid generated at exposed portions 2a and diffused to unexposed portions 2b acts on the base component to cause dissociation of the protection groups (deprotection reaction proceeds), thereby increasing the solubility of the base component in an alkali developing solution. On the other hand, at exposed portions 2a, neutralization reaction between the base and acid generated in the step (2) proceeds, so that the solubility of the base component (A) in an alkali developing is either unchanged or only slightly changed. As such, a difference in the dissolution rate in an alkali developing solution (dissolution contrast) occurs between the exposed portions 2a and the unexposed portions 2b.

Further, in the method of forming a resist pattern according to the present invention, between steps (2) and (3), a step (5) may be conducted in which an organic film-forming composition containing an acid supply component coated on the resist film to form an organic film. After exposure, by coating the organic film-forming composition on the resist film, followed by baking (PEB), an organic film is formed on the resist film, and acid derived from the acid supply component contained in the organic film is diffused from the organic film to the resist film, thereby supplying acid to the resist film. Thereafter, by conducting developing by an alkali developing solution, a negative-tone resist pattern with a high contrast can be formed.

Alternatively, instead of using an organic film-forming composition, an embodiment in which an acidic, activated rinse is applied to the resist film can be used. As the acidic, activated rinse, an aqueous solution containing a component (G2) described later can be used.

As the organic film-forming composition, for example, a composition containing a resin, an organic solvent and the like, in addition to the acid can be used. The resin is not particularly limited, and it is preferable to use an alkali-soluble resin because in step (4), the formed organic film can be removed during the formation of a resist pattern by alkali developing. As the alkali-soluble resin, any resin having an alkali-soluble group may be used, and examples thereof include conventional resins such as novolak resins, hydroxystyrene resins, acrylic resins and polycycloolefin resins. As the organic solvent, an organic solvent (described later) blended in the resist composition, such as an alcohol organic solvent, a fluorine organic solvent or an ether organic solvent having no hydroxyl group can be used. The acid supply component is the same as defined for the acid supply component (described later) blended in the resist composition. In the case where a photoacid generator is used as the acid generator component, the step (5) can be conducted between steps (1) and (2).

In the method of forming a resist pattern according to the present invention, after forming a negative resist pattern in the manner as described above, etching of the substrate 1 may be conducted using the negative resist pattern as a mask. By conducting such etching to transfer the resist pattern to the substrate 1, a semiconductor device or the like can be produced.

The etching can be conducted by a conventional method. For example, when the substrate 1 has an organic film formed thereon, the etching of the organic film is preferably conducted by dry etching. Among dry etching, especially in terms of production efficiency, oxygen-plasma etching or etching using a $CF_4$ gas or a $CHF_3$ gas is preferable, and oxygen-plasma etching is more preferable.

Etching of the substrate is preferably performed using a halogen gas, more preferably using a fluorinated carbon-based gas, and most preferably using a $CF_4$ gas or a $CHF_3$ gas.

(Resist Composition)

In the method of forming a resist pattern (I), a resist composition containing a base component that exhibits increased solubility in an alkali developing solution (hereafter, referred to as "component (A)"), a photobase generator component that generates a base upon exposure (hereafter, referred to as "component (C)"), and an acid supply component (hereafter, referred to as "component (Z)") is used.

In the present embodiment described above, a resist composition containing an acidic compound as the component (Z) is used.

As the resist composition, the resist composition according to the second aspect of the present invention (described later) can be used.

However, the component (S) described later is not particularly limited, and the component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

According to the method of forming a resist pattern (I) described above, a negative-tone resist pattern can be formed with a high resolution by a developing process in which a chemically amplified resist composition conventionally known as a positive type is used in combination with an alkali developing solution.

In the present invention, in the formation of a minute pattern, after applying a resist composition to a substrate to form a resist film, prebaking (PAB) is not conducted, and the resist film is subjected to exposure, followed by baking (PEB) and alkali developing, thereby forming a high contrast image. In particular, in the case where a resist composition containing an acidic compound as an acid supply component is used, the effects of the present invention become significant. As such, in the present invention, by virtue of not conducting prebaking (PAB), a high contrast can be achieved with respect to the formed resist pattern, thereby improving the resolution.

Further, according to the method of forming a resist pattern (I), the resolution becomes excellent in a resist pattern (such as an isolated trench pattern, an extremely small, dense contact hole pattern, or the like) having a region where the optical strength becomes weak (region where irradiation by exposure is not satisfactorily reached) is likely to be generated in a film thickness direction.

Further, by the method of forming a resist pattern (I), it is possible to form a highly densed resist pattern. For example, it becomes possible to form a contact hole pattern in which each of the holes are close to each other with excellent shapes, e.g., the distance between the holes is about 30 to 50 nm.

Furthermore, the method of forming a resist pattern (I) can be performed by existing exposure apparatuses and existing facilities.

In the method of forming a resist pattern (I), since prebaking is not conducted after applying a resist composition to a substrate to form a resist film in step (I) and until subjecting the resist film to exposure, the number of steps can be reduced, as compared to a conventional method of forming a resist pattern.

Moreover, by using a double exposure method in the method of forming a resist pattern (I), the number of steps can be reduced as compared to a double patterning in which each of a lithography step and a patterning step are performed at least twice.

<<Second Aspect: Resist Composition>>

The resist composition according to a second aspect of the present invention is a resist composition used in a method including: a step (1') in which a resist composition including a base component that exhibits increased solubility in an alkali developing solution, a photobase generator component that generates base upon exposure and an acid supply component dissolved in a specific organic solvent component (S) is applied to a substrate to form a resist film; a step (2') in which the resist film is subjected to exposure without being subjected to prebaking; a step (3') in which baking is conducted after the step (2'), such that, at an exposed portion of the resist film, the base generated from the photobase generator component upon the exposure and an acid derived from the acid supply component are neutralized, and at an unexposed portion of the resist film, the solubility of the base component in an alkali developing solution is increased by the action of the acid derived from the acid supply component; and a step (4') in which the resist film is subjected to an alkali development, thereby forming a negative-tone resist pattern in which the unexposed portion of the resist film has been dissolved and removed, wherein the resist composition is the resist composition used in step (1').

That is, the resist composition of the present invention includes a base component (A) (hereafter, referred to as "component (A)") which exhibits changed solubility in an alkali developing solution under action of acid, a photobase generator component (C) (hereafter, referred to as "component (C)") which generates base upon exposure and an acid supply component (hereafter, referred to as "component (Z)") dissolved in a specific organic solvent component (S) (hereafter, referred to as "component (S)"), and is used in the step (1').

The method of forming a resist pattern according to the third aspect including the steps (1') to (4') is described later.

In the present invention, the "negative-tone resist pattern" is a resist pattern in which the unexposed portions of the resist film are dissolved and removed by an alkali developing solution, and the exposed portions remain as a pattern. A resist composition for forming the negative-tone resist pattern is sometimes referred to as a "negative-tone resist composition". That is, the resist composition of the present invention is a negative-tone resist composition.

Base Component: Component (A)

The component (A) is a base component which exhibits increased solubility in a developing solution under action of acid.

The term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "resin" refers to a polymer having a molecular weight of 1,000 or more.

As the molecular weight of the polymer, the weight average molecular weight in terms of the polystyrene equivalent value determined by gel permeation chromatography (GPC) is used.

The component (A) is preferably a base component which exhibits increased polarity by the action of acid (hereafter, referred to as "component (A0)").

In the present invention, when the component (A0) is used, since the polarity of the component (A0) changes at unexposed portions before and after the baking in the step (3), an excellent development contrast can be obtained by an alkali development.

The component (A0) may be a resin component that exhibits increased polarity under the action of acid, a low molecular weight compound that exhibits increased polarity under the action of acid, or a mixture thereof.

As the component (A0), a resin component that exhibits increased polarity under the action of acid is preferable, and a polymeric compound (A1) (hereafter, referred to as "component (A1)") including a structural unit (a1) containing an acid decomposable group which exhibits increased polarity by the action of acid is particularly desirable.

The component (A1) preferably includes, in addition to the structural unit (a1), a structural unit (a0) containing an —$SO_2$— containing cyclic group.

The component (A1) preferably includes, in addition to the structural unit (a1) or the structural units (a0) and (a1), a structural unit (a2) derived from an acrylate ester which may have the hydrogen atom bonded to the carbon atom on the α-position substituted with a substituent and contains a lactone-containing cyclic group.

In addition to the structural unit (a1) or in addition to the structural unit (a1) and at least one of the structural unit (a0) and the structural unit (a2), it is preferable that the component (A1) further include a structural unit (a3) derived from an acrylate ester containing a polar group-containing aliphatic hydrocarbon group and may have the hydrogen atom bonded to the carbon atom on the α-position substituted with a substituent.

In the present descriptions and the claims, the expression "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

In the α-substituted acrylate ester, the alkyl group as the substituent on the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms as the substituent on the α-position include groups in which part or all of the hydrogen atoms of the aforementioned "alkyl group of 1 to 5 carbon atoms as the substituent on the α-position" are substituted with halogen atoms. Examples of the halogen atom include a fluorine atom, a chlorine atom, a bromine atom and an iodine atom, and a fluorine atom is particularly desirable.

It is preferable that a hydrogen atom, an alkyl group of 1 to 5 carbon atoms or a halogenated alkyl group of 1 to 5 carbon atoms is bonded to the α-position of the α-substituted acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

[Structural Unit (a1)]

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group ($-SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

An "acid dissociable group" is a group in which at least the bond between the acid dissociable group and the adjacent carbon atom is cleaved by the action of acid. It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes and, the solubility in an alkali developing solution is relatively increased.

The acid dissociable group is not particularly limited, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxy group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

The term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula $-C(R^{71})(R^{72})(R^{73})$ can be given. (in the formula, each of $R^{71}$ to $R^{73}$ independently represents a linear alkyl group of 1 to 5 carbon atoms). The group represented by the formula $-C(R^{71})(R^{72})(R^{73})$ preferably has 4 to 8 carbon atoms, and specific examples include a tert-butyl group, a 2-methyl-2-butyl group, a 2-methyl-2-pentyl group and a 3-methyl-3-pentyl group.

Among these, a tert-butyl group is particularly desirable.

The term "aliphatic cyclic group" refers to a monocyclic group or polycyclic group that has no aromaticity.

In the "aliphatic cyclic group-containing acid dissociable group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. In these aliphatic cyclic hydrocarbon groups, part of the carbon atoms constituting the ring may be replaced with an ethereal oxygen atom (—O—).

Examples of aliphatic cyclic group-containing acid dissociable groups include (i) a monovalent aliphatic cyclic group in which a substituent (a group or an atom other than hydrogen) is bonded to the carbon atom on the ring skeleton to which an atom adjacent to the acid dissociable group (e.g., "—O—" within "—C(=O)—O— group") is bonded to form a tertiary carbon atom; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable group on the ring skeleton of the aliphatic cyclic group, an alkyl group can be mentioned. Examples of the alkyl group include the same groups as those represented by $R^{14}$ in formulas (1-1) to (1-9) described later.

Specific examples of the group (i) include groups represented by general formulas (1-1) to (1-9) shown below.

Specific examples of the group (ii) include groups represented by general formulas (2-1) to (2-6) shown below.

[Chemical Formula 1]

 (1-1)

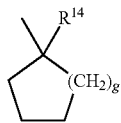 (1-2)

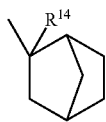 (1-3)

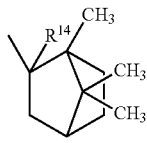 (1-4)

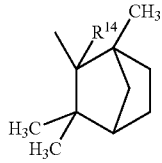 (1-5)

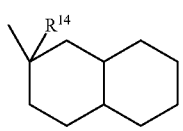 (1-6)

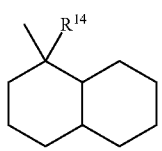 (1-7)

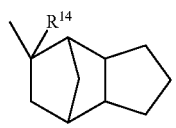 (1-8)

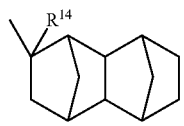 (1-9)

In the formulas above, $R^{14}$ represents an alkyl group; and g represents an integer of 0 to 8.

[Chemical Formula 2]

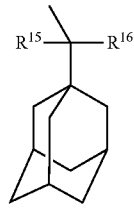 (2-1)

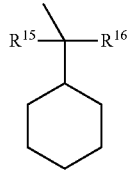 (2-2)

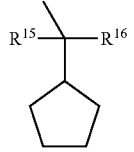 (2-3)

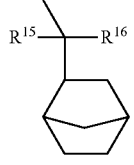 (2-4)

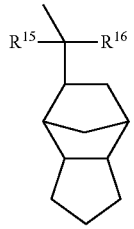 (2-5)

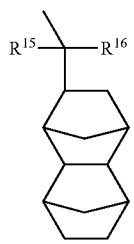 (2-6)

In the formulas above, each of $R^{15}$ and $R^{16}$ independently represents an alkyl group.

In formulas (1-1) to (1-9), the alkyl group for $R^{14}$ may be linear, branched or cyclic, and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

In formulas (2-1) to (2-6), as the alkyl group for R' and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxyl group, so as to be bonded with an oxygen atom. When acid acts to break the bond between the acetal-type acid dissociable group and the oxygen atom to which the acetal-type, acid dissociable group is bonded, an OH-containing polar group such as a carboxy group or a hydroxy group is formed.

Examples of acetal-type acid dissociable groups include groups represented by general formula (p1) shown below.

[Chemical Formula 3]

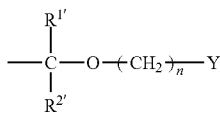

(p1)

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

As the lower alkyl group for $R^{1'}$ and $R^{2'}$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable group (p1) is a group represented by general formula (p1-1) shown below.

[Chemical Formula 4]

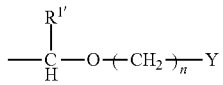

(p1-1)

In the formula, $R^{1'}$, n and Y are the same as defined above.

As the alkyl group for Y, the same alkyl groups as those described above the for the substituent which may be bonded to the carbon atom on the α-position of the aforementioned α-substituted alkylester can be mentioned.

As the aliphatic cyclic group for Y, any of the aliphatic monocyclic/polycyclic groups which have been proposed for conventional ArF resists and the like can be appropriately selected for use. For example, the same aliphatic cyclic groups described above in connection with the "acid dissociable group containing an aliphatic cyclic group" can be used.

Further, as the acetal-type, acid dissociable group, groups represented by general formula (p2) shown below can also be used.

[Chemical Formula 5]

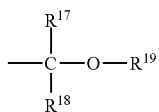

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group. Preferable examples of the substituent containing an acid decomposable group include the tertiary alkyl ester-type acid dissociable group and the acetal-type acid dissociable group described above.

In the present description and claims, a "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Here, the α-position (carbon atom on the α-position) refers to the carbon atom having the benzene ring bonded thereto, unless specified otherwise.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Here, the α-position (carbon atom on the α-position) refers to the carbon atom having the benzene ring bonded thereto, unless specified otherwise.

As the structural unit (a1), a structural unit derived from an acrylate ester which may have the hydrogen atom bonded to the carbon atom on the α-position substituted with a substituent is preferable.

Specific examples of the structural unit (a1) include a structural unit represented by general formula (a1-0-1) shown below and a structural unit represented by general formula (a1-0-2) shown below.

[Chemical Formula 6]

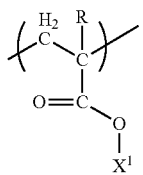

(a1-0-1)

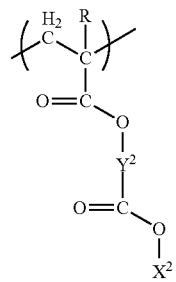

(a1-0-2)

In the formulae, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In general formula (a1-0-1), the alkyl group and the halogenated alkyl group for R are respectively the same as defined for the alkyl group and the halogenated alkyl group for the substituent which may be bonded to the carbon atom on the α-position of the aforementioned substituted acrylate ester. R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above.
$X^2$ is the same as defined for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

A hydrocarbon "has a substituent" means that part or all of the hydrogen atoms within the hydrocarbon group is substituted with a substituent (a group or an atom other than hydrogen).

The hydrocarbon group may be either an aliphatic hydrocarbon group or an aromatic hydrocarbon group.

An "aliphatic hydrocarbon group" refers to a hydrocarbon group that has no aromaticity.

The divalent aliphatic hydrocarbon group as the divalent hydrocarbon group for $Y^2$ may be either saturated or unsaturated. In general, the divalent aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$-], a trimethylene group [—$(CH_2)_3$-], a tetramethylene group [—$(CH_2)_4$-] and a pentamethylene group [—$(CH_2)_5$-].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group as the divalent hydrocarbon group for Y$^2$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

The aromatic hydrocarbon group may or may not have a substituent. For example, the hydrogen atom bonded to the aromatic hydrocarbon ring within the aromatic hydrocarbon group may be substituted with a substituent. Examples of substituents include an alkyl group, an alkoxy group, a halogen atom, a halogenated alkyl group, a hydroxyl group and an oxygen atom (=O).

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

With respect to a "divalent linking group containing a hetero atom" for Y$^2$, a hetero atom is an atom other than carbon and hydrogen, and examples thereof include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, —NH—C(=O)—, =N—, and a group represented by general formula —Y$^{21}$—O—Y$^{22}$—, —[Y$^{21}$—C(=O)—O]$_{m'}$—Y$^{22}$— or —Y$^{21}$—O—C(=O)—Y$^{22}$— [wherein Y$^{21}$ and Y$^{22}$ each independently represents a divalent hydrocarbon group which may have a substituent, O represents an oxygen atom, and m' represents an integer of 0 to 3.]

When Y$^2$ represents —NH—, H may be substituted with a substituent such as an alkyl group, an aryl group (an aromatic group) or the like. The substituent (an alkyl group, an aryl group or the like) preferably has 1 to 10 carbon atoms, more preferably 1 to 8, and most preferably 1 to 5.

In formula —Y$^{21}$—O—Y$^{22}$—, —[Y$^{21}$—C(=O)—O]$_{m'}$—Y$^{22}$— or —Y$^{21}$—O—C(=O)—Y$^{22}$—, Y$^{21}$ and Y$^{22}$ each independently represents a divalent hydrocarbon group which may have a substituent. As the divalent hydrocarbon group, the same groups as those described above for the "divalent hydrocarbon group which may have a substituent" for Y$^2$ can be mentioned.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and most preferably 1. Namely, it is particularly desirable that the group represented by the formula [$Y^{21}$—C(=O)—O]$_{m'}$—$Y^{22}$— is a group represented by the formula —$Y^{21}$—C(=O)—O—$Y^{22}$—. Among these, a group represented by the formula —$(CH_2)_{a'}$—C(=O)—O—$(CH_2)_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom, a linear group containing an oxygen atom as the hetero atom e.g., a group containing an ether bond or an ester bond is preferable, and a group represented by the aforementioned formula —$Y^{21}$—O—$Y^{22}$—, —[$Y^{21}$—C(=O)—O]$_{m'}$—$Y^{22}$— or —$Y^{21}$—O—C(=O)—$Y^{22}$— is more preferable.

Among the aforementioned examples, as the divalent linking group for $Y^2$, an alkylene group, a divalent alicyclic hydrocarbon group or a divalent linking group containing a hetero atom is particularly desirable. Among these, an alkylene group or a divalent linking group containing a hetero atom is more preferable.

Specific examples of the structural unit (a1) include structural units represented by general formulas (a1-1) to (a1-4) shown below.

[Chemical Formula 7]

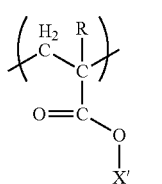

(a1-1)

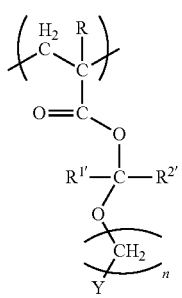

(a1-2)

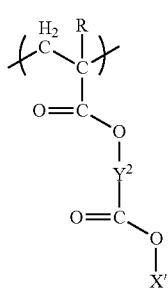

(a1-3)

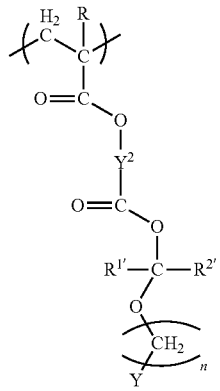

(a1-4)

In the formulas, R, $R^{1'}$, $R^{2'}$, n, Y and $Y^2$ are the same as defined above; and X' represents a tertiary alkyl ester-type acid dissociable group.

In the formulas, the tertiary alkyl ester-type acid dissociable group for X' include the same tertiary alkyl ester-type acid dissociable groups as those described above.

As $R^{1'}$, $R^{2'}$, n and Y are respectively the same as defined for $R^{1'}$, $R^{2'}$, n and Y in general formula (p1) described above in connection with the "acetal-type acid dissociable group".

As examples of $Y^2$, the same groups as those described above for $Y^2$ in general formula (a1-0-2) can be given.

Specific examples of structural units represented by general formula (a1-1) to (a1-4) are shown below.

In the formulae shown below, $R^\alpha$ represents a hydrogen atom, a methyl group or a trifluoromethyl group.

[Chemical Formula 8]

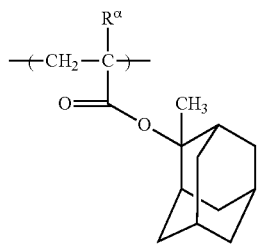

(a1-1-1)

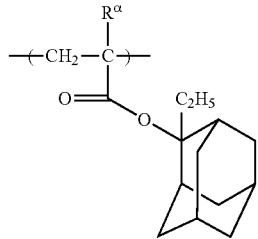

(a1-1-2)

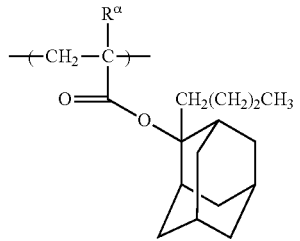

(a1-1-3)

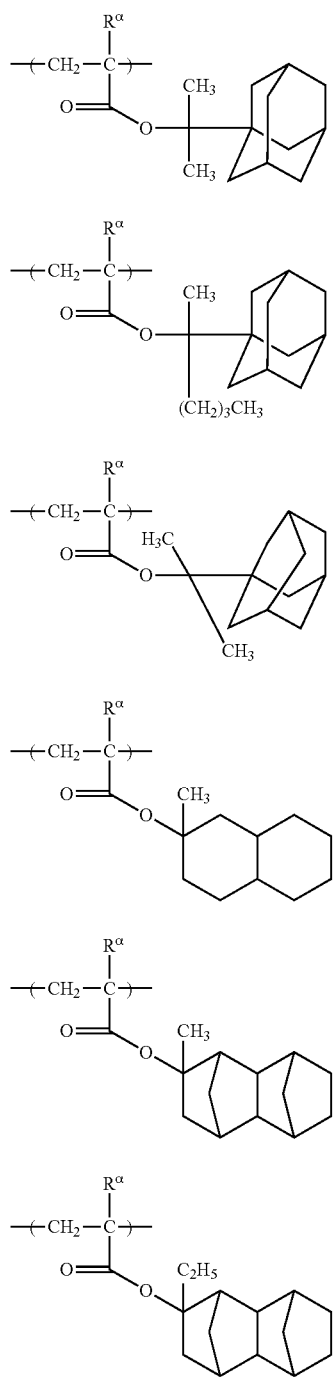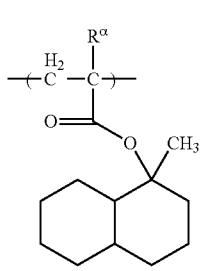
[Chemical Formula 9]
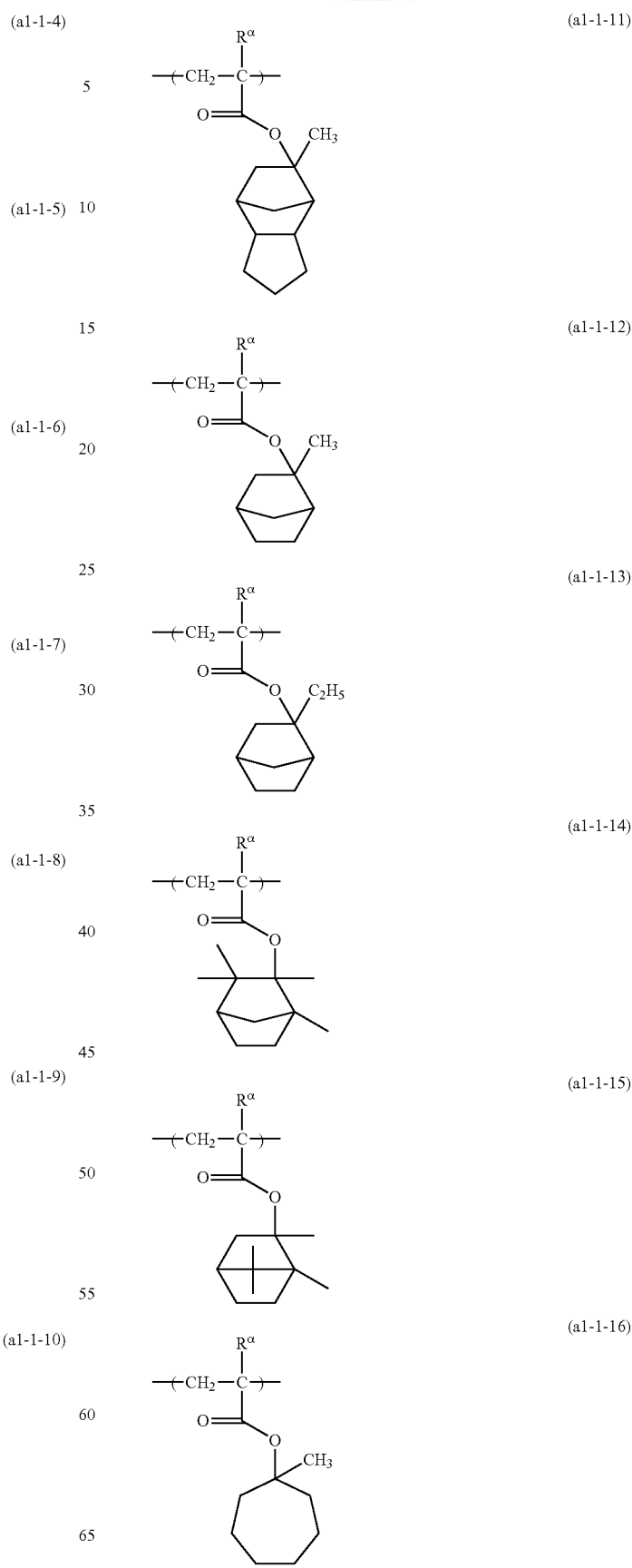

(a1-1-17) 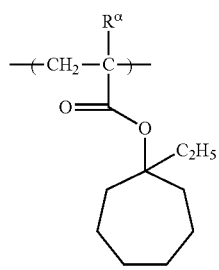
(a1-1-18) 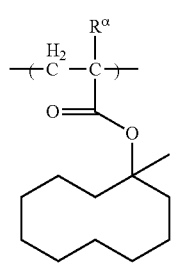
(a1-1-19) 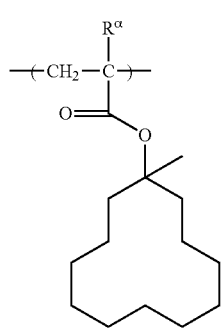
(a1-1-20) 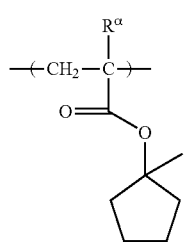
(a1-1-21) 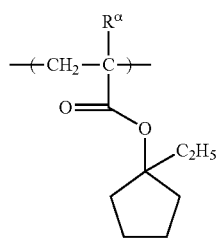
[Chemical Formula 10]
(a1-1-22) 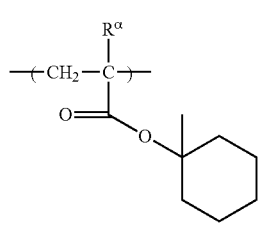
(a1-1-23) 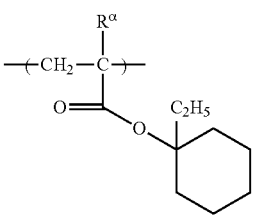
(a1-1-24) 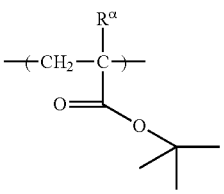
(a1-1-25) 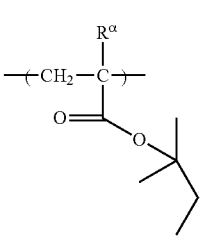
(a1-1-26) 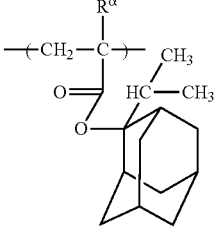
(a1-1-27) 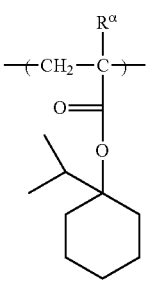
(a1-1-28) 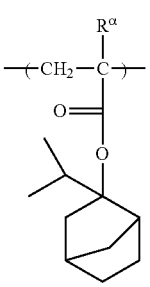

(a1-1-29) 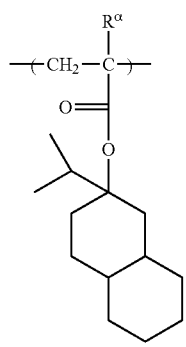
(a1-1-30) 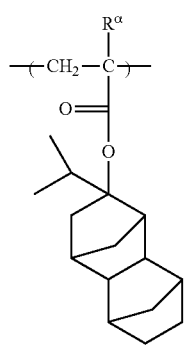
(a1-1-31) 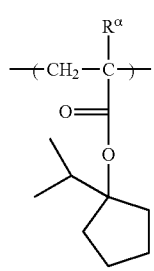
(a1-1-32) 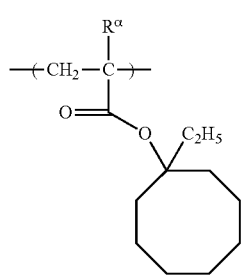
(a1-1-33) 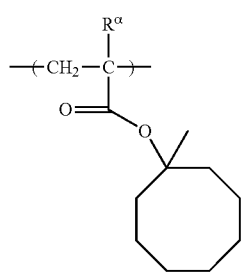
(a1-1-34) 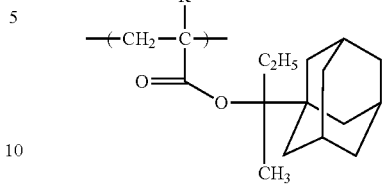
(a1-1-35) 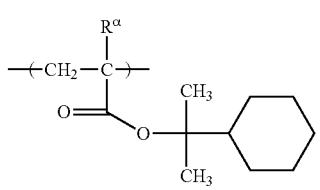
(a1-1-36) 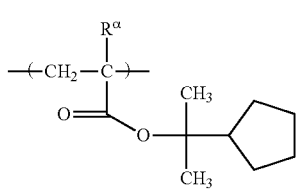
[Chemical Formula 11]
(a1-2-1) 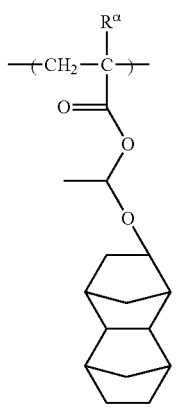
(a1-2-2)

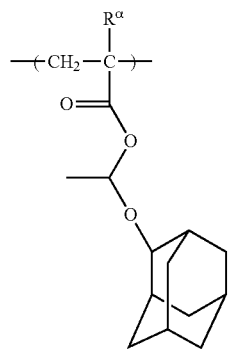 (a1-2-3)
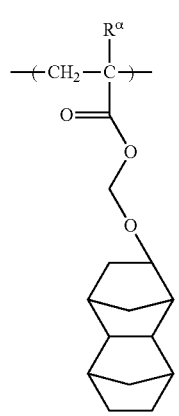 (a1-2-4)
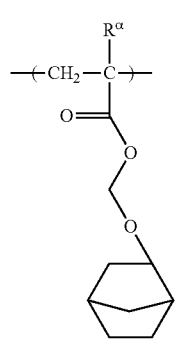 (a1-2-5)
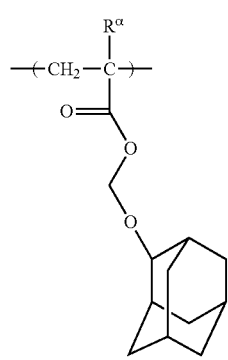 (a1-2-6)
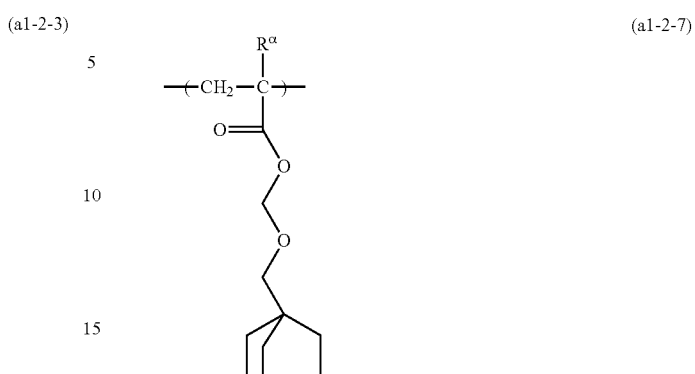 (a1-2-7)
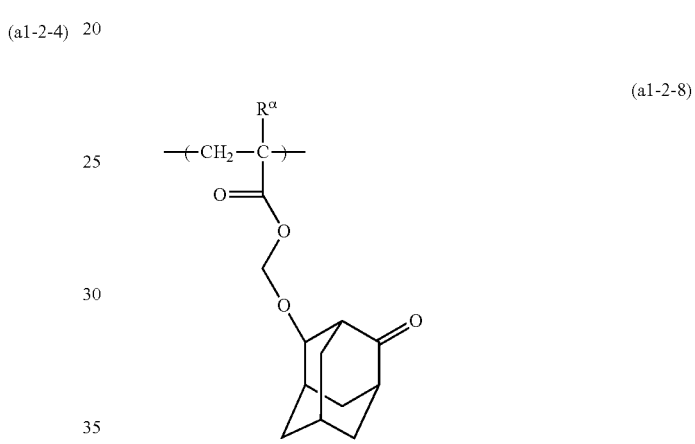 (a1-2-8)
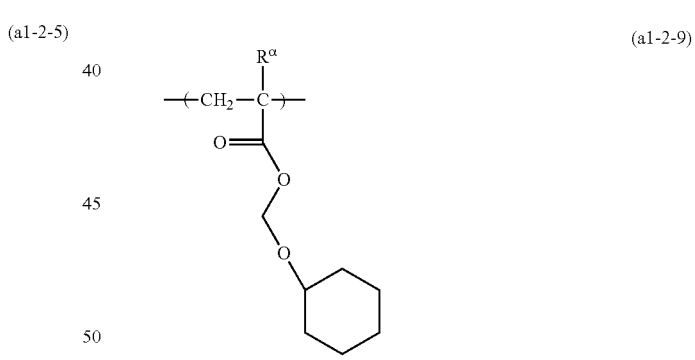 (a1-2-9)
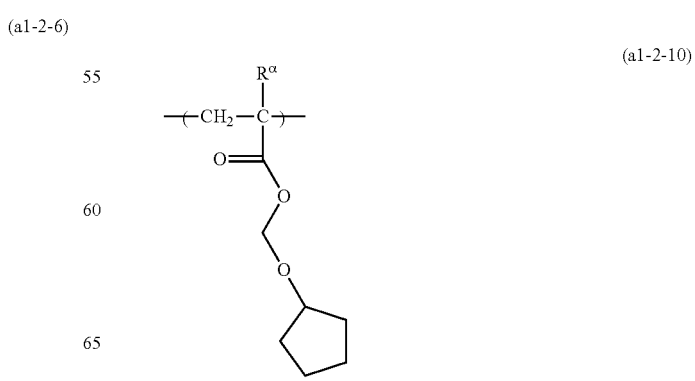 (a1-2-10)

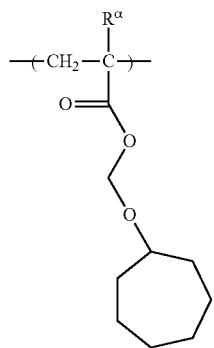 (a1-2-11)
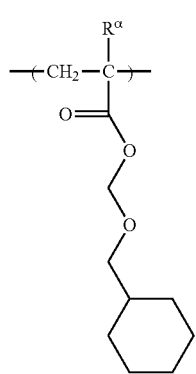 (a1-2-12)
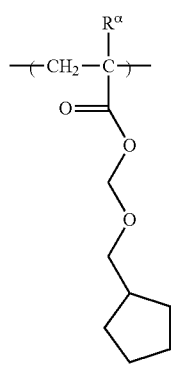 (a1-2-13)
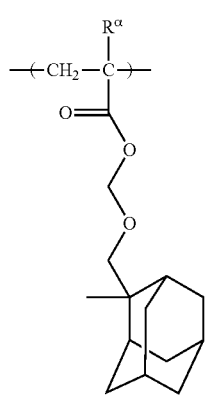 (a1-2-14)
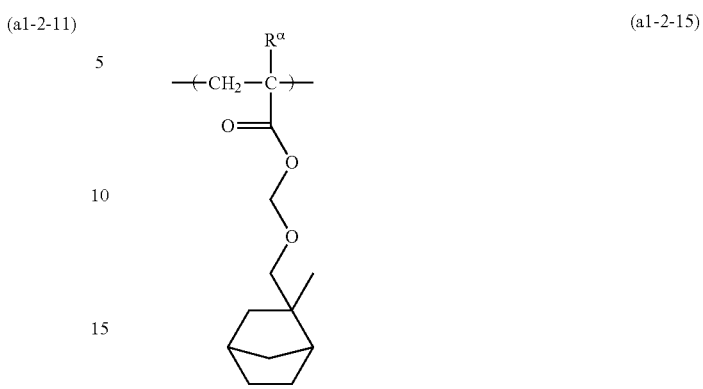 (a1-2-15)
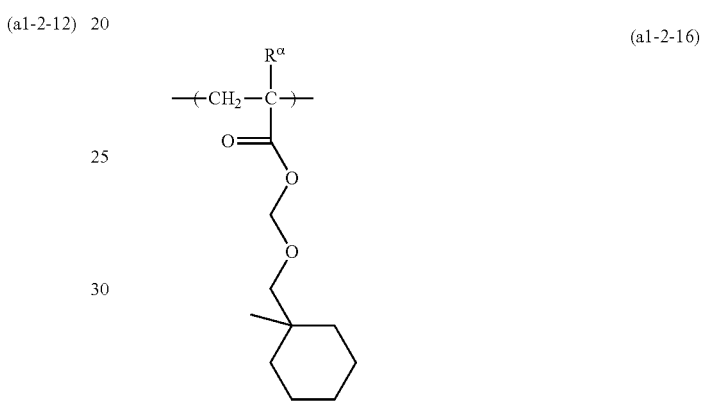 (a1-2-16)
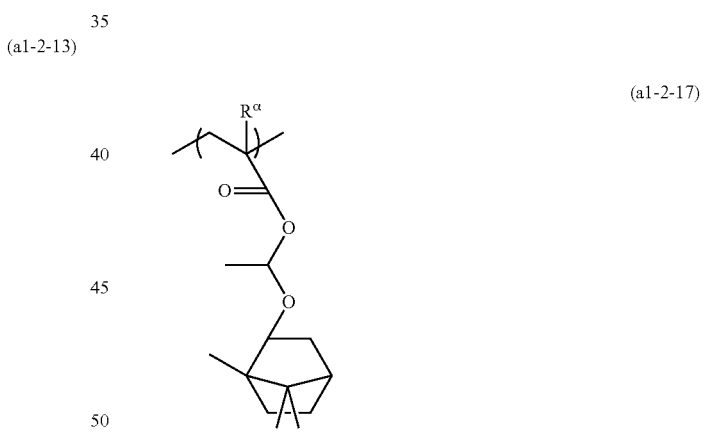 (a1-2-17)
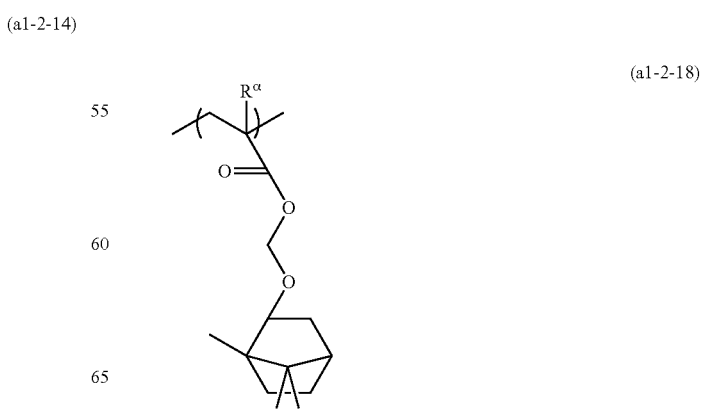 (a1-2-18)

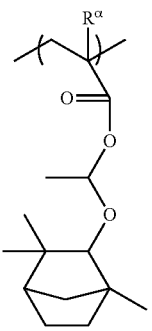 (a1-2-19)
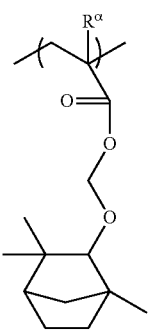 (a1-2-20)
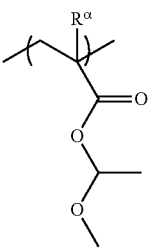 (a1-2-21)
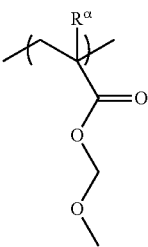 (a1-2-22)
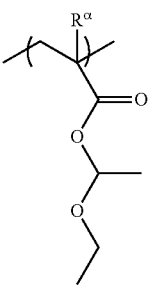 (a1-2-23)
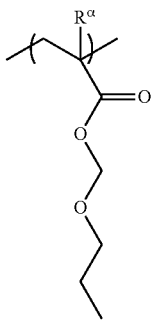 (a1-2-24)
[Chemical Formula 12]
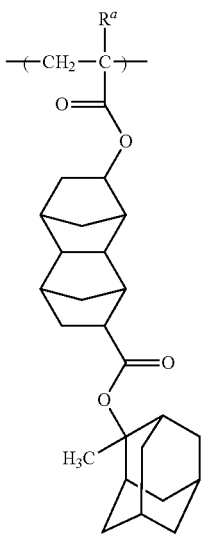 (a1-3-1)
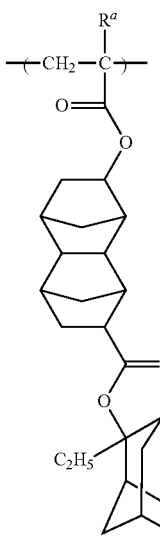 (a1-3-2)

-continued
(a1-3-3)
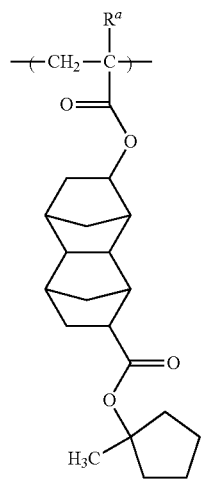
(a1-3-4)
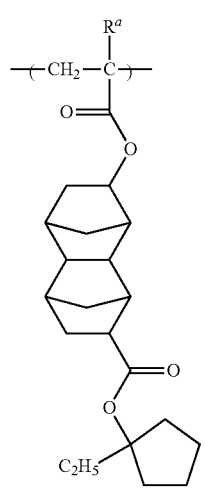
(a1-3-5)
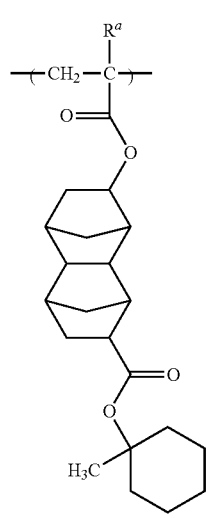
-continued
(a1-3-6)
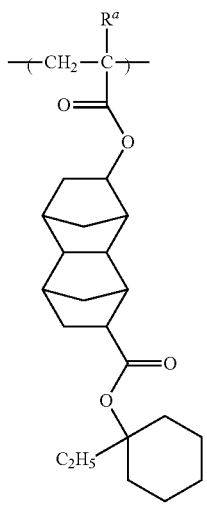
(a1-3-7)
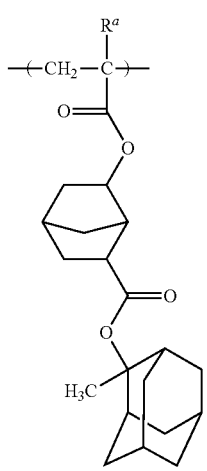
(a1-3-8)
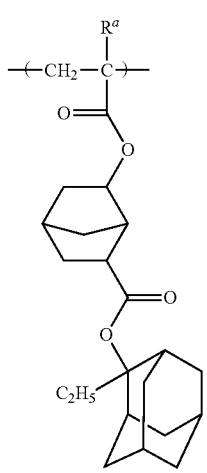

(a1-3-9)
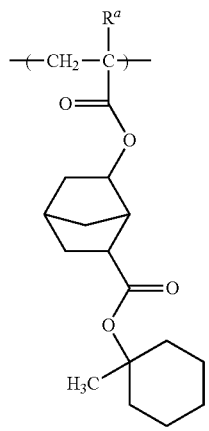
(a1-3-10)
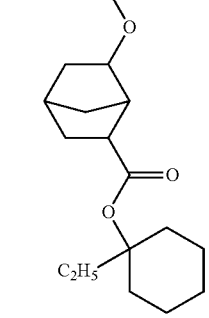
(a1-3-11)
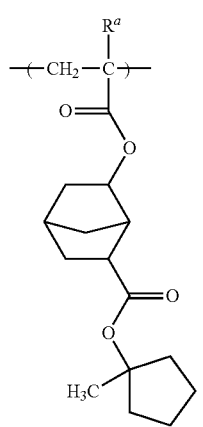
(a1-3-12)
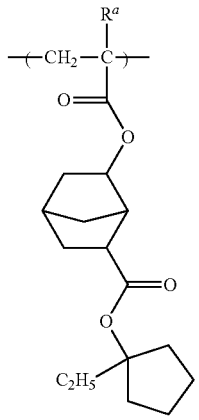
(a1-3-13)
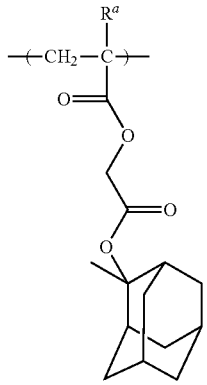
(a1-3-14)
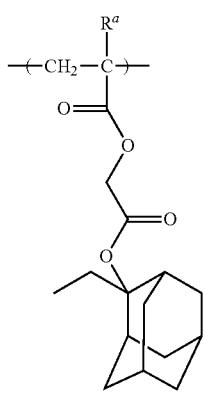
(a1-3-15)

(a1-3-16)
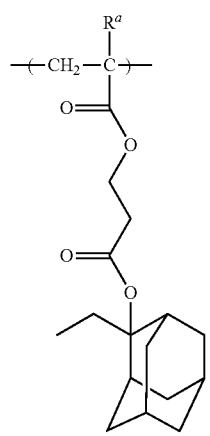
(a1-3-17)
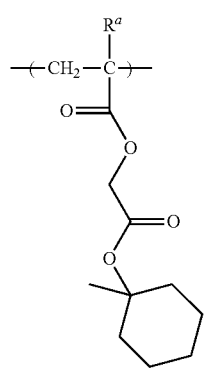
(a1-3-18)
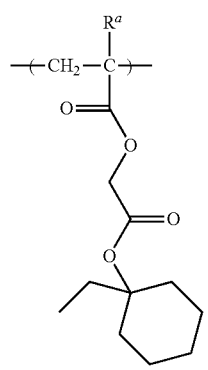
[Chemical Formula 13]
(a1-3-19)
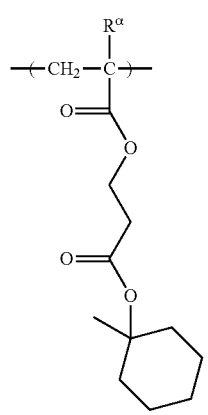
(a1-3-20)
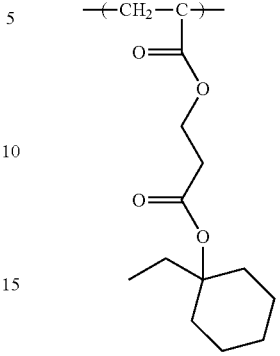
(a1-3-21)
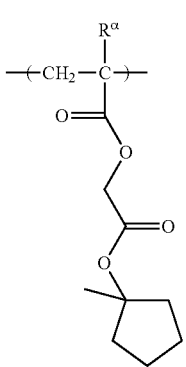
(a1-3-22)
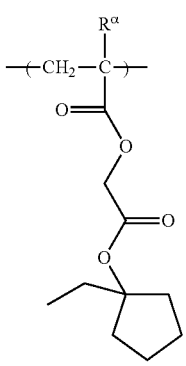
(a1-3-23)
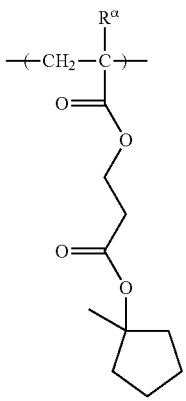

(a1-3-24)
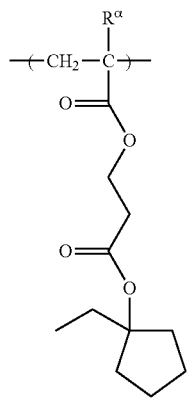
[Chemical Formula 14]
(a1-3-25)
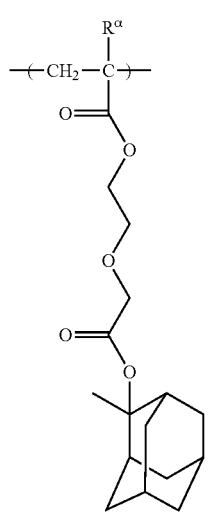
(a1-3-26)
(a1-3-27)
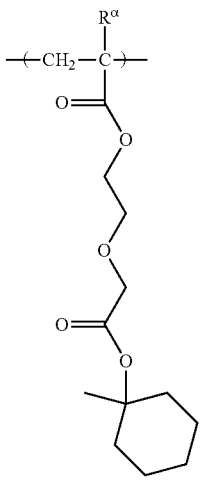
(a1-3-28)
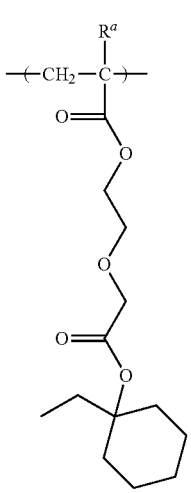
(a1-3-29)
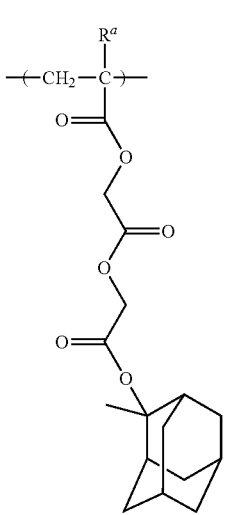

[Chemical Formula 15]
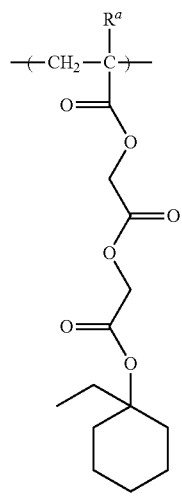 (a1-3-30)
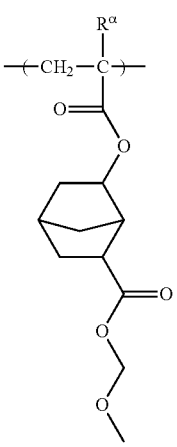 (a1-4-1)
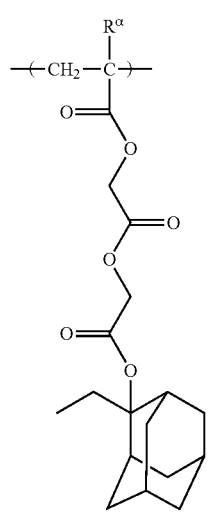 (a1-3-31)
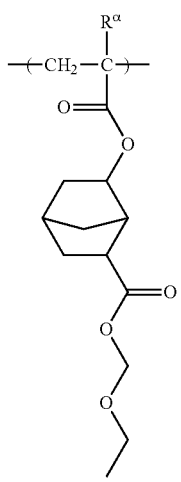 (a1-4-2)
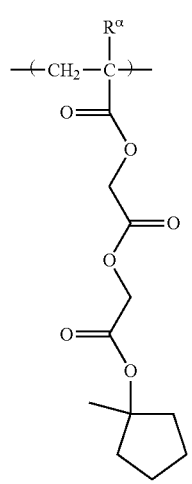 (a1-3-32)
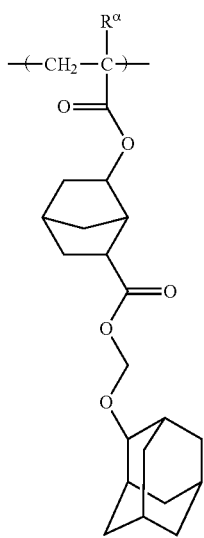 (a1-4-3)

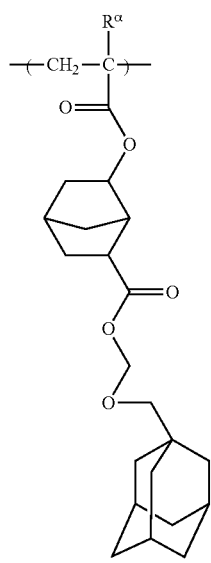 (a1-4-4)
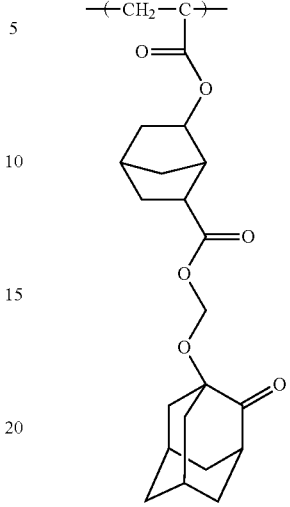 (a1-4-7)
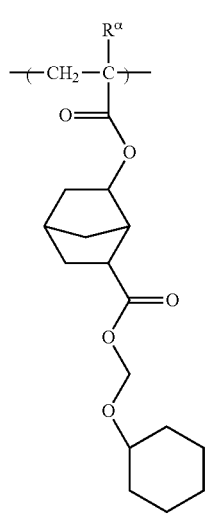 (a1-4-5)
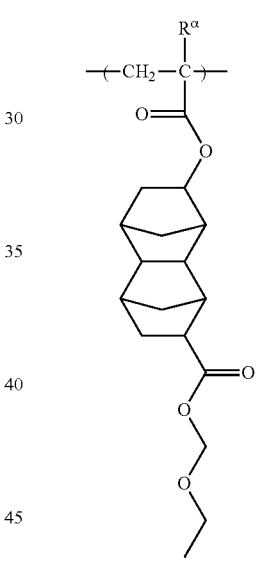 (a1-4-8)
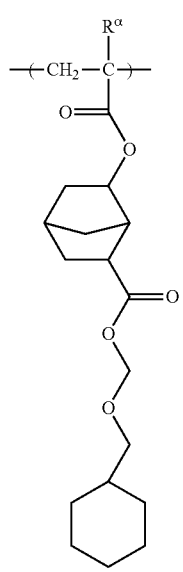 (a1-4-6)
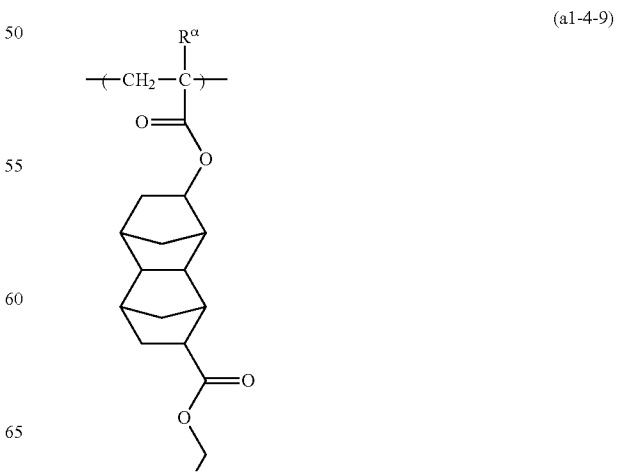 (a1-4-9)

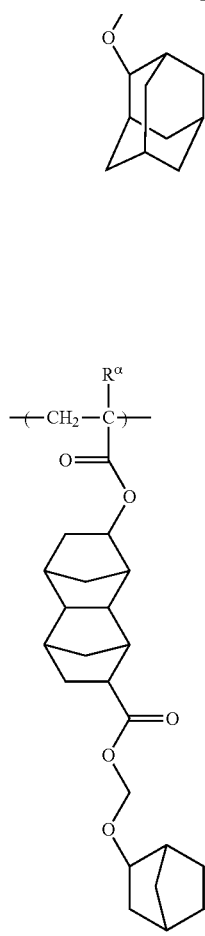
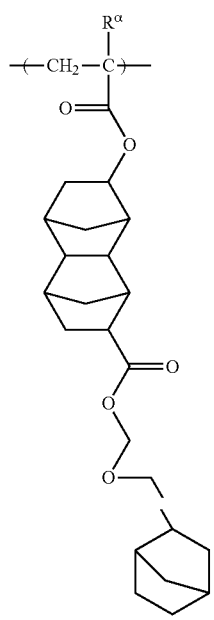
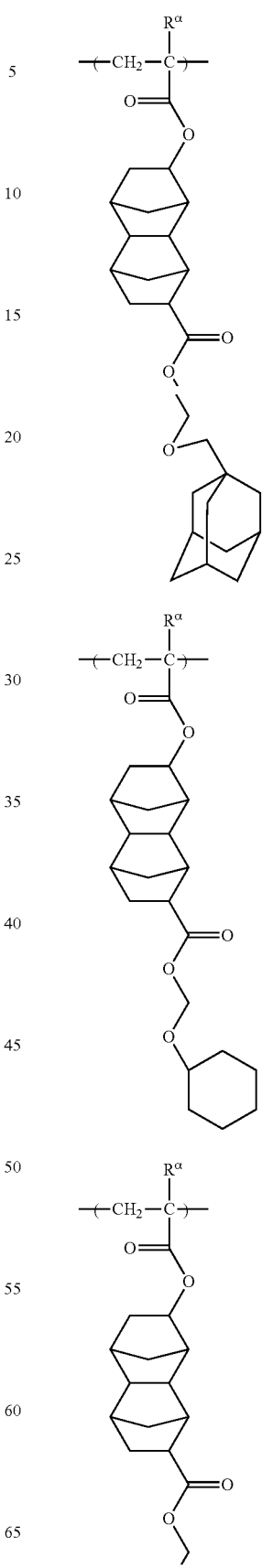

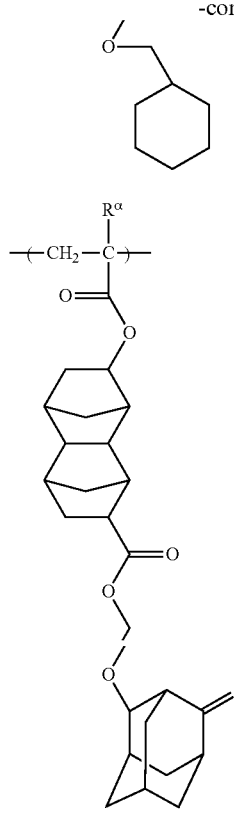

(a1-4-15)

In the present invention, as the structural unit (a1), it is preferable to include at least one structural unit selected from the group consisting of a structural unit represented by general formula (a1-0-11) shown below, a structural unit represented by general formula (a1-0-12) shown below, a structural unit represented by general formula (a1-0-13) shown below, a structural unit represented by general formula (a1-0-14) shown below, a structural unit represented by general formula (a1-0-15) shown below and a structural unit represented by general formula (a1-0-2) shown below.

Among these examples, as the structural unit (a1), it is preferable to include at least one structural unit selected from the group consisting of a structural unit represented by general formula (a1-0-11) shown below, a structural unit represented by general formula (a1-0-12) shown below, a structural unit represented by general formula (a1-0-13) shown below, a structural unit represented by general formula (a1-0-14) shown below and a structural unit represented by general formula (a1-0-15) shown below.

[Chemical Formula 16]

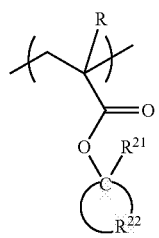

(a1-0-11)

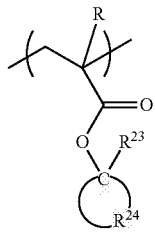

(a1-0-12)

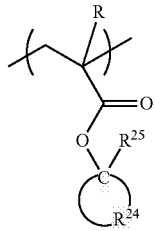

(a1-0-13)

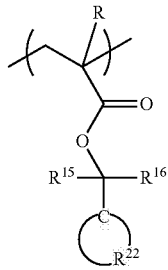

(a1-0-14)

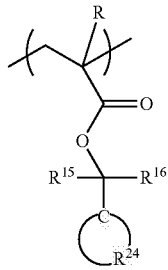

(a1-0-15)

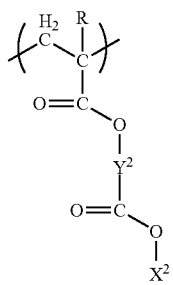

(a1-0-2)

In the formulas, R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocyclic group with the carbon atom to which $R^{22}$ is bonded; $R^{23}$ represents a branched alkyl group; $R^{24}$ represents a group which forms an aliphatic polycyclic group with the carbon atom to which $R^{24}$ is bonded; $R^{25}$ represents a linear alkyl group of 1 to 5 carbon atoms; $R^{15}$ and $R^{16}$ each independently represents an alkyl group; $Y^2$ represents a divalent linking group; and $X^2$ an acid dissociable group.

In the formulas, R, $Y^2$ and $X^2$ are the same as defined above.

In general formula (a1-0-11), as the alkyl group for $R^{21}$, the same alkyl groups as those described above for $R^{14}$ in formulas (1-1) to (1-9) can be used, preferably a methyl group, an ethyl group or an isopropyl group.

As the aliphatic monocyclic group formed by $R^{22}$ and the carbon atoms to which $R^{22}$ is bonded, the same aliphatic cyclic groups as those described above for the aforementioned tertiary alkyl ester-type acid dissociable group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ether bond (—O—).

Further, the monocycloalkane may have a substituent such as an alkyl group of 1 to 5 carbon atoms, a fluorine atom or a fluorinated alkyl group of 1 to 5 carbon atoms.

As an examples of $R^{22}$ constituting such an aliphatic cyclic group, an alkylene group which may have an ether bond (—O—) interposed between the carbon atoms can be given.

Specific examples of structural units represented by general formula (a1-0-11) include structural units represented by the aforementioned formulas (a1-1-16) to (a1-1-23), (a1-1-27) and (a1-1-31). Among these, a structural unit represented by general formula (a1-1-02) shown below which includes the structural units represented by the aforementioned formulas (a1-1-16), (a1-1-17), (a1-1-20) to (a1-1-23), (a1-1-27), (a1-1-31), (a1-1-32) and (a1-1-33) is preferable. Further, a structural unit represented by general formula (a1-1-02') shown below is also preferable.

In the formulae, h represents an integer of 1 to 4, and preferably 1 or 2.

[Chemical Formula 17]

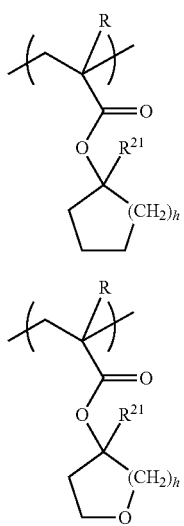

In the formulae, R and $R^{21}$ are the same as defined above; and h represents an integer of 1 to 4.

In general formula (a1-0-12), as the branched alkyl group for $R^{23}$, the same alkyl groups as those described above for $R^{14}$ which are branched can be used, and an isopropyl group is particularly desirable.

As the aliphatic polycyclic group formed by $R^{24}$ and the carbon atoms to which $R^{24}$ is bonded, the same aliphatic cyclic groups as those described above for the aforementioned tertiary alkyl ester-type acid dissociable group and which are polycyclic can be used.

Specific examples of structural units represented by general formula (a1-0-12) include structural units represented by the aforementioned formulas (a1-1-26) and (a1-1-28) to (a1-1-30).

As the structural unit (a1-0-12), a structural unit in which the aliphatic polycyclic group formed by $R^{24}$ and the carbon atom to which $R^{24}$ is bonded is a 2-adamantyl group is preferable, and a structural unit represented by the aforementioned formula (a1-1-26) is particularly desirable.

In general formula (a1-0-13), R and $R^{24}$ are the same as defined above.

As the linear alkyl group for $R^{25}$, the same linear alkyl groups as those described above for $R^{14}$ in the aforementioned formulas (1-1) to (1-9) can be mentioned, and a methyl group or an ethyl group is particularly desirable.

Specific examples of structural units represented by general formula (a1-0-13) include structural units represented by the aforementioned formulas (a1-1-1), (a1-1-2) and (a1-1-7) to (a1-1-15) which were described above as specific examples of the structural unit represented by general formula (a1-1).

As the structural unit (a1-0-13), a structural unit in which the aliphatic polycyclic group formed by $R^{24}$ and the carbon atom to which $R^{24}$ is bonded is a 2-adamantyl group is preferable, and a structural unit represented by the aforementioned formula (a1-1-1) or (a1-1-2) is particularly desirable.

In general formula (a1-0-14), R and $R^{22}$ are the same as defined above. $R^{15}$ and $R^{16}$ are the same as $R^{15}$ and $R^{16}$ in the aforementioned general formulae (2-1) to (2-6), respectively.

Specific examples of structural units represented by general formula (a1-0-14) include structural units represented by the aforementioned formulae (a1-1-35) and (a1-1-36) which were described above as specific examples of the structural unit represented by general formula (a1-1).

In general formula (a1-0-15), R and $R^{24}$ are the same as defined above. $R^{15}$ and $R^{16}$ are the same as $R^{15}$ and $R^{16}$ in the aforementioned general formulae (2-1) to (2-6), respectively.

Specific examples of structural units represented by general formula (a1-0-15) include structural units represented by the aforementioned formulae (a1-1-4) to (a1-1-6) and (a1-1-34) which were described above as specific examples of the structural unit represented by general formula (a1-1).

Examples of structural units represented by general formula (a1-0-2) include structural units represented by the aforementioned formulas (a1-3) and (a1-4).

As a structural unit represented by general formula (a1-0-2), those in which $Y^2$ is a group represented by the aforementioned formula —$Y^{21}$—O—$Y^{22}$— or —$Y^{21}$—C(=O)—O—$Y^{22}$— is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 18]

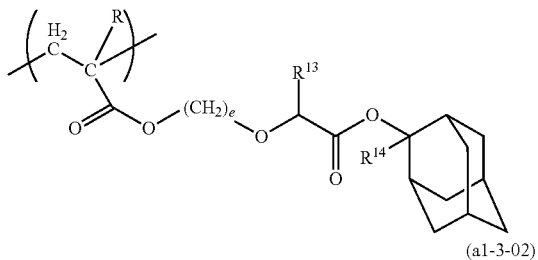

(a1-3-01)

(a1-3-02)

In the formulae, R is the same as defined above; $R^{13}$ represents a hydrogen atom or a methyl group; $R^{14}$ represents an alkyl group; e represents an integer of 1 to 10; and n' represents an integer of 0 to 3.

[Chemical Formula 19]

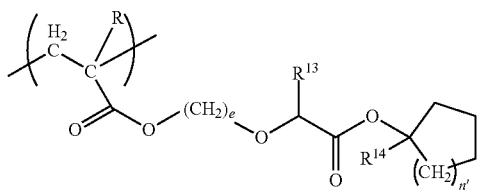

(a1-3-03)

In the formula, R is as defined above; each of $Y^{2'}$ and $Y^{2''}$ independently represents a divalent linking group; X' represents an acid dissociable group; and w represents an integer of 0 to 3.

In general formulas (a1-3-01) and (a1-3-02), $R^{13}$ is preferably a hydrogen atom.

$R^{14}$ is the same as defined for $R^{14}$ in the aforementioned formulas (1-1) to (1-9).

e is preferably an integer of 1 to 8, more preferably an integer of 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable group for X', the same groups as those described above can be used. X' is preferably a tertiary alkyl ester-type acid dissociable group, more preferably the aforementioned group (i) in which a substituent is bonded to the carbon atom to which an atom adjacent to the acid dissociable group is bonded to on the ring skeleton to form a tertiary carbon atom. Among these, a group represented by the aforementioned general formula (1-1) is particularly desirable.

w represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable, and a structural unit represented by general formula (a1-3-03-1) is particularly desirable.

[Chemical Formula 20]

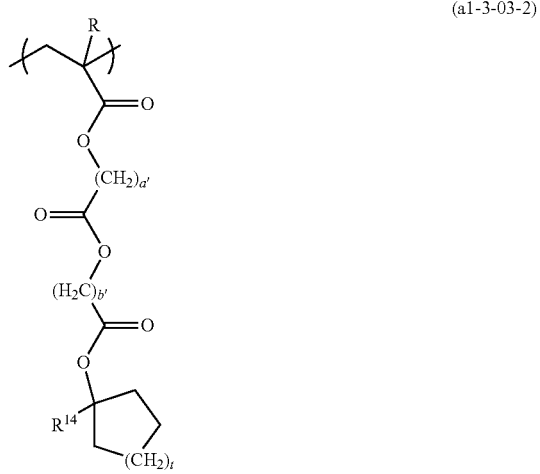

(a1-3-03-1)

(a1-3-03-2)

In the formulas, R and $R^{14}$ are the same as defined above; a' represents an integer of 1 to 10; b' represents an integer of 1 to 10; and t represents an integer of 0 to 3.

In general formulas (a1-3-03-1) and (a1-3-03-2), a' is the same as defined above, preferably an integer of 1 to 8, more preferably 1 to 5, and most preferably 1 or 2.

b' is the same as defined above, preferably an integer of 1 to 8, more preferably 1 to 5, and most preferably 1 or 2.

t is preferably an integer of 1 to 3, and most preferably 1 or 2.

Specific examples of structural units represented by general formula (a1-3-03-1) or (a1-3-03-2) include structural units represented by the aforementioned formulas (a1-3-29) to (a1-3-32).

As the structural unit (a1) contained in the component (A1), 1 type of structural unit may be used, or 2 or more types may be used.

In the component (A1), the amount of the structural unit (a1) based on the combined total of all structural units constituting the component (A1) is preferably 15 to 70 mol %, more preferably 15 to 60 mol %, and still more preferably 20 to 55 mol %.

When the amount of the structural unit (a1) is at least as large as the lower limit of the above-mentioned range, a pattern can be easily formed using a resist composition prepared from the component (A1), and various lithography properties such as sensitivity, resolution, LWR and the like are improved. On the other hand, when the amount of the structural unit (a1) is no more than the upper limit of the above-mentioned range, a good balance can be reliably achieved with the other structural units.

[Structural Unit (a0)]

The structural unit (a0) is a structural unit containing an —$SO_2$— containing cyclic group.

By virtue of the structural unit (A) containing a —$SO_2$— containing cyclic group, a resist composition containing the component (A1) including the structural unit (a0) is capable of improving the adhesion of a resist film to a substrate. Further, the —$SO_2$— containing cyclic group contributes to improvement in various lithography properties such as sensitivity, resolution, exposure latitude (EL margin), line width roughness (LWR), line edge roughness (LER) and mask reproducibility.

Here, an "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group.

In the —$SO_2$— containing cyclic group, the ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings.

The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group (wherein R" represents a hydrogen atom or an alkyl group).

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear or branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —SO$_2$— containing cyclic group include groups represented by general formulas (3-1) to (3-4) shown below.

[Chemical Formula 21]

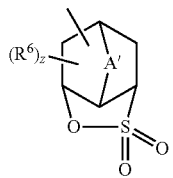

(3-1)

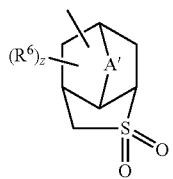

(3-2)

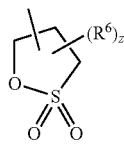

(3-3)

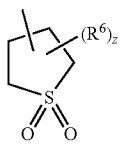

(3-4)

In the formulas, A' represents an oxygen atom, a sulfur atom or an alkylene group of 1 to 5 carbon atoms which may contain an oxygen atom or a sulfur atom; z represents an integer of 0 to 2; and R$^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$— —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of R$^6$ may be the same or different from each other.

As the alkyl group, alkoxy group, halogenated alkyl group, —COOR", —OC(=O)R" and hydroxyalkyl group for R$^6$, the same alkyl groups, alkoxy groups, halogenated alkyl groups, —COOR", —OC(=O)R" and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 22]

(3-1-1)

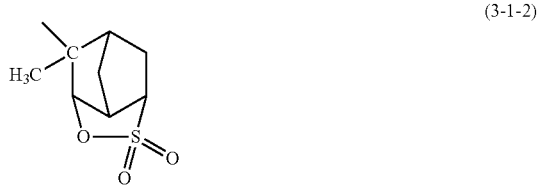

(3-1-2)

(3-1-3)

(3-1-4)

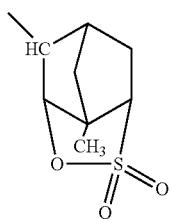 (3-1-5)
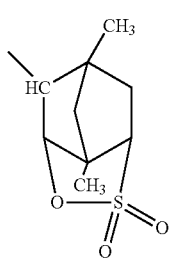 (3-1-6)
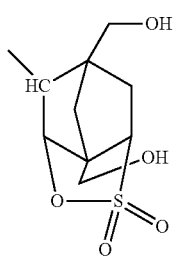 (3-1-7)
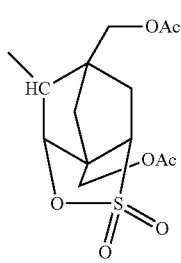 (3-1-8)
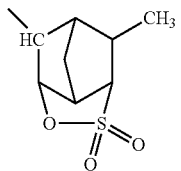 (3-1-9)
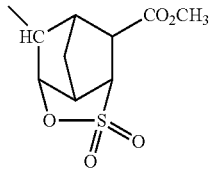 (3-1-10)
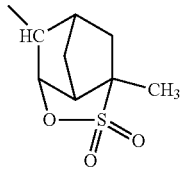 (3-1-11)
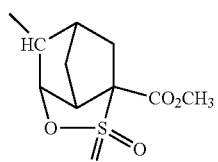 (3-1-12)
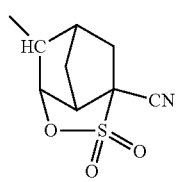 (3-1-13)
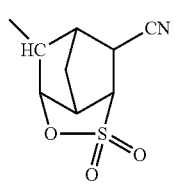 (3-1-14)
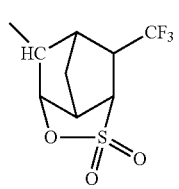 (3-1-15)
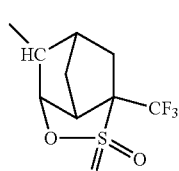 (3-1-16)
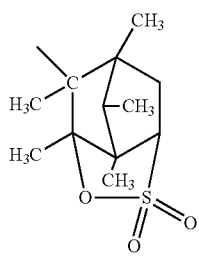 (3-1-17)
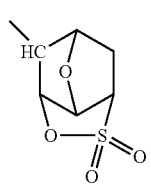 (3-1-18)
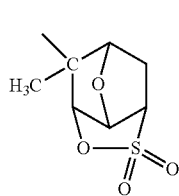 (3-1-19)

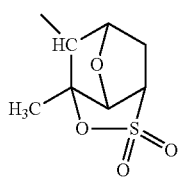 (3-1-20)
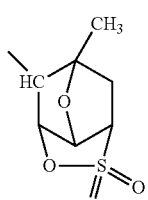 (3-1-21)
[Chemical Formula 23]
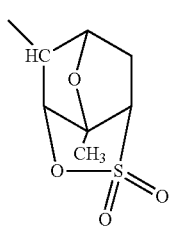 (3-1-22)
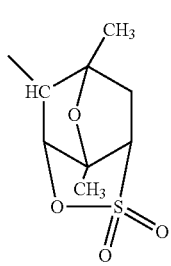 (3-1-23)
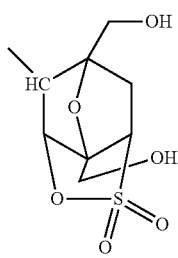 (3-1-24)
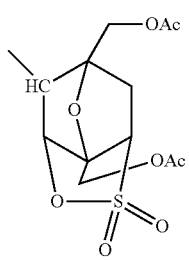 (3-1-25)
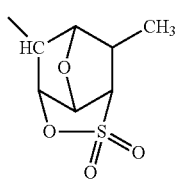 (3-1-26)
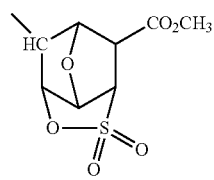 (3-1-27)
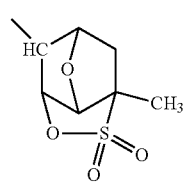 (3-1-28)
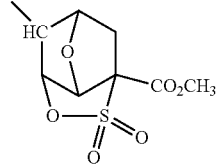 (3-1-29)
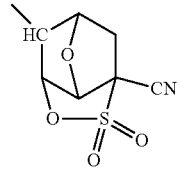 (3-1-30)
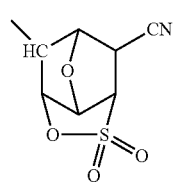 (3-1-31)
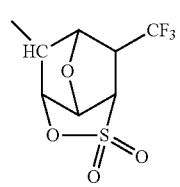 (3-1-32)
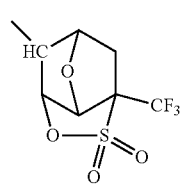 (3-1-33)
[Chemical Formula 24]
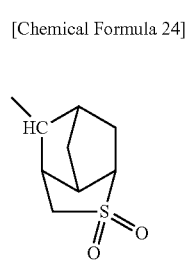 (3-2-1)

-continued

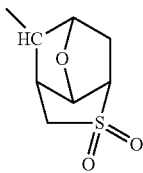
(3-2-2)

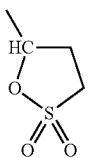
(3-3-1)

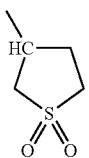
(3-4-1)

As the —$SO_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

More specifically, examples of the structural unit (a0) include structural units represented by general formula (a0-0) shown below.

[Chemical Formula 25]

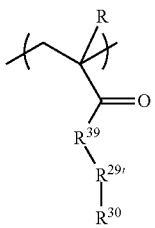
(a0-0)

In the formula, R represents a hydrogen atom, an alkyl group of 1 to 5 carbon atoms or a halogenated alkyl group of 1 to 5 carbon atoms; $R^{39}$ represents —O— or —NH—; $R^{30}$ represents a —$SO_2$— containing cyclic group; and $R^{29\prime}$ represents a single bond or a divalent linking group.

In general formula (a0-0), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group for R is a group in which part or all of the hydrogen atoms of the aforementioned alkyl group of 1 to 5 carbon atoms has been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a0-0), $R^{39}$ represents —O— or —NH—.

In formula (a0-0), $R^{30}$ is the same as defined for the aforementioned —$SO_2$— containing group.

In the formula (a0-0), $R^{29\prime}$ may be either a single bond or a divalent linking group. In terms of the effects of the present invention and lithography properties, a divalent linking group is preferable.

As the divalent linking group for $R^{29}$, for example, the same divalent linking groups as those described for $Y^2$ in general formula (a1-0-2) explained above in relation to the structural unit (a1) can be mentioned.

As the divalent linking group for $R^{29\prime}$, an alkylene group, a divalent alicyclic hydrocarbon group or a divalent linking group containing a hetero atom is preferable. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^2$.

As the divalent linking group containing an ester bond, a group represented by general formula: —$R^{20}$—C(=O)—O— (in the formula, $R^{20}$ represents a divalent linking group) is particularly desirable. Namely, the structural unit (a0) is preferably a structural unit represented by general formula (a0-0-1) shown below.

[Chemical Formula 26]

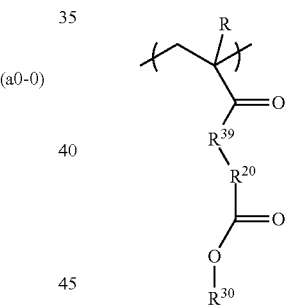
(a0-0-1)

In the formula, R represents a hydrogen atom, an alkyl group of 1 to 5 carbon atoms or a halogenated alkyl group of 1 to 5 carbon atoms; $R^{39}$ represents —O— or —NH—; $R^{20}$ represents a divalent linking group; and $R^{30}$ represents an —$SO_2$— containing cyclic group.

$R^{20}$ is not particularly limited. For example, the same divalent linking groups as those described for $R^{29\prime}$ in general formula (a0-0) can be mentioned.

As the divalent linking group for $R^{20}$, an alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of $R^{29\prime}$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH(CH$_3$)—, —C(CH$_3$)$_2$— or —C(CH$_3$)$_2$CH$_2$— is particularly desirable.

As the divalent linking group containing a hetero atom, a divalent linking group containing an ether bond or an ester bond is preferable, and a group represented by the aforementioned formula —Y$^{21}$—O—Y$^{22}$—, —[Y$^{21}$—C(=O)—O]$_{m'}$-Y$^{22}$— or —Y$^{21}$—O—C(=O)—Y$^{22}$— is more preferable. Y$^{21}$, Y$^{22}$ and m' are the same as defined above.

Among these, a group represented by the formula —Y$^{21}$—O—C(=O)—Y$^{22}$—, and a group represented by the formula —(CH$_2$)$_c$—O—C(=O)—(CH$_2$)$_d$— is particularly desirable. c represents an integer of 1 to 5, preferably an integer of 1 to 3, and more preferably 1 or 2. d represents an integer of 1 to 5, preferably an integer of 1 to 3, and more preferably 1 or 2.

In particular, as the structural unit (a0), a structural unit represented by general formula (a0-0-11) or (a0-0-12) shown below is preferable, and a structural unit represented by general formula (a0-0-12) is more preferable.

[Chemical Formula 27]

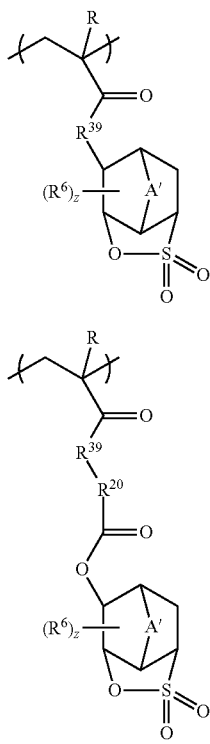

(a0-0-11)

(a0-0-12)

In the formulae, R, R$^6$, z, R$^{39}$ and R$^{20}$ are the same as defined above.

In general formula (a0-0-11), A' is preferably a methylene group, an ethylene group, an oxygen atom (—O—) or a sulfur atom (—S—).

In formula (a0-0-12), as R$^{20}$, a linear or branched alkylene group or a divalent linking group containing an oxygen atom is preferable. As the linear or branched alkylene group and the divalent linking group containing an oxygen atom represented by R$^{20}$, the same linear or branched alkylene groups and the divalent linking groups containing an oxygen atom as those described above can be mentioned.

As the structural unit represented by general formula (a0-0-12), a structural unit represented by general formula (a0-0-12a) or (a0-0-12b) shown below is particularly desirable.

[Chemical Formula 28]

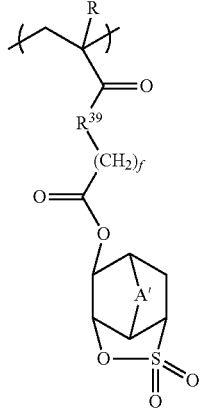

(a0-0-12a)

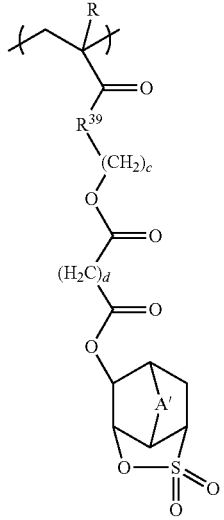

(a0-0-12b)

In the formulae, R, R$^{39}$ and A' are the same as defined above; c and d are the same as defined above; and f represents an integer of 1 to 5 (preferably an integer of 1 to 3).

As the structural unit (A contained in the component (A1), 1 type of structural unit may be used, or 2 or more types may be used.

In terms of achieving an excellent shape for a resist pattern formed using a positive resist composition containing the component (A1) and excellent lithography properties such as EL margin, LWR and mask reproducibility, the amount of the structural unit (a0) within the component (A1), based on the combined total of all structural units constituting the component (A1) is preferably 1 to 60 mol %, more preferably 5 to 55 mol %, still more preferably 10 to 50 mol %, and most preferably 15 to 45 mol %.

[Structural Unit (a2)]

The structural unit (a2) is a structural unit derived from an acrylate ester which may have the hydrogen atom bonded to the carbon atom on the α-position substituted with a substituent and contains a lactone-containing cyclic group.

The term "lactone-containing cyclic group" refers to a cyclic group including one ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water (especially in an alkali developing process).

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 29]

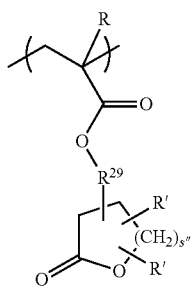
(a2-1)

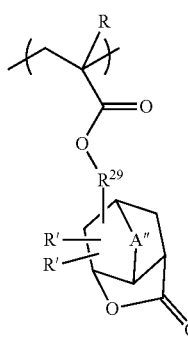
(a2-2)

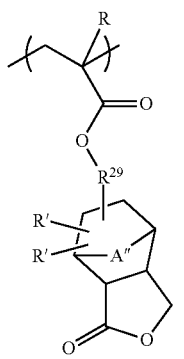
(a2-3)

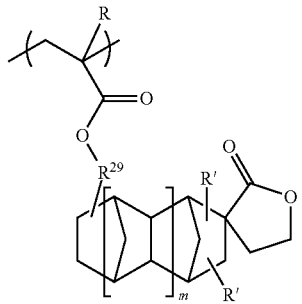
(a2-4)

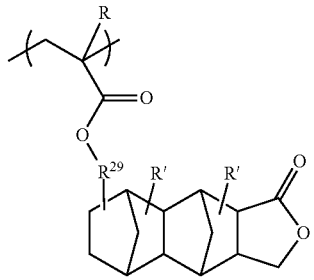
(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group, an alkoxy group, a halogen atom, a halogenated alkyl group, a hydroxy group, an oxygen atom (=O), —COOR", OC(=O)R", a hydroxyalkyl group or a cyano group, wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

As the alkyl group, alkoxy group, halogen atom, halogenated alkyl group, —COOR", —OC(=O)R" and hydroxyalkyl group for R', the same alkyl groups, alkoxy groups, halogen atoms, halogenated alkyl groups, —COOR", —OC(=O)R" (R" is the same as defined above) and hydroxyalkyl groups as those described above as the substituent for the —$SO_2$— containing cyclic group can be mentioned.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic hydrocarbon group represented by $Y^2$.

s" is preferably 1 or 2.

Specific examples of structural units represented by general formulas (a2-1) to (a2-5) are shown below.

In the formulae shown below, $R^\alpha$ represents a hydrogen atom, a methyl group or a trifluoromethyl group.

[Chemical Formula 30]
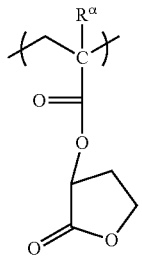 (a2-1-1)
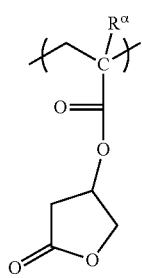 (a2-1-2)
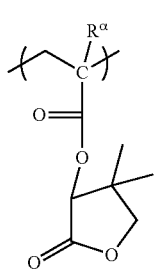 (a2-1-3)
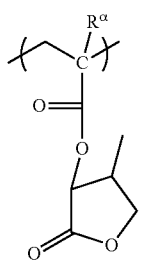 (a2-1-4)
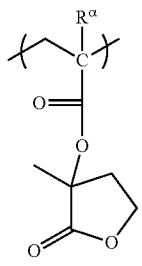 (a2-1-5)
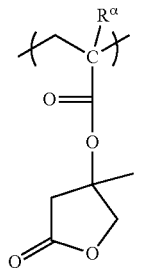 (a2-1-6)
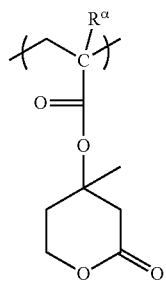 (a2-1-7)
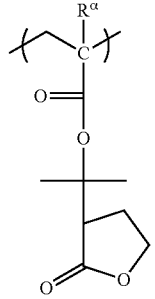 (a2-1-8)
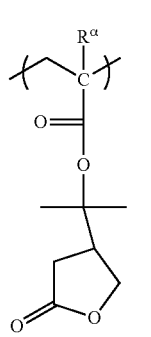 (a2-1-9)
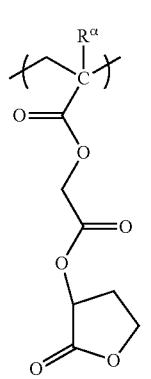 (a2-1-10)
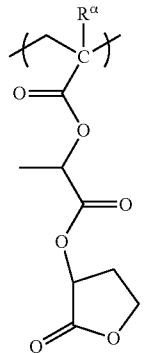 (a2-1-11)

(a2-1-12)
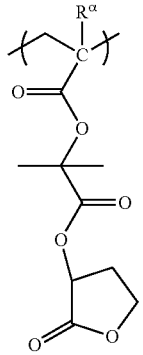
(a2-1-13)
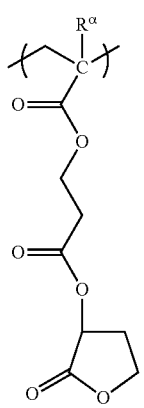
[Chemical Formula 31]
(a2-2-1)
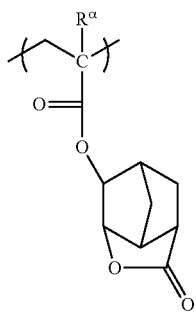
(a2-2-2)
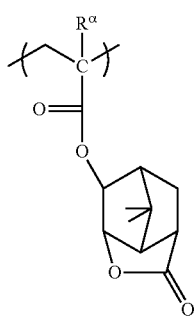
(a2-2-3)
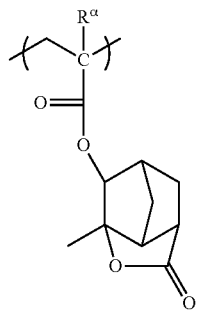
(a2-2-4)
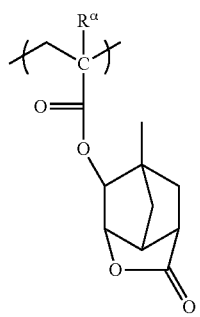
(a2-2-5)
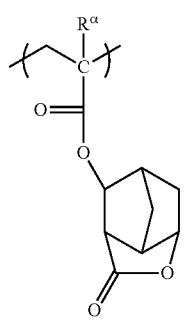
(a2-2-6)
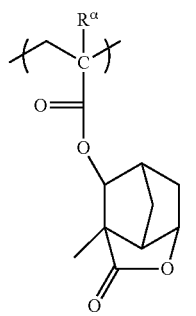
(a2-2-7)
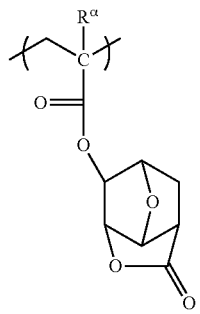

(a2-2-8)
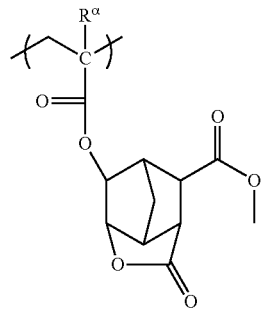
(a2-2-9)
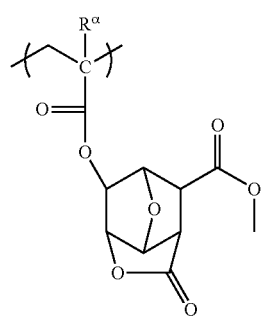
(a2-2-10)
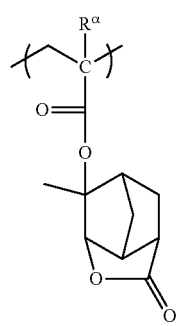
(a2-2-11)
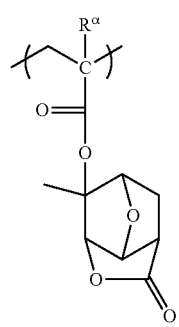
(a2-2-12)
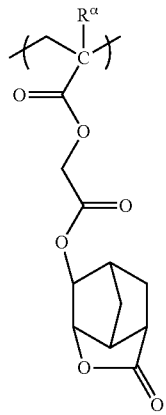
(a2-2-13)
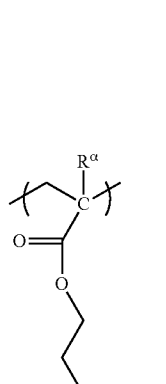
(a2-2-14)
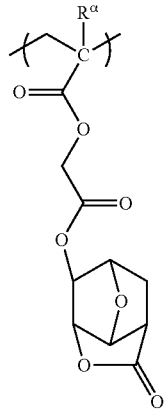

(a2-2-15)
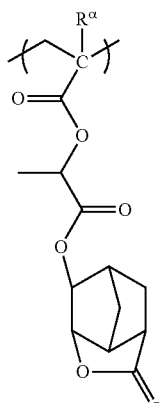
(a2-2-16)
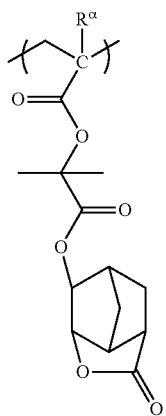
(a2-2-17)
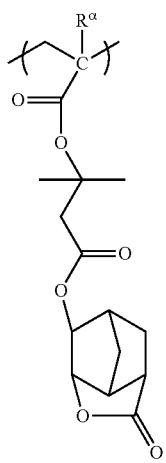
[Chemical Formula 32]
(a2-3-1)
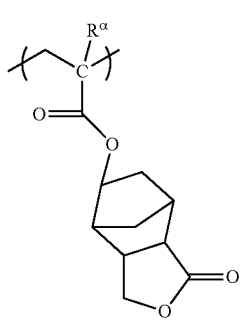
(a2-3-2)
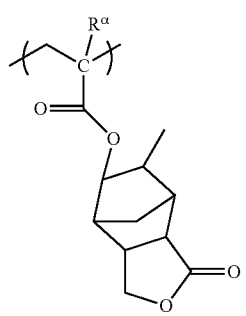
(a2-3-3)
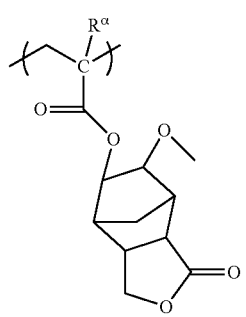
(a2-3-4)
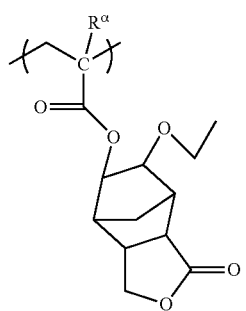
(a2-3-5)
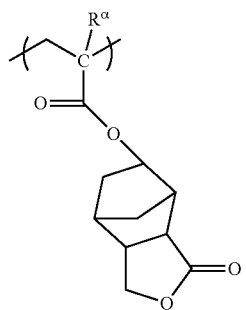
[Chemical Formula 33]
(a2-4-1)
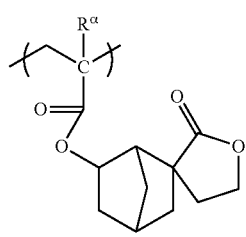

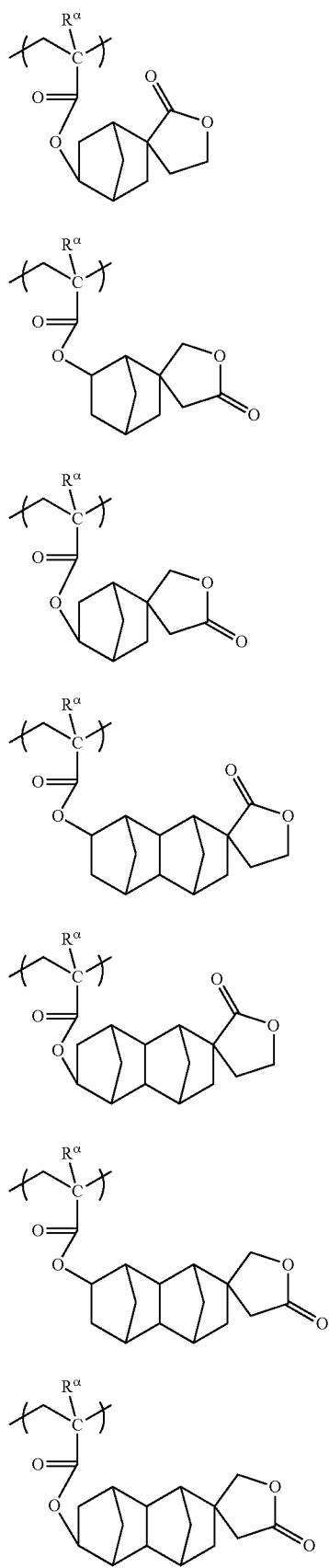
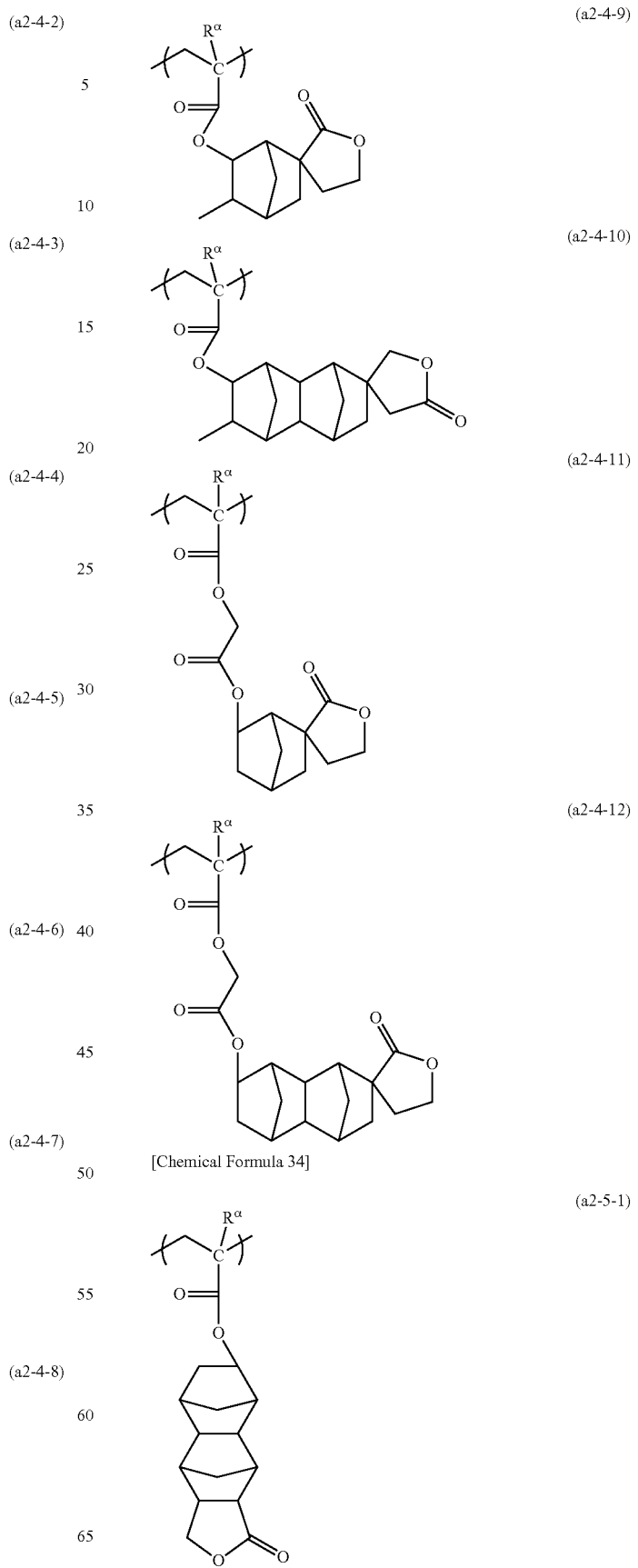
[Chemical Formula 34]

As the structural unit (a2) contained in the component (A1), 1 type of structural unit may be used, or 2 or more types may be used.

As the structural unit (a2), at least one structural unit selected from the group consisting of formulas (a2-1) to (a2-5) is preferable, and at least one structural unit selected from the group consisting of formulas (a2-1) to (a2-3) is more preferable. Of these, it is preferable to use at least one structural unit selected from the group consisting of structural units represented by formulas (a2-1-1), (a2-1-2), (a2-2-1), (a2-2-7), (a2-3-1) and (a2-3-5).

In the component (A1), the amount of the structural unit (a2) based on the combined total of all structural units constituting the component (A1) is preferably 5 to 60 mol %, more preferably 10 to 50 mol %, and still more preferably 10 to 45 mol %.

When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

[Structural Unit (a3)]

The structural unit (a3) is a structural unit derived from an acrylate ester which may have the hydrogen atom bonded to the carbon atom on the α-position substituted with a substituent and contains a polar group-containing aliphatic hydrocarbon group (provided that the aforementioned structural units (a1), (a0) and (a2) are excluded from the structural unit (a3)).

When the component (A1) includes the structural unit (a3), the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 35]

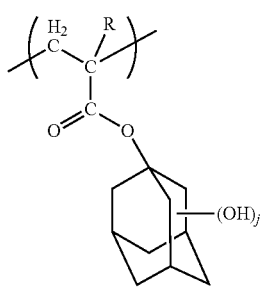

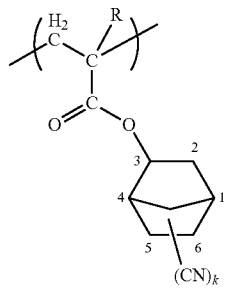

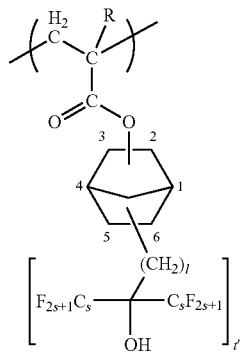

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

[Other Structural Unit]

The component (A1) may also have a structural unit other than the above-mentioned structural units (a1), (a0), (a2) and (a3), as long as the effects of the present invention are not impaired.

As such a structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used.

Examples of the other structural unit include a structural unit (a4) derived from an acrylate ester which may have the hydrogen atom bonded to the carbon atom on the α-position substituted with a substituent and contains an acid non-dissociable aliphatic polycyclic group, a structural unit (a5) derived from hydroxystyrene and a structural unit (a6) derived from styrene.

A "structural unit derived from a hydroxystyrene" refers to a structural unit that is formed by the cleavage of the ethylenic double bond of a hydroxystyrene.

The term "hydroxystyrene" is a generic term that includes hydroxystyrene having a hydrogen atom bonded to the carbon atom on the α-position (the carbon atom to which the phenyl group is bonded), hydroxystyrene having a substituent (an atom other than a hydrogen atom or a group) bonded to the carbon atom on the α-position, and derivatives thereof. Specifically, at least the benzene ring and the hydroxy group bonded to the benzene ring are maintained, and examples thereof include those in which the hydrogen atom bonded to the α-position of hydroxystyrene has been substituted with an alkyl group of 1 to 5 carbon atoms, a halogenated alkyl group of 1 to 5 carbon atoms, a hydroxyalkyl group or the like, and those in which the benzene ring having a hydroxy group bonded thereto further has an alkyl group of 1 to 5 carbon atoms, or those in which the benzene ring having a hydroxy group bonded thereto further has one or two hydroxy groups (the total number of hydroxy groups being two or three).

A "structural unit derived from styrene" refers to a structural unit that is formed by the cleavage of the ethylenic double bond of styrene.

The term "styrene" includes styrene, compounds in which the hydrogen atom at the α-position has been substituted with a substituent (an atom other than hydrogen or a group), and derivatives thereof (provided that the aforementioned hydroxystyrene is excluded). Further, those in which a hydrogen atom of the phenyl group has been substituted with a substituent such as an alkyl group of 1 to 5 carbon atoms are also included.

In the aforementioned hydroxystyrene or styrene, the alkyl group as the substituent on the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms as the substituent on the α-position include groups in which part or all of the hydrogen atoms of the aforementioned "alkyl group of 1 to 5 carbon atoms as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group of 1 to 5 carbon atoms as the substituent on the α-position include groups in which part or all of the hydrogen atoms of the aforementioned "alkyl group of 1 to 5 carbon atoms as the substituent on the α-position" are substituted with a hydroxy group. The number of hydroxy groups within the hydroxyalkyl group is preferably 1 to 5, and most preferably 1.

(Structural Unit (a4))

The structural unit (a4) is a structural unit derived from an acrylate ester which may have the hydrogen atom bonded to the carbon atom on the α-position substituted with a substituent and contains an acid non-dissociable aliphatic polycyclic group.

In the structural unit (a4), examples of this polycyclic group include the same polycyclic groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 36]

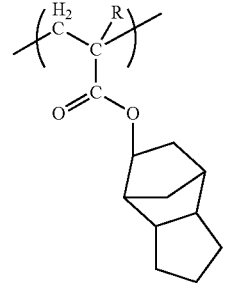
(a4-1)

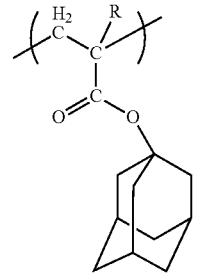
(a4-2)

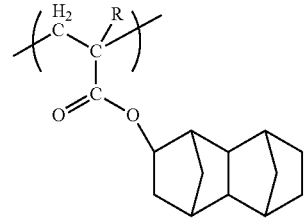
(a4-3)

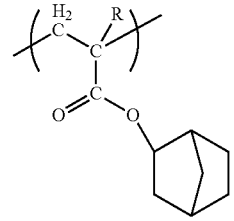
(a4-4)

-continued

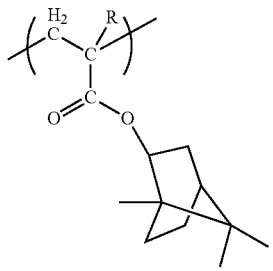

(a4-5)

In the formulae, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

(Structural Unit (a5))

As the structural unit (a5), a structural unit represented by general formula (a5-1) shown below is preferable because the solubility in an organic solvent becomes excellent, the solubility in an alkali developing solution is increased, and the etching resistance becomes excellent.

[Chemical Formula 37]

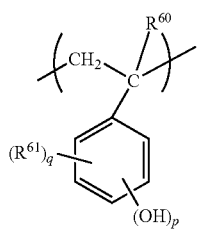

(a5-1)

In the formula, $R^{60}$ represents a hydrogen atom or an alkyl group of 1 to 5 carbon atoms; $R^{61}$ represents an alkyl group of 1 to 5 carbon atoms; p represents an integer of 1 to 3; and q represents an integer of 0 to 2.

In the formula (a5-1), specific examples of the alkyl group of 1 to 5 carbon atoms for $R^{60}$ include linear or branched alkyl groups such as a methyl group, an ethyl group, a propyl group, an isopropyl group, an n-butyl group, an isobutyl group, a tert-butyl group, a pentyl group, an isopentyl group and a neopentyl group. As $R^{60}$, a hydrogen atom or a methyl group is preferable.

p represents an integer of 1 to 3, and is preferably 1.

The bonding position of the hydroxy group may be any of the o-position, m-position and p-position of the phenyl group. When p is 1, the p-position is preferable in terms of availability and low cost. When p is 2 or 3, a desired combination of the bonding positions can be used.

q represents an integer of 0 to 2. q is preferably 0 or 1, and most preferably 0 from industrial viewpoint.

As the alkyl group for $R^{61}$, the same alkyl groups as those for $R^{60}$ can be mentioned.

When q is 1, the bonding position of $R^{61}$ may be any of the o-position, the m-position and the p-position.

When q is 2, a desired combination of the bonding positions can be used. Here, the plurality of the $R^{61}$ group may be the same or different from each other.

When the structural unit (a5) is included in the component (A1), the amount of the structural unit (a5) based on the combined total of all the structural units that constitute the component (A1) is preferably within the range from 50 to 90 mol %, more preferably from 55 to 85 mol %, and still more preferably 60 to 80 mol %.

(Structural Unit (a6))

As the structural unit (a6), a structural unit represented by general formula (a6-1) shown below is preferable because the solubility in an alkali developing solution can be adjusted, and heat resistance and dry etching resistance are improved.

[Chemical Formula 38]

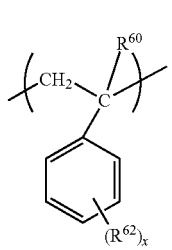

(a6-1)

In the formula, $R^{60}$ represents a hydrogen atom or an alkyl group of 1 to 5 carbon atoms; $R^{62}$ represents an alkyl group of 1 to 5 carbon atoms; and x represents an integer of 0 to 3.

In general formula (a6-1), $R^{60}$ is the same as defined above for $R^{60}$ in the aforementioned general formula (a5-1).

In the formula (a6-1), as the alkyl group for $R^{62}$, the same alkyl groups as those for $R^{61}$ in the aforementioned formula (a5-1) can be mentioned.

x represents an integer of 0 to 3, preferably 0 or 1, and most preferably 0 in terms of industry.

When x represents 1, the substitution position of $R^{62}$ may be any of o-position, m-position or p-position of the phenyl group. When x is 2 or 3, a desired combination of the bonding positions can be used. Here, the plurality of the $R^{62}$ group may be the same or different from each other.

When the structural unit (a6) is included in the component (A1), the amount of the structural unit (a6) based on the combined total of all the structural units that constitute the component (A1) is preferably within the range from 10 to 50 mol %, more preferably from 15 to 45 mol %, and still more preferably 20 to 40 mol %.

In the resist composition of the present invention, the component (A) preferably contains a polymeric compound (A1) having a structural unit (a1).

Specific examples of the component (A1) include a polymeric compound consisting of a repeating structure of a structural unit (a1) and a structural unit (a2); a polymeric compound consisting of a repeating structure of a structural unit (a1) and a structural unit (a0); a polymeric compound consisting of a repeating structure of a structural unit (a1), a structural unit (a2) and a structural unit (a3); a polymeric compound consisting of a repeating structure of a structural unit (a1), a structural unit (a0) and a structural unit (a3); and a polymeric compound consisting of a repeating structure of a structural unit (a1), a structural unit (a0), a structural unit (a2) and a structural unit (a3).

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—CH$_2$—CH$_2$—CH$_2$—C(CF$_3$)$_2$—OH, a —C(CF$_3$)$_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

In the component (A), as the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved, such as improvement in MEF and circularity, and reduction of roughness.

The component (A) may contain "a base component which exhibits increased polarity under action of acid" other than the component (A1) (hereafter, referred to as "component (A2)"), as long as the effects of the present invention are not impaired.

Examples of the component (A2) include low molecular weight compounds that have a molecular weight of at least 500 and less than 2,500, contains a hydrophilic group, and also contains an acid dissociable group described above in connection with the component (A1). Specific examples include compounds containing a plurality of phenol skeletons in which part or all of the hydrogen atoms within hydroxyl groups have been substituted with the aforementioned acid dissociable groups.

Examples of the low-molecular weight compound include low molecular weight phenolic compounds in which a portion of the hydroxyl group hydrogen atoms have been substituted with an aforementioned acid dissociable group, and these types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane skeletons is preferable in terms of resolution and line width roughness (LWR). Also, there are no particular limitations on the acid dissociable group, and suitable examples include the groups described above.

In the resist composition of the present invention, the amount of the component (A) can be appropriately adjusted depending on the thickness of the resist film to be formed, and the like.

Photobase Generator Component; Component (C)

In the method of forming a resist pattern according to the present invention, by virtue of the component (C) being decomposed in step (2) by the exposure energy to generate a base, an excellent dissolution contrast can be obtained.

The component (C) may be any compound capable of being decomposed by irradiation of radiation to generate a base, and examples thereof include a compound containing a carbamate group (a urethane bond), a compound containing an acyloxyimino group, an ionic compound (an anion-cation complex), and a compound containing a carbamoyloxyimino group. Among these, a compound containing a carbamate group (a urethane bond), a compound containing an acyloxyimino group, and an ionic compound (an anion-cation complex) are preferable.

Further, compounds having a ring structure within a molecule thereof are preferable, and examples thereof include compounds having a ring skeleton such as benzene, naphthalene, anthracene, xanthone, thioxanthone, anthraquinone or fluorene.

Among these, as the component (C), in terms of photodegradability, a compound represented by general formula (C1) shown below (hereafter, referred to as "component (C1)") is particularly desirable. When the compound is irradiated by radiation, at least the bond between the nitrogen atom in the formula (C1) and the carbon atom of the carbonyl group adjacent to the nitrogen atom is cleaved, thereby generating an amine or ammonia and carbon dioxide. After the decomposition, it is preferable that the product containing —N(R$^1$)(R$^2$) has a high boiling point. Further, in terms of suppressing diffusion during PEB, it is preferable that the product containing —N(R$^1$)(R$^2$) has a large molecular weight or a highly bulky skeleton.

[Chemical Formula 39]

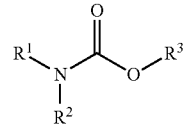

(C1)

In the formula, R$^1$ and R$^2$ each independently represents a hydrogen atom or a monovalent hydrocarbon group which may contain a hetero atom, provided that R' and $R^2$ may be mutually bonded to form a cyclic group with the adjacent nitrogen atom; and $R^3$ represents a monovalent photoactive group.

In formula (C1), the hetero atom which may be contained in the hydrocarbon group for $R^1$ and $R^2$ is an atom other than hydrogen and carbon, and examples thereof include an oxygen atom, a nitrogen atom, a sulfur atom and a halogen atom. Examples of the halogen atom include a fluorine atom, a chlorine atom, a bromine atom and an iodine atom.

The hydrocarbon group may be either an aromatic hydrocarbon group or an aliphatic hydrocarbon group, and is preferably an aliphatic hydrocarbon group.

In formula (C1), the aromatic hydrocarbon group for $R^1$ and $R^2$ is a hydrocarbon group having an aromatic ring.

The aromatic hydrocarbon group for $R^1$ and $R^2$ preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Further, when the aromatic hydrocarbon group has an aliphatic hydrocarbon group bonded to the aromatic ring, part of the carbon atoms constituting the aliphatic hydrocarbon group may be substituted with a substituent group containing a hetero atom, or part or all of the hydrogen atoms constituting the aliphatic hydrocarbon group may be substituted with a substituent group. As examples of the "aliphatic hydrocarbon group" and the "divalent linking group containing a hetero atom", the same aliphatic hydrocarbon groups and divalent linking groups containing a hetero atom as those described later for $R^1$ and $R^2$ can be mentioned.

Examples of the aromatic hydrocarbon group in which part of the carbon atoms constituting the aromatic ring has been substituted with a hetero atom include a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom.

Examples of the substituent group which substitutes the hydrogen atom bonded to the aromatic ring of the aforementioned aromatic hydrocarbon group include an alkyl group, an alkoxy group, a halogen atom, a halogenated alkyl group, a hydroxyalkyl group, a hydroxy group, an oxygen atom (=O), —COOR", —OC(=O)R", a cyano group, a nitro group, —NR"$_2$, —R$^{9'}$—N(R$^{10'}$)—C(=O)—O—R$^{5'}$, and a nitrogen-containing heterocyclic group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear or branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

The hydroxyalkyl group for the substituent preferably has 1 to 6 carbon atoms, and specific examples thereof include the aforementioned alkyl groups for the substituent in which at least one hydrogen atom has been substituted with a hydroxy group.

In the —COOR" group, the —OC(=O)R" group and the —NR"$_2$ group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The two R" groups within the —NR"$_2$ group may be the same or different from each other.

In formula —R$^{9'}$—N(R$^{10'}$)—C(=O)—O—R$^{5'}$, R$^{9'}$ represents a divalent hydrocarbon group which may contain a hetero atom, R$^{10'}$ represents a hydrogen atom or a monovalent hydrocarbon group which may contain a hetero atom, and R$^{5'}$ represents a monovalent organic group which has an aliphatic ring or an aromatic ring.

Examples of the hydrocarbon group for R$^{9'}$ include groups in which one hydrogen atom has been removed from the hydrocarbon group for $R^1$ in the aforementioned formula (C1).

As examples of R$^{10'}$ and R$^{5'}$, the same groups as those described above for $R^2$ and $R^3$ in formula (C1) can be given, respectively.

In formula —$R^{9'}$—$N(R^{10'})$—$C(=O)$—$O$—$R^{5'}$, $R^{10'}$, may be bonded to $R^{9'}$ to form a ring.

With respect to $R^1$ and $R^2$ in formula (C1), when $R^1$ has —$R^{9'}$—$N(R^{10'})$—$C(=O)$—$O$—$R^{5'}$ as a substituent, $R^{10'}$ may be bonded to $R^2$ in formula (C1) to form a ring.

With respect to $R^1$ and $R^2$ in formula (C1), when $R^1$ has —$R^{9'}$—$N(R^{10'})$—$C(=O)$—$O$—$R^{5'}$ as a substituent, the compound represented by formula (C1) is preferably a compound represented by the following general formula: $R^{5'}$-O—$C(=O)$—$N(R^{10'})$—$R^4$—$N(R^2)$—$C(=O)$—$O$—$R^3$ [in the formula, $R^2$, $R^3$, $R^{10'}$ and $R^{5'}$ are the same as defined above; and $R^4$ represents a divalent aliphatic hydrocarbon group].

Examples of the divalent aliphatic hydrocarbon group for $R^4$ include groups in which one hydrogen atom has been removed from the aliphatic hydrocarbon groups for $R^1$ and $R^2$ described later.

The "nitrogen-containing heterocyclic group" as the aforementioned substituent is a group in which one or more hydrogen atoms have been removed from a nitrogen-containing heterocyclic compound containing a nitrogen atom in the ring skeleton thereof. The nitrogen-containing heterocyclic compound may have a carbon atom or a hetero atom other than nitrogen (e.g., an oxygen atom, a sulfur atom or the like) within the ring skeleton thereof.

The nitrogen-containing heterocyclic compound may be either aromatic or aliphatic. When the nitrogen-containing heterocyclic compound is aliphatic, it may be either saturated or unsaturated. Further, the nitrogen-containing heterocyclic compound may be either monocyclic or polycyclic.

The nitrogen-containing heterocyclic compound preferably has 3 to 30 carbon atoms, more preferably 5 to 30, and still more preferably 5 to 20.

Specific examples of monocyclic nitrogen-containing heterocycle compound include pyrrole, pyridine, imidazole, pyrazole, 1,2,3-triazole, 1,2,4-triazole, pyrimidine, pyrazine, 1,3,5-triazine, tetrazole, piperidine, piperazine, pyrrolidine and morpholine.

Specific examples of polycyclic nitrogen-containing heterocycle compound include quinoline, isoquinoline, indole, pyrrolo[2,3-b]pyridine, indazole, benzimidazole, benzotriazole, carbazole, acridine, 1,5-diazabicyclo[4.3.0]-5-nonene, 1,8-diazabicyclo[5.4.0]-7-undecene, hexamethylenetetramine and 1,4-diazabicyclo[2.2.2]octane.

The nitrogen-containing heterocyclic compound may have a substituent. Examples of the substituent include the same groups as those described above for the substituent group which substitutes a hydrogen atom bonded to the aromatic ring contained in the aforementioned aromatic hydrocarbon group.

In formula (C1), the aliphatic hydrocarbon group for $R^1$ and $R^2$ refers to a hydrocarbon group that has no aromaticity.

The aliphatic hydrocarbon group for $R^1$ and $R^2$ may be either saturated (an alkyl group) or unsaturated. In general, the aliphatic hydrocarbon group is preferably saturated. Further, the aliphatic hydrocarbon group may be linear, branched or cyclic, or a combination thereof. Examples of the combination include a group in which a cyclic aliphatic hydrocarbon group is bonded to a terminal of a linear or branched aliphatic hydrocarbon group, and a group in which a cyclic aliphatic hydrocarbon group is interposed within a linear or branched aliphatic hydrocarbon group.

The linear or branched alkyl group preferably has 1 to 20 carbon atoms, more preferably 1 to 15, and still more preferably 1 to 10.

Specific examples of linear alkyl groups include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

Specific examples of branched alkyl groups include a 1-methylethyl group (an isopropyl group), a 1-methylpropyl group, a 2-methylpropyl group, a 1-methylbutyl group, a 2-methylbutyl group, a 3-methylbutyl group, a 1-ethylbutyl group, a 2-ethylbutyl group, a tert-butyl group, a 1-methylpentyl group, a 2-methylpentyl group, a 3-methylpentyl group and a 4-methylpentyl group.

The cyclic alkyl group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12. As the aliphatic cyclic group, a group in which one hydrogen atom has been removed from a monocycloalkane or a polycycloalkane such as a bicycloalkane, tricycloalkane or tetracycloalkane can be used. Specific examples of the group in which one hydrogen atom has been removed from a monocycloalkane include a cyclopentyl group and a cyclohexyl group. Examples of the group in which one hydrogen atom has been removed from a polycycloalkane include an adamantyl group, a norbornyl group, an isobornyl group, a tricyclodecyl group and a tetracyclododecyl group.

The aliphatic hydrocarbon group may have a substituent. For example, part of the carbon atoms constituting the aliphatic hydrocarbon group may be replaced by a divalent linking group containing a hetero atom, and part or all of the hydrogen atoms constituting the aliphatic hydrocarbon group may be substituted with a substituent.

With respect to the divalent linking group containing a hetero atom, examples of hetero atoms include the same hetero atoms as those described above which replaces part of the carbon atoms constituting the aromatic ring contained in the aforementioned aromatic hydrocarbon group. Examples of the divalent linking group containing a hetero atom include divalent non-hydrocarbon groups containing a hetero atom, such as —O—, —C(=O)—, —C(=O)—O—, a carbonate bond (—O—C(=O)—O—), —S—, —S(=O)$_2$—, —S(=O)$_2$—O—, —NH—, —NR$^{O4}$— (R$^{O4}$ represents a substituent such as an alkyl group or an acyl group), —NH—C(=O)— and =N—. Further, a combination of any one of these "non-hydrocarbon groups containing a hetero atom" with a divalent aliphatic hydrocarbon group can also be used. Examples of the divalent aliphatic hydrocarbon group include groups in which one hydrogen atom has been removed from the aforementioned aliphatic hydrocarbon group, and a linear or branched aliphatic hydrocarbon group is preferable.

As the substituent for the aliphatic hydrocarbon group in the latter example, the same groups as those described above for the substituent group which substitutes a hydrogen atom bonded to the aromatic ring contained in the aforementioned aromatic hydrocarbon group can be mentioned.

In the aforementioned general formula (C1), $R^1$ and $R^2$ may be mutually bonded to form a cyclic group with the adjacent nitrogen atom.

The cyclic group may be either an aromatic cyclic group or an aliphatic cyclic group. When the cyclic group is an aliphatic cyclic group, it may be either saturated or unsaturated. In general, the aliphatic cyclic group is preferably saturated.

The cyclic group may have a nitrogen atom other than the nitrogen atom bonded to $R^1$ and $R^2$ within the ring skeleton thereof. Further, the cyclic group may have a carbon atom or a hetero atom other than nitrogen (e.g., an oxygen atom, a sulfur atom or the like) within the ring skeleton thereof.

The cyclic group may be either a monocyclic group or a polycyclic group.

When the cyclic group is monocyclic, the number of atoms constituting the skeleton of the cyclic group is preferably from 4 to 7, and more preferably 5 or 6. That is, the cyclic group is preferably a 4- to 7-membered ring, and more preferably a 5- or 6-membered ring. Specific examples of monocyclic groups include groups in which the hydrogen atom of —NH— has been removed from a heteromonocyclic group containing —NH— in the ring structure thereof, such as piperidine, pyrrolidine, morpholine, pyrrole, imidazole, pyrazole, 1,2,3-triazole, 1,2,4-triazole, tetrazole or piperazine.

When the cyclic group is polycyclic, the cyclic group is preferably bicyclic, tricyclic or tetracyclic. Further, the number of atoms constituting the skeleton of the cyclic group is preferably from 7 to 12, and more preferably from 7 to 10. Specific examples of polycyclic nitrogen-containing heterocyclic groups include groups in which the hydrogen atom of —NH— has been removed from a heteropolycyclic group containing —NH— in the ring structure thereof, such as indole, isoindole, carbazole, benzimidazole, indazole or benzotriazole.

The cyclic group may have a substituent. Examples of the substituent include the same groups as those described above for the substituent group which substitutes a hydrogen atom bonded to the aromatic ring contained in the aforementioned aromatic hydrocarbon group.

As a cyclic group formed by $R^1$ and $R^2$ mutually bonded with the adjacent nitrogen atom, a group represented by general formula (II) shown below is particularly desirable.

[Chemical Formula 40]

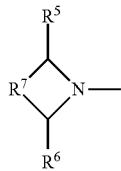

(II)

In the formula, $R^5$ and $R^6$ each independently represents a hydrogen atom or an alkyl group; $R^7$ represents a linear alkylene group of 1 to 3 carbon atoms which may have a carbon atom substituted with an oxygen atom or a nitrogen atom and may have a hydrogen atom substituted with a substituent.

In formula (II), as the alkyl group for $R^5$ and $R^6$, the same alkyl groups as those described above as the aliphatic hydrocarbon group for $R^1$ and $R^2$ can be mentioned, a linear or branched alkyl group is preferable, and a methyl group is particularly desirable.

Examples of the alkylene group for $R^7$ which may have a carbon atom substituted with an oxygen atom or a nitrogen atom include —CH$_2$—, —CH$_2$—O—, —CH$_2$—NH—, —CH$_2$—CH$_2$—, —CH$_2$—O—CH$_2$—, —CH$_2$—NH—CH$_2$—, —CH$_2$—CH$_2$—CH$_2$—, —CH$_2$—CH$_2$—O—CH$_2$—, and —CH$_2$—CH$_2$—NH—CH$_2$—.

As the substituent which substitutes a hydrogen atom in the alkylene group, the same groups as those described above for the substituent group which substitutes a hydrogen atom bonded to the aromatic ring contained in the aforementioned aromatic hydrocarbon group can be mentioned. The hydrogen atom to be substituted with a substituent may be a hydrogen atom bonded to a carbon atom, or a hydrogen atom bonded to a nitrogen atom.

In formula (C1), $R^3$ represents a monovalent photoactive group.

The term "photoactive group" refers to a group which absorbs the exposure energy of the exposure conducted in step (2).

As the photoactive group, a ring-containing group is preferable, and may be either a hydrocarbon ring or a hetero ring. Preferable examples thereof include groups having a ring structure described above for $R^1$ and $R^2$, and groups having an aromatic ring. Specific examples of preferable ring skeletons for the ring-containing group include benzene, biphenyl, indene, naphthalene, fluorene, anthracene, phenanthrene, xanthone, thioxanthone and anthraquinone.

Further, these ring skeletons may have a substituent. In terms of efficiency in the generation of a base, as the substituent, a nitro group is particularly desirable.

As the component (C1), a compound represented by general formula (C1-11) or (C1-12) shown below is particularly desirable.

[Chemical Formula 41]

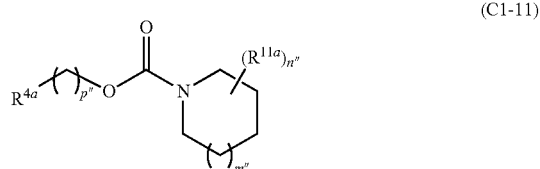

(C1-11)

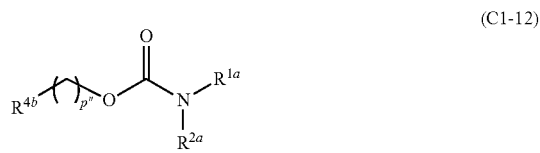

(C1-12)

In the formulae, $R^{4a}$ and $R^{4b}$ each independently represents a ring skeleton selected from benzene, biphenyl, indene, naphthalene, fluorene, anthracene, phenanthrene, xanthone, thioxanthone and anthraquinone which may have a substituent; $R^{1a}$ and $R^{2a}$ each independently represents an alkyl group of 1 to 15 carbon atoms or a cycloalkyl group; $R^{11a}$ represents an alkyl group of 1 to 5 carbon atoms; m" represents 0 or 1; n" represents 0 to 3; and each p" independently represents 0 to 3.

In formulae (C1-11) and (C1-12), in terms of efficiency in generation of a base, it is preferable that $R^{4a}$ and $R^{4b}$ has a nitro group as a substituent, and it is particularly desirable that the ortho position is substituted.

In terms of suppressing the diffusion length of the generated base, it is preferable that each of $R^{1a}$ and $R^{2a}$ is a cycloalkyl group of 5 to 10 carbon atoms.

m" is preferably 1. n" is preferably 0 to 2. p" is preferably 0 or 1.

Specific examples of the component (C1) are shown below.

[Chemical Formula 42]

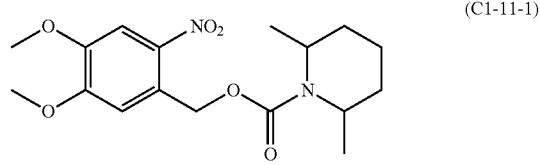

(C1-11-1)

(C1-11-2)
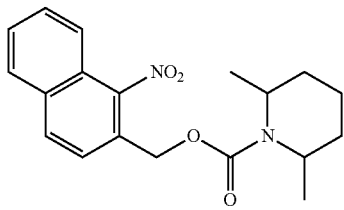

(C1-11-3)
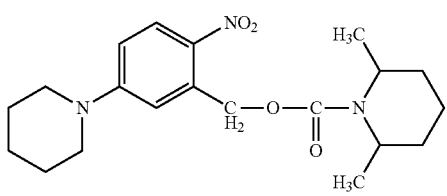

(C1-11-4)
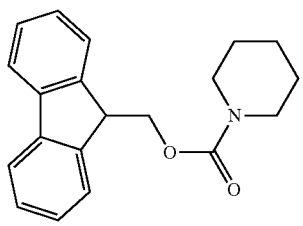

(C1-11-5)
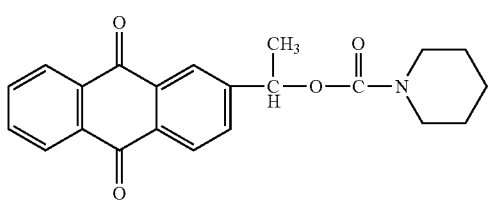

[Chemical Formula 43]

(C1-12-1)
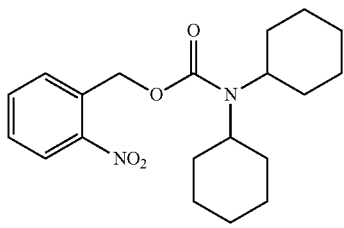

(C1-12-2)
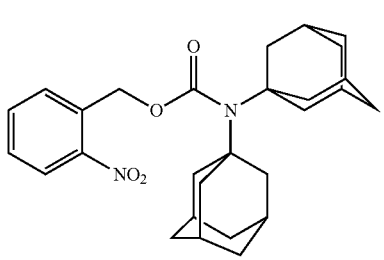

(C1-12-3)
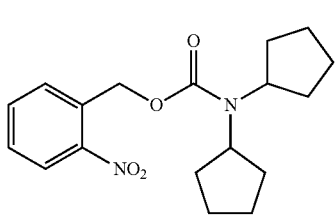

(C1-12-4)
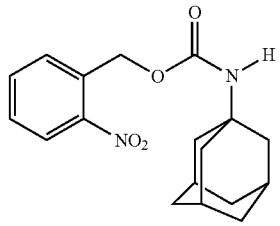

Further, as a preferable example of the component (C), a compound represented by general formula (C2) shown below (hereafter, referred to as "component (C2)") can also be mentioned.

After absorbing the exposure energy by the exposure conducted in step (2), the component (C2) has the (—CH=CH—C(=O)—) portion isomerized to a cis isomer, and is further cyclized by heating, thereby generating a base ($NHR^1R^2$).

The component (C2) is preferable in that, not only a base can be generated, but also the effect of rendering the resist composition hardly soluble in an alkali developing solution in step (4) can be obtained.

[Chemical Formula 44]

(C2)
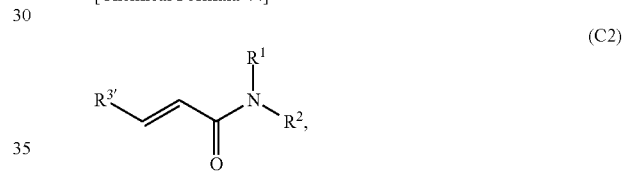

In formula (C2), $R^1$ and $R^2$ are respectively the same as defined for $R^1$ and $R^2$ in the aforementioned formula (C1); and $R^{3'}$ represents an aromatic cyclic group having a hydroxy group on the ortho position.

In the aforementioned formula (C2), it is preferable that $R^1$ and $R^2$ are mutually bonded together with the adjacent nitrogen atom to form a cyclic group represented by the aforementioned formula (II). Further, $R^1$ and $R^2$ are preferably the same as defined for $R^{1a}$ and $R^{2a}$ in the aforementioned formula (C1-12).

As the aromatic cyclic group for $R^{3'}$, the same groups having an aromatic ring as those described above for $R^3$ in the aforementioned formula (C1) can be mentioned. As the ring skeleton, benzene, biphenyl, indene, naphthalene, fluorene, anthracene and phenanthrene are preferable, and a benzene ring is more preferable.

The aromatic cyclic group for $R^{3'}$ may have a substituent other than the hydroxy group on the ortho position. Examples of the substituent include a halogen atom, a hydroxy group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, and a monovalent organic group such as an alkyl group.

Specific examples of the component (C2) are shown below.

[Chemical Formula 45]

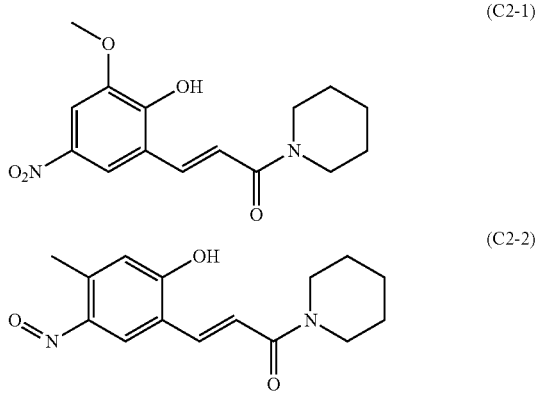

Further, as a preferable example of the component (C), a compound represented by general formula (C3) shown below (hereafter, referred to as "component (C3)") can also be mentioned.

After absorbing the exposure energy by the exposure conducted in step (2), the component (C3) undergoes decarboxylation, and then reacts with water to generate amine (base).

[Chemical Formula 46]

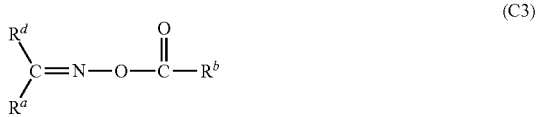

In the formula, $R^a$ and $R^d$ each independently represents a hydrogen atom or a hydrocarbon group of 1 to 30 carbon atoms which may have a substituent (provided that, when both $R^a$ and $R^d$ represent a hydrocarbon group of 1 to 30 carbon atoms which may have a substituent, $R^a$ and $R^d$ are mutually bonded to form a ring); and $R^b$ represents an aryl group which may have a substituent or an aliphatic cyclic group which may have a substituent.

In the aforementioned formula (C3), $R^a$ represents a hydrogen atom or a hydrocarbon group of 1 to 30 carbon atoms which may have a substituent.

The hydrocarbon group of 1 to 30 carbon atoms for $R^a$ which may have a substituent may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 to 3, and most preferably 1 or 2.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (═O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aforementioned aromatic hydrocarbon group include groups in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic hydrocarbon group for Ra in the aforementioned formula (C3) may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $R^a$ in the aforementioned formula (C3), part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $R^a$ in the aforementioned formula (C3), there is no particular limitation as long as it is an atom other than carbon and hydrogen, and examples thereof include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(═O)—O—, —C(═O)—, —O—C(═O)—O—, —C(═O)—NH—, —NH— (the H may be replaced with a substituent such as an alkyl group or an acyl group), —S—, —S(═O)$_2$— and —S(═O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The cyclic aliphatic hydrocarbon group (aliphatic cyclic group) for Ra in the aforementioned formula (C3) is an aliphatic cyclic group of 3 to 30 carbon atoms which may have a substituent.

In the aliphatic cyclic group for $R^a$ in the aforementioned formula (C3), part of the carbon atoms constituting the aliphatic cyclic group may be substituted with a substituent group containing a hetero atom, or part or all of the hydrogen atoms constituting the aliphatic cyclic group may be substituted with a substituent group containing a hetero atom.

As the "hetero atom" for $R^a$ in the aforementioned formula (C3), there is no particular limitation as long as it is an atom other than carbon and hydrogen, and examples thereof include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. These substituents may be contained in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic cyclic group may be either a monocyclic group or a polycyclic group. The aliphatic cyclic group has 3 to 30 carbon atoms, preferably 5 to 30, more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 47]

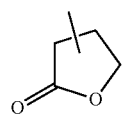

(L1)

-continued (L2)
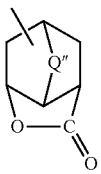

(L3)
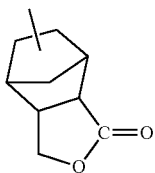

(L4)
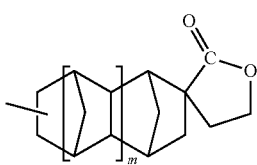

(L5)
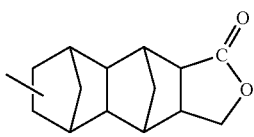

(L6)
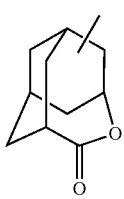

(S1)
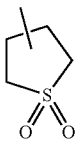

(S2)
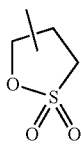

(S3)
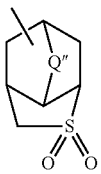

(S4)
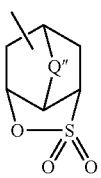

In the formula, Q″ represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents 0 or 1.

In the formulas, the alkylene group for Q″ and $R^{94}$ to $R^{95}$ is preferably a linear or branched alkylene group, and has 1 to 5 carbon atoms, preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

As the aliphatic cyclic group for $R^a$ which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L6), (S3) and (S4) are preferable.

When $R^a$ in the aforementioned formula (C3) represents a hydrocarbon group of 1 to 30 carbon atoms which may have a substituent, $R^a$ may form a ring with the adjacent carbon atom. The formed ring may be either monocyclic or polycyclic. The number of carbon atoms (including the carbon atom bonded thereto) is preferably 5 to 30, and more preferably 5 to 20.

Specifically, among the cyclic aliphatic hydrocarbon groups (aliphatic cyclic groups) for $R^a$ described above, aliphatic cyclic groups of 5 to 30 carbon atoms can be given as examples (provided that the carbon atom bonded thereto is regarded as part of the ring).

It is preferable that $R^a$ in the aforementioned formula (C3) is a hydrogen atom or a cyclic group which may have a substituent. The cyclic group may be either an aromatic hydrocarbon group which may have a substituent, or an aliphatic cyclic group which may have a substituent.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L6), (S3) and (S4) are preferable.

As the aromatic hydrocarbon group which may have a substituent, a naphthyl group which may have a substituent, or a phenyl group which may have a substituent is preferable.

Examples of the aryl group for $R^b$ in the aforementioned formula (C3) include the aromatic hydrocarbon groups described above for $R^a$, excluding arylalkyl groups. As the aryl group for $R^b$, a phenyl group is more preferable.

The aliphatic cyclic group for $R^b$ in the aforementioned formula (C3) is the same as defined for the aliphatic cyclic group for $R^a$ in the aforementioned formula (C3). The aliphatic cyclic group for $R^b$ is preferably an aliphatic polycyclic group, more preferably a group in which one or more hydrogen atoms have been removed from a polycycloalkane, and most preferably a group in which one or more hydrogen atoms have been removed from adamantane.

As the substituent which the aromatic hydrocarbon group or the aliphatic cyclic group for $R^b$ may have, the same substituents as those described above for $R^a$ in the aforementioned formula (C3) can be mentioned.

$R^d$ in the aforementioned formula (C3) is the same as defined for Ra in the aforementioned formula (C3).

It is preferable that $R^d$ in the aforementioned formula (C3) is a cyclic group which may have a substituent.

The cyclic group may be either an aromatic hydrocarbon group which may have a substituent, or an aliphatic cyclic group which may have a substituent, and an aromatic cyclic group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L6), (S3) and (S4) are preferable.

$R^d$ in the aforementioned formula (C3) is more preferably a naphthyl group which may have a substituent, or a phenyl group which may have a substituent, and most preferably a phenyl group which may have a substituent.

When both $R^a$ and $R^d$ represent a hydrocarbon group of 1 to 30 carbon atoms which may have a substituent, $R^a$ and $R^d$ are mutually bonded to form a ring. The formed ring may be either monocyclic or polycyclic. The number of carbon atoms (including the carbon atom bonded to $R^a$ and $R^d$ in the aforementioned formula (C3) is preferably 5 to 30, and more preferably 5 to 20.

Specifically, among the cyclic aliphatic hydrocarbon groups (aliphatic cyclic groups) for $R^a$ described above, aliphatic cyclic groups of 5 to 30 carbon atoms can be given as examples, provided that the carbon atom bonded to $R^a$ and $R^d$ is regarded as part of the ring.

Specific examples of the component (C3) are shown below.

[Chemical Formula 48]

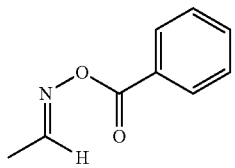

(C3-1)

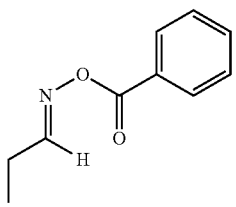

(C3-2)

-continued

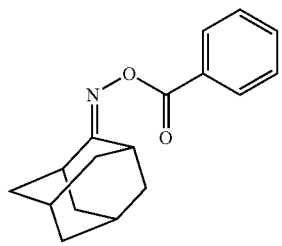

(C3-3)

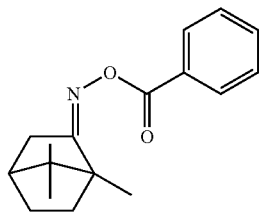

(C3-4)

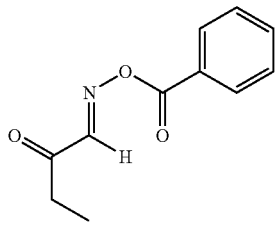

(C3-5)

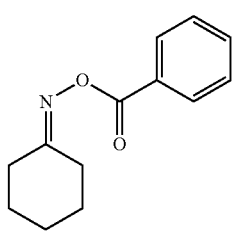

(C3-6)

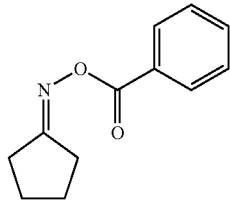

(C3-7)

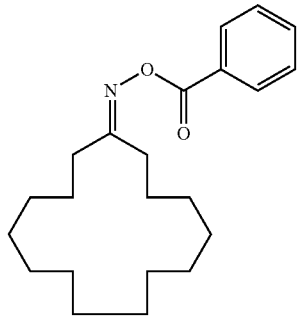

(C3-8)

(C3-9)
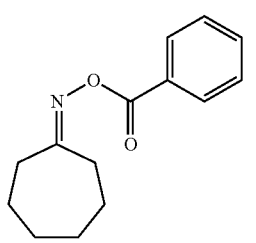
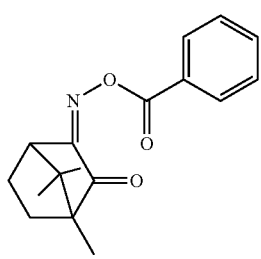
[Chemical Formula 49]
(C3-11)
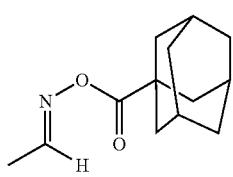
(C3-12)
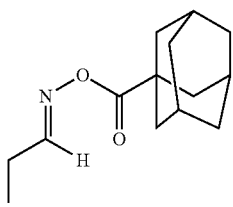
(C3-13)
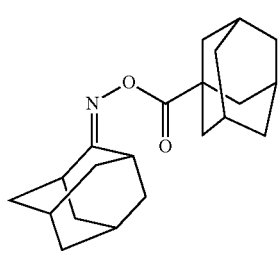
(C3-14)
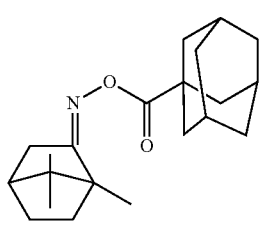
(C3-15)
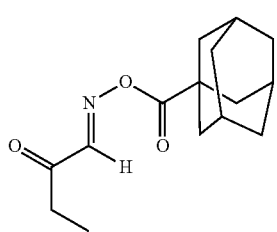
(C3-10)
(C3-16)
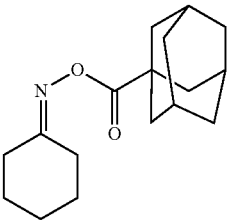
(C3-17)
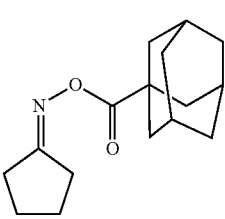
(C3-18)
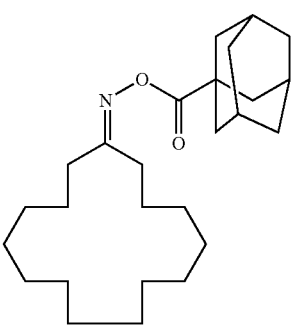
(C3-19)
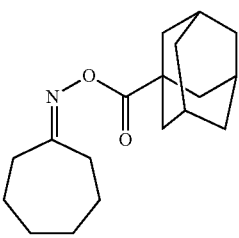
(C3-20)
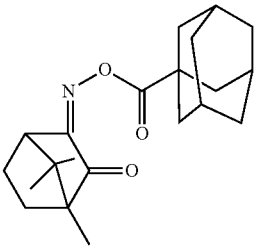
Further, as a preferable example of the component (C), the following compounds (C4) containing an acyloxyimino group can also be mentioned.

[Chemical Formula 50]

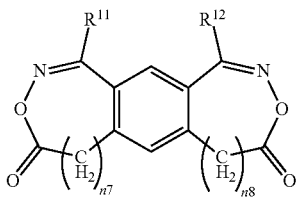
(C4-1)

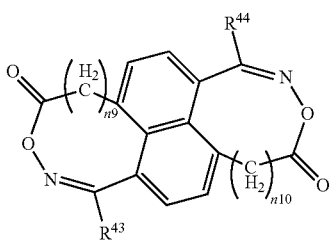
(C4-2)

In the formulae, $R^{11}$, $R^{12}$, $R^{43}$ and $R^{44}$ each independently represents a hydrogen atom or an alkyl group of 1 to 5 carbon atoms; and n7 to n10 each independently represents 0 to 3.

Furthermore, as the component (C), other than the above examples, any of the known photo-base generators used in conventional chemically amplified resist compositions can be used.

Examples of such photo-base generators include ion-type photo-base generators (anion-cation complexes); triphenylsulfonium compounds; triphenylmethanol; photoactive carbamates, such as benzylcarbamate and benzoin carbamate; amides, such as o-carbamoylhydroxylamide, o-carbamoyloxime, aromatic sulfoneamide, alphalactum and N-(2-allylethynyl)amide; oximeesters; α-aminoacetophenone; cobalt complexes; and those exemplified in Japanese Unexamined Patent Application, First Publication No. 2007-279493.

As the component (C), one type of organic compound may be used alone, or two or more types of organic compounds may be used in combination.

Among the above examples, as the component (C), a component (C1) is preferable, at least one member selected from the group consisting of compounds represented by the aforementioned general formula (C1-11) or (C1-12) is more preferable, and a compound represented by general formula (C1-12) is most preferable.

In the resist composition, the amount of the component (C), relative to 100 parts by weight of the component (A) is preferably from 0.05 to 50 parts by weight, more preferably from 1 to 30 parts by weight, and most preferably from 5 to 20 parts by weight.

When the amount of the component (C) is at least as large as the lower limit of the above-mentioned range, the film retentiveness of the resist film at exposed portions becomes excellent, and the resolution of the formed resist pattern is further improved. On the other hand, when the amount of the component (C) is no more than the upper limit of the above-mentioned range, the transparency of the resist film can be maintained.

Acid Supply Component; Component (Z)

In the present invention, in step (1) of the method of forming a resist pattern, a resist composition containing an "acid supply component" as a component which supplies acid to the resist film is used.

In the present invention, the "acid supply component" includes a component which itself exhibits acidity, i.e., a component which acts as a proton donor (hereafter, referred to as "acidic compound component" or "component (G)"); and a component which is decomposed by heat or light, so as to function as acid (hereafter, referred to as "acid generator component" or "component (B)").

Acidic Compound Component (G)

In the present invention, as the component (G), an acidic salt having an acid strength sufficient for increasing the solubility of the component (A) in an alkali developing solution (hereafter, referred to as "component (G1)") or an acid other than acid salts (acids which do not form a salt, acids which are not ionic; hereafter, referred to as "component (G2)").

An acid "has an acid strength sufficient for increasing the solubility of the base component (A) in an alkali developing solution" includes acid, for example, when a polymeric compound (A1) having a structural unit (a1) is used, by conducting baking (PEB) in step (3), the acid is capable of causing cleavage of at least part of the bond within the structure of the acid decomposable group in the structural unit (a1).

[Component (G1)]

Examples of the component (G1) include an ionic compound (salt compound) having a nitrogen-containing cation and a counteranion. The component (G1) itself exhibits acidity even in the form of a salt, and acts as a proton donor.

Hereafter, the cation moiety and the anion moiety of the component (G1) will be described.

(Cation Moiety of Component (G1))

The cation moiety of the component (G1) is not particularly limited as long as it contains a nitrogen atom. As a preferable example, a cation represented by general formula (G1c-1) shown below can be mentioned.

[Chemical Formula 51]

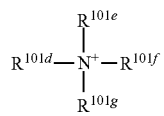
(G1c-1)

In the formula, $R^{101d}$, $R^{101e}$, $R^{101f}$ and $R^{101g}$ each independently represents a hydrogen atom, a linear, branched or cyclic alkyl group, an alkenyl group, an oxoalkyl group or an oxoalkenyl group of 1 to 12 carbon atoms, an aryl group or an arylalkyl group of 6 to 20 carbon atoms, an aralkyl group of 7 to 12 carbon atoms or an aryloxoalkyl group, and part or all of the hydrogen atoms of these groups may be substituted with a halogen atom, an alkoxy group or a sulfur atom. $R^{101d}$ and $R^{101e}$, or $R^{101d}$, $R^{101e}$ and $R^{101f}$ may be mutually bonded with the nitrogen atom to form a ring, provided that, when a ring is formed, each of $R^{101d}$ and $R^{101e}$, or each of $R^{101d}$, $R^{101e}$ and $R^{101f}$ independently represents an alkylene group of 3 to 10 carbon atoms, or forms a heterocyclic group containing the nitrogen atom in the ring thereof.

In formula (G1c-1), $R^{101d}$, $R^{101e}$, $R^{101f}$ and $R^{101g}$ independently represents a hydrogen atom, a linear, branched or cyclic alkyl group, an alkenyl group, an oxoalkyl group or an oxoalkenyl group of 1 to 12 carbon atoms, an aryl group or an arylalkyl group of 6 to 20 carbon atoms, an aralkyl group of 7 to 12 carbon atoms or an aryloxoalkyl group.

As the alkyl group for $R^{101d}$ to $R^{101g}$, the same alkyl groups as those described above for $R^1$ and $R^2$ can be mentioned, preferably has 1 to 10 carbon atoms, and a methyl group, an ethyl group, a propyl group or a butyl group is particularly desirable.

The alkenyl group for $R^{101d}$ to $R^{101g}$ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

The oxoalkyl group for $R^{101d}$ to $R^{101g}$ preferably has 2 to 10 carbon atoms, and examples thereof include a 2-oxoethyl group, a 2-oxopropyl group, a 2-oxocyclopentyl group and a 2-oxocyclohexyl group.

Examples of the oxoalkenyl group for $R^{101d}$ to $R^{101g}$ include an oxo-4-cyclohexenyl group and a 2-oxo-4-propenyl group.

As the aryl group for $R^{101d}$ to $R^{101g}$, the same aryl groups as those described above as the aromatic hydrocarbon group for $R^1$ and $R^2$ can be mentioned, and a phenyl group or a naphthyl group is preferable. Examples of the arylalkyl group include aryl groups in which one or more hydrogen atoms have been substituted with an alkyl group (preferably an alkyl group of 1 to 5 carbon atoms).

Examples of the aralkyl group and aryloxoalkyl group for $R^{101d}$ to $R^{101g}$ include a benzyl group, a phenylethyl group, a phenethyl group, a 2-phenyl-2-oxoethyl group, a 2-(1-naphthyl)-2-oxoethyl group and a 2-(2-naphthyl)-2-oxoethyl group.

The hydrogen atoms within the alkyl group, the alkenyl group, the oxoalkyl group, the oxoalkenyl group, the aryl group, the arylalkyl group, the aralkyl group and the aryloxoalkyl group for $R^{101d}$ to $R^{101g}$ may or may not be substituted with a halogen atom such as a fluorine atom, an alkoxy group or a sulfur atom.

When $R^{101d}$ to $R^{101g}$ are constituted of only a combination of alkyl groups and hydrogen atoms, in terms of storage stability and lithography properties, it is preferable that part of the hydrogen atoms of the alkyl group is substituted with a halogen atom such as a fluorine atom, an alkoxy group or a sulfur atom.

Further, $R^{101d}$ and $R^{101e}$, or $R^{101d}$, $R^{101e}$ and $R^{101f}$ may be mutually bonded to form a ring with the nitrogen atom. Examples of the formed ring include a piperidine ring, a hexamethylene imine ring, an azole ring, a pyridine ring, a pyrimidine ring, an azepine ring, a pyrazine ring, a quinoline ring and a benzoquinoline ring.

Further, the ring may contain an oxygen atom in the ring skeleton thereof, and specific examples of preferable rings which contain an oxygen atom include an oxazole ring and an isooxazole ring.

Among these examples, as the cation moiety represented by the aforementioned formula (G1c-1), a nitrogen-containing cation having a pKa of 7 or less is preferable.

In the present invention, pKa refers to an acid dissociation constant which is generally used as a parameter which shows the acid strength of an objective substance. The pKa value of the cation of the component (G1) can be determined by a conventional method. Alternatively, the pKa value can be estimated by calculation using a conventional software such as "ACD/Labs" (trade name; manufactured by Advanced Chemistry Development, Inc.).

The pKa of the component (G1) is preferably 7 or less, and the "acid salt" can be appropriately selected depending on the type and pKa of the counteranion, so that is becomes a weak base relative to the counteranion. Specifically, the pKa of the cation of the "acid salt" is preferably from −2 to 7, more preferably from −1 to 6.5, and still more preferably 0 to 6. When the pKa is no more than the upper limit of the above-mentioned range, the basicity of the cation can be rendered satisfactorily weak, and the component (G1) itself becomes an acidic compound. Further, when the pKa is at least as large as the lower limit of the above-mentioned range, a salt can be more reliably formed with the counteranion, and it becomes possible to appropriately control the acidity of the component (G1), thereby preventing deterioration of the storage stability caused by the component (G1) being excessively acidic.

As a cation which satisfies the above pKa, a cation represented by any one of the following general formulae (G1c-11) to (G1c-13) is particularly desirable.

[Chemical Formula 52]

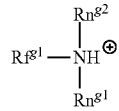

(G1c-11)

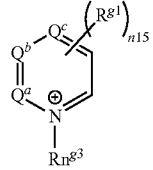

(G1c-12)

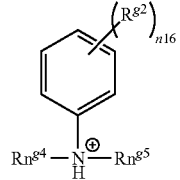

(G1c-13)

In the formulae, $Rf^{g1}$ represents a fluorinated alkyl group of 1 to 12 carbon atoms; $Rn^{g1}$ and $Rn^{g2}$ each independently represents a hydrogen atom or an alkyl group of 1 to 5 carbon atoms, provided that $Rn^{g1}$ and $R^{g2}$ may be mutually bonded to form a ring; $Q^a$ to $Q^c$ each independently represents a carbon atom or a nitrogen atom; $Rn^{g3}$ represents a hydrogen atom or a methyl group; $Rn^{g4}$ and $Rn^{g5}$ each independently represents an alkyl group of 1 to 5 carbon atoms or an aromatic hydrocarbon group; $R^{g1}$ and $R^{g2}$ each independently represents a hydrocarbon group; and n15 and n16 each independently represents an integer of 0 to 4, provided that, when n15 and n16 is 2 or more, the plurality of $R^{g1}$ and $R^{g2}$ which substitute the hydrogen atoms of the adjacent carbon atom may be bonded to form a ring.

In formula (G1c-11), $Rf^{g1}$ represents a fluorinated alkyl group of 1 to 12 carbon atoms, and is preferably a fluorinated alkyl group of 1 to 5 carbon atoms in which 50% or more of the hydrogen atoms of the alkyl group have been fluorinated.

In formula (G1c-13), $Rn^{g4}$ and $Rn^{g5}$ each independently represents an alkyl group of 1 to 5 carbon atoms or an aromatic hydrocarbon group, and is the same as defined for the alkyl group of 1 to 5 carbon atoms and aryl groups as those described above in the explanation of $R^{101d}$, $R^{101e}$, $R^{101f}$ and $R^{101g}$ in formula (G1c-1).

In formulae (G1c-12) and (G1c-13), n15 and n16 each independently represents an integer of 0 to 4, preferably an integer of 0 to 2, and more preferably 0.

In formulae (G1c-12) and (G1c-13), $R^{g1}$ and $R^{g2}$ each independently represents a hydrocarbon group, and is preferably an alkyl group or alkenyl group of 1 to 12 carbon atoms. The alkyl group and the alkenyl group are the same as defined for those described in the explanation of formula (G1c-1).

When n15 and n16 are 2 or more, the plurality of $R^{g1}$ and $R^{g2}$ may be the same or different from each other. Further, when n15 and n16 is 2 or more, the plurality of $R^{g1}$ and $R^{g2}$ which substitute the hydrogen atoms of the adjacent carbon atom may be bonded to form a ring. Examples of the formed ring include a benzene ring and a naphthalene ring. That is, the compound represented by formula (G1c-12) or (G1c-13) may be a condensed ring compound formed by condensation of 2 or more rings.

Specific examples of compounds represented by any one of the aforementioned formulae (G1c-11) to (G1c-13) are shown below.

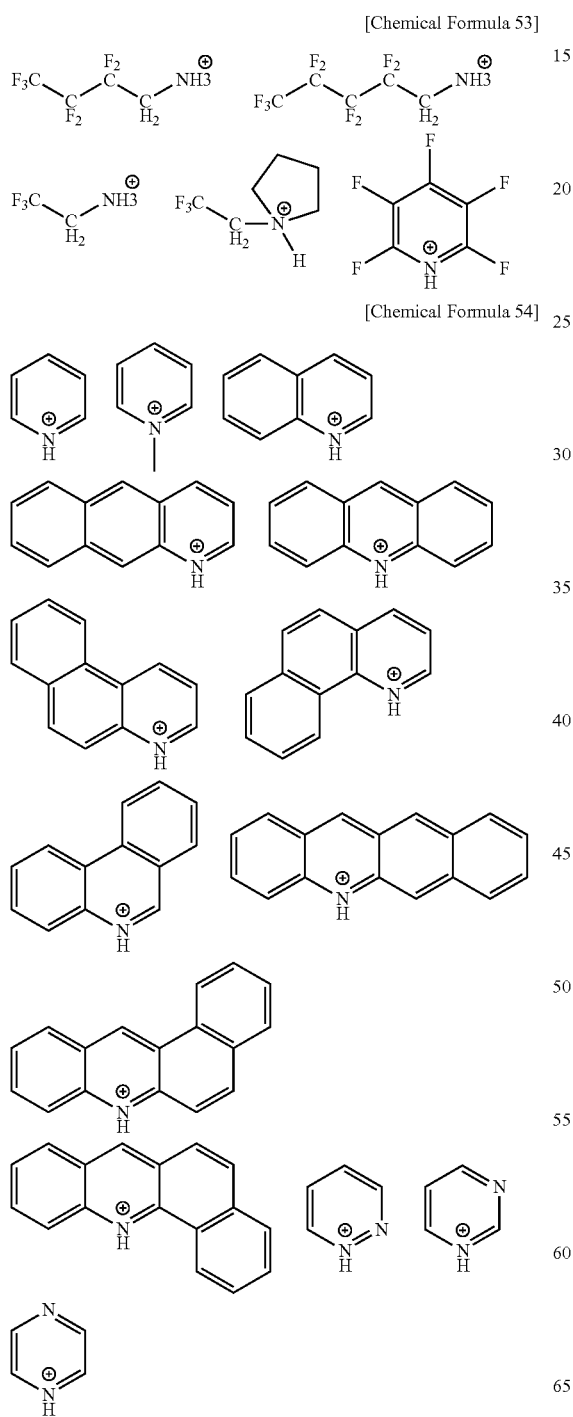

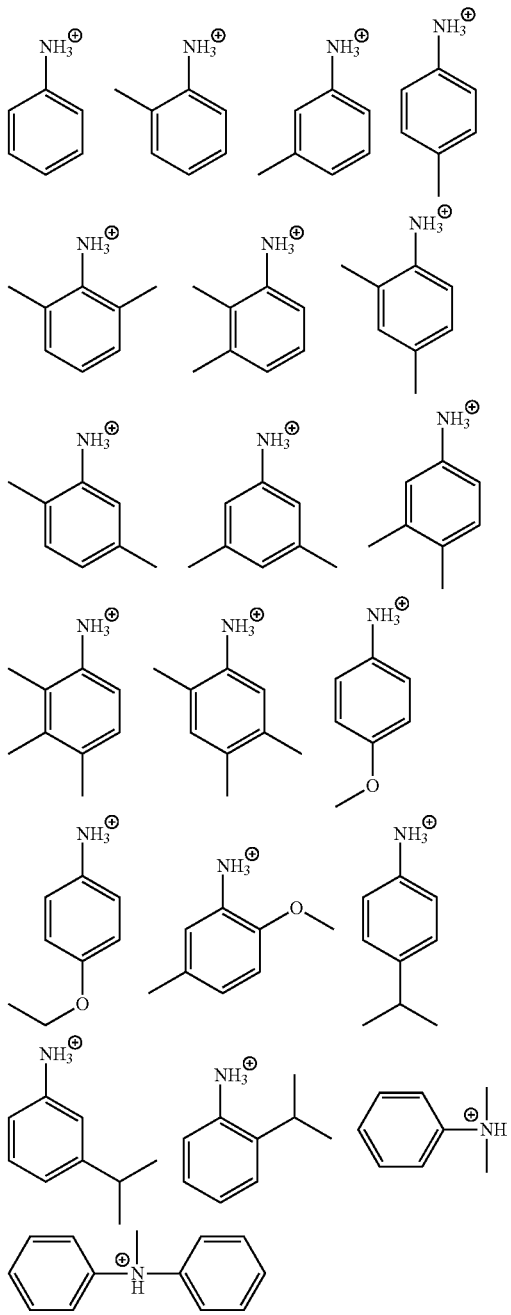

(Anion Moiety of Component (G1))

The anion moiety of the component (G1) is not particularly limited, and any of those generally used the anion moiety of a salt used in a resist composition may be appropriately selected for use.

Among these, as the anion moiety of the component (G1), those which forms a salt with the aforementioned cation moiety for the component (G1) to form a component (G1) that is capable of increasing the solubility of the component (A) in an alkali developing solution is preferable.

The acid salt "capable of increasing the solubility of the component (A) in an alkali developing solution" refers to an acid salt, for example, when a component (A1) having a structural unit (a1) is used, by conducting baking in the aforementioned step (3), the acid salt is capable of causing cleavage of at least part of the bond within the structure of the acid decomposable group in the structural unit (a1).

That is, the anion moiety of the component (G1) preferably has a strong acidity. Specifically, the pKa of the anion moiety is more preferably 0 or less, still more preferably −15 to −1, and most preferably −13 to −3. When the pKa of the anion moiety is no more than 0, the acidity of the anion can be rendered satisfactorily strong relative to a cation having a pKa of 7 or less, and the component (G1) itself becomes an acidic compound. On the other hand, when the pKa of the anion moiety is −15 or more, deterioration of the storage stability caused by the component (G1) being excessively acidic can be prevented.

As the anion moiety of the component (G1), an anion moiety having at least one anion group selected from a sulfonate anion, a carboxylate anion, a sulfonylimide anion, a bis(alkylsulfonyl)imide anion and a tris(alkylsulfonyl)methide anion is preferable.

Specific examples include anions represented by general formula: "$R^{4"}SO_3^-$ ($R^{4"}$ represents a linear, branched or cyclic alkyl group which may have a substituent, a halogenated alkyl group, an aryl group or an alkenyl group)".

In the aforementioned general formula "$R^{4"}SO_3^-$, $R^{4"}$" represents a linear, branched or cyclic alkyl group which may have a substituent, a halogenated alkyl group, an aryl group or an alkenyl group.

The linear or branched alkyl group for the aforementioned $R^{4"}$ preferably has 1 to 10 carbon atoms, more preferably 1 to 8, and most preferably 1 to 4.

The cyclic alkyl group for the aforementioned $R^{4"}$ preferably has 4 to 15 carbon atoms, more preferably 4 to 10 carbon atoms, and most preferably 6 to 10 carbon atoms.

When $R^{4"}$ represents an alkyl group, examples of "$R^{4"}SO_3^-$" include alkylsulfonates, such as methanesulfonate, n-propanesulfonate, n-butanesulfonate, n-octanesulfonate, 1-adamantanesulfonate, 2-norbornanesulfonate and d-camphor-10-sulfonate.

The halogenated alkyl group for the aforementioned $R^{4"}$ is an alkyl group in which part or all of the hydrogen atoms thereof have been substituted with a halogen atom. The alkyl group preferably has 1 to 5 carbon atoms, and is preferably a linear or branched alkyl group, and more preferably a methyl group, an ethyl group, a propyl group, an isopropyl group, an n-butyl group, a tert-butyl group, a tert-pentyl group or an isopentyl group. Examples of the halogen atom which substitutes the hydrogen atoms include a fluorine atom, a chlorine atom, an iodine atom and a bromine atom.

In the halogenated alkyl group, it is preferable that 50 to 100% of all hydrogen atoms within the alkyl group (prior to halogenation) have been substituted with a halogen atom, and it is preferable that all hydrogen atoms have been substituted with a halogen atom.

As the halogenated alkyl group, a fluorinated alkyl group is preferable. The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group is preferably from 10 to 100%, more preferably from 50 to 100%, and it is most preferable that all hydrogen atoms are substituted with fluorine atoms because the acid strength increases.

Specific examples of such fluorinated alkyl groups include a trifluoromethyl group, a heptafluoro-n-propyl group and a nonafluoro-n-butyl group.

The aryl group for $R^{4"}$ is preferably an aryl group of 6 to 20 carbon atoms.

The alkenyl group for $R^{4"}$ is preferably an alkenyl group of 2 to 10 carbon atoms.

With respect to $R^{4"}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4"}$ may have one substituent, or two or more substituents.

Examples of the substituent include a halogen atom, a hetero atom, an alkyl group, and a group represented by the formula $X^3$-Q'- (in the formula, Q' represents a divalent linking group containing an oxygen atom; and $X^3$ represents a hydrocarbon group of 3 to 30 carbon atoms which may have a substituent).

Examples of halogen atoms and alkyl groups include the same halogen atoms and alkyl groups as those described above with respect to the halogenated alkyl group for $R^{4"}$.

Examples of hetero atoms include an oxygen atom, a nitrogen atom, and a sulfur atom.

In the group represented by formula $X^3$-Q'-, Q' represents a divalent linking group containing an oxygen atom.

Q' may contain an atom other than an oxygen atom. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—SO$_2$—) bonded thereto.

Specific examples of such combinations include —$R^{91}$—O—, —$R^{92}$—O—C(=O)—, —C(=O)—O—$R^{93}$—O—C(=O)—, —SO$_2$—O—$R^{94}$—O—C(=O)—, and —$R^{95}$—SO$_2$—O—$R^{94}$—O—C(=O)— (in the formula, $R^{91}$ to $R^{95}$ independently represents an alkylene group).

The alkylene group for $R^{91}$ to $R^{95}$ is preferably a linear or branched alkylene group, and preferably has 1 to 12 carbon atoms, more preferably 1 to 5, and most preferably 1 to 3.

Specific examples of alkylene groups include a methylene group [—CH$_2$-], alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$-]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$-].

As Q', a divalent linking group containing an ester bond or an ether bond is preferable, and —$R^{91}$—O—, —$R^{92}$—O—C(=O)— or —C(=O)—O—$R^{93}$—O—C(=O)— is more preferable.

In the group represented by the formula: $X^3$-Q'-, the hydrocarbon group for $X^3$ is the same as the hydrocarbon groups of 1 to 30 carbon atoms for $R^a$ in the aforementioned formula (C3).

Among these, as $X^3$, a linear alkyl group which may have a substituent, or a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, or any one of groups represented by the aforementioned formulae (L2) to (L6), (S3) and (S4) are preferable.

Among these examples, as the aforementioned $R^{4'''}$, a halogenated alkyl group or a group having $X^3$-$Q'$- as a substituent is preferable.

When the $R^{4'''}$ group has $X^3$-$Q'$- as a substituent, as $R^{4'''}$, a group represented by the formula: $X^3$-$Q'$-$Y^3$— (in the formula, $Q'$ and $X^3$ are the same as defined above, and $Y^3$ represents an alkylene group of 1 to 4 carbon atoms which may have a substituent or a fluorinated alkylene group of 1 to 4 carbon atoms which may have a substituent is preferable.

In the group represented by the formula $X^3$-$Q'$-$Y^3$—, as the alkylene group for $Y^3$, the same alkylene group as those described above for $Q'$ in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^3$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —$CHF$—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)$ $CH_2CH_2$—, —$CH_2CH(CH_3)CH_2$—, —$CH(CH_3)CH$ $(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^3$ is preferably a fluorinated alkylene group, and most preferably a fluorinated alkylene group in which the carbon atom bonded to the adjacent sulfur atom is fluorinated. Examples of such fluorinated alkylene groups include —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF$ $(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

Specific examples of groups represented by formula $R^{4'''}SO_3^-$ in which $R^{4'''}$ represents $X_3^{Q'-Y-3}$ include anions represented by the following formulae (b1) to (b9).

[Chemical Formula 56]

(b1)

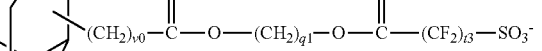

(b2)

(b3)

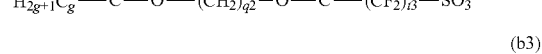

(b4)

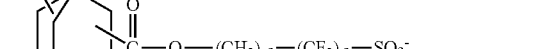

(b5)

[Chemical Formula 57]

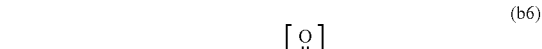

(b6)

(b7)

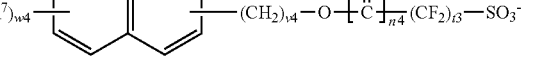

(b8)

-continued

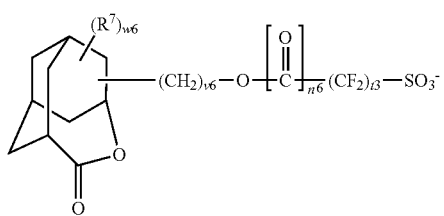

(b9)

In the formulae, q1 and q2 each independently represents an integer of 1 to 5; q3 represents an integer of 1 to 12; t3 represents an integer of 1 to 3; r1 and r2 each independently represents an integer of 0 to 3; g represents an integer of 1 to 20; $R^7$ represents a substituent; n1 to n6 each independently represents 0 or 1; v0 to v6 each independently represents an integer of 0 to 3; w1 to w6 each independently represents an integer of 0 to 3; and Q" is the same as defined above.

As the substituent for $R^7$, the same groups as those which the aforementioned aliphatic hydrocarbon group or aromatic hydrocarbon group for $R^a$ in the aforementioned formula (C3) may have as a substituent can be used.

If there are two or more of the $R^7$ group, as indicated by the values r1, r2, and w1 to w6, then the two or more of the $R^7$ groups may be the same or different from each other.

Further, as preferable examples of the anion moiety of the component (G1), an anion represented by general formula (G1a-3) shown below and an anion moiety represented by general formula (G1a-4) shown below can also be mentioned.

[Chemical Formula 58]

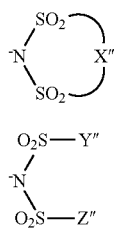

(G1a-3)

(G1a-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

In formula (G1a-3), X" represents a linear or branched alkylene group in which at least one hydrogen atom has been substituted with a fluorine atom, and the alkylene group preferably has 2 to 6 carbon atoms, more preferably 3 to 5 carbon atoms, and most preferably 3 carbon atoms.

In formula (G1a-4), each of Y" and Z" independently represents a linear or branched alkyl group in which at least one hydrogen atom has been substituted with a fluorine atom, and the alkyl group preferably has 1 to 10 carbon atoms, more preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

As the anion moiety of the component (G1), an anion represented by the aforementioned formula "$R^{4"}SO_3^-$" (in particular, any one of anions represented by the aforementioned formulae (b1) to (b9) which is a group in which $R^{4"}$ is "$X^3$-Q'-$Y^3$-") or an anion represented by the aforementioned formula (G1a-3) is most preferable.

As the component (G1), one type of compound may be used alone, or two or more types may be used in combination.

In the resist composition, the amount of the component (G1) within the component (G) is preferably 40% by weight or more, still more preferably 70% by weight or more, and may be even 100% by weight. When the amount of the component (G1) is at least as large as the lower limit of the above-mentioned range, the storage stability and the lithography properties become excellent.

In the resist composition, the amount of the component (G1), relative to 100 parts by weight of the component (A) is preferably from 0.5 to 30 parts by weight, more preferably from 1 to 20 parts by weight, and most preferably from 2 to 15 parts by weight. When the amount of the component (G1) is within the above-mentioned range, the lithography properties become excellent.

[Component (G2)]

The component (G2) is a component which does not fall under the definition of the component (G1), and the component (G2) itself exhibits acidity, so as to act as a proton donor. Examples of the component (G2) include a non-ionic acid which does not form a salt.

As the component (G2), there is no particular limitation as long as it is an acid exhibiting an acid strength sufficient for increasing the solubility of the base component (A) in an alkali developing solution. As the component (G2), in terms of the reactivity with the acid dissociable group of the base component and ease in increasing the solubility of the resist film in an alkali developing solution, an imine acid or a sulfonic acid compound is preferable, and examples thereof include sulfonylimide, bis(alkylsulfonyl)imide, tris(alkylsulfonyl)methide, and any of these compounds which have a fluorine atom.

In particular, a compound represented by any one of general formulae (G2-1) to (G2-3) shown below (preferably a compound represented by general formula (G2-2)), a compound in which an anion represented by any one of general formulae (b1) to (b8) described above has "—$SO_3^-$" replaced by "—$SO_3H$", a compound in which an anion represented by general formula (G1a-3) or (G1a-4) described above has "$N^-$" replaced by "NH", and camphorsulfonic acid are preferable. Other examples include acid components such as a fluorinated alkyl group-containing carboxylic acid, a higher fatty acid, a higher alkylsulfonic acid, and a higher alkylarylsulfonic acid.

[Chemical Formula 59]

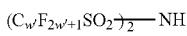
(G2-1)

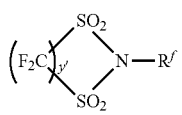
(G2-2)

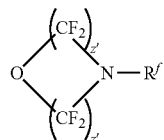
(G2-3)

In formula (G2-1), w' represents an integer of 1 to 5. In formula (G2-2), $R^f$ represents a hydrogen atom or an alkyl group (provided that part or all of the hydrogen atoms within the alkyl group may be substituted with a fluorine atom, a hydroxy group, an alkoxy group, a carboxy group or an amino group); and y' represents 2 or 3. In formula (G2-3), $R^f$ is the same as defined above; and z' represents 2 or 3.

Examples of compounds represented by the aforementioned formula (G2-1) include $(C_4F_9SO_2)_2NH$ and $(C_3F_7SO_2)_2NH$.

In the aforementioned formula (G2-2), the alkyl group for $R^f$ preferably has 1 or 2 carbon atoms, and more preferably 1.

Examples of the alkoxy group which may substitute the hydrogen atom(s) within the alkyl group include a methoxy group and an ethoxy group.

Examples of a compound represented by the aforementioned formula (G2-2) include a compound represented by a chemical formula (G2-21) shown below.

[Chemical Formula 60]

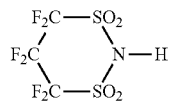
(G2-21)

In the aforementioned formula (G2-3), $R^1$ is the same as defined for $R^f$ in formula (G2-2).

Examples of a compound represented by the aforementioned formula (G2-3) include a compound represented by a chemical formula (G2-31) shown below.

[Chemical Formula 61]

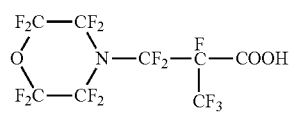
(G2-31)

As the fluorinated alkyl group-containing carboxylic group, for example, $C_{10}F_{21}COOH$ can be mentioned.

Examples of the higher fatty acid include higher fatty acids having an alkyl group of 8 to 20 carbon atoms, and specific examples thereof include dodecanoic acid, tetradecanoic acid, and stearic acid.

The alkyl group of 8 to 20 carbon atoms may be either linear or branched. Further, the alkyl group of 8 to 20 carbon atoms may have a phenylene group, an oxygen atom or the like interposed within the chain thereof. Furthermore, the alkyl group of 8 to 20 carbon atoms may have part of the hydrogen atoms substituted with a hydroxy group or a carboxy group.

Examples of the higher alkylsulfonic acid include sulfonic acids having an alkyl group preferably with an average of 9 to 21 carbon atoms, more preferably 12 to 18 carbon atoms, and specific examples thereof include decanesulfonic acid, dodecanesulfonic acid, tetradecanesulfonic acid, tetradecanesulfonic acid, pentadecanesulfonic acid and octadecanesulfonic acid.

Examples of the higher alkylarylsulfonic acid include alkylbenzenesulfonic acids and alkylnaphthalenesulfonic acids having an alkyl group preferably with an average of 6 to 18 carbon atoms, more preferably 9 to 15 carbon atoms, and specific examples thereof include dodecylbenzenesulfonic acid and decylnaphthalenesulfonic acid.

Examples of the acid components include alkyldiphenyletherdisulfonic acids preferably with an average of 6 to 18 carbon atoms, more preferably 9 to 15, and preferable examples thereof include dodecyldiphenyletherdisulfonic acid.

Examples of the component (G2) other than those described above include organic carboxylic acid, a phosphorus oxo acid or derivative thereof.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

When the component (G) includes a component (G2), as the component (G2), one type of compound may be used, or two or more types may be used in combination. Among these, as the component (G2), at least one member selected from the group consisting of sulfonylimide, bis(alkylsulfonyl)imide, tris(alkylsulfonyl)methide and any of these compounds having a fluorine atom is preferable, and it is most preferable to use at least one of these compounds having a fluorine atom.

Further, when the resist composition contains the component (G2), the amount of the component (G2) relative to 100 parts by weight of the component (A) is preferably within a range from 0.5 to 20 parts by weight, more preferably from 1 to 15 parts by weight, and still more preferably from 1 to 10 parts by weight. When the amount of the component (G2) is at least as large as the lower limit of the above-mentioned range, the solubility of the resist film in an alkali developing solution is likely to be increased. On the other hand, when the amount of the component (G2) is no more than the upper limit of the above-mentioned range, an excellent sensitivity can be obtained.

Acid Generator Component; Component (B)

In the present invention, as the acid supply component (Z), an acid generator component (hereafter, sometimes referred to as "component (B)") which is decomposed by heat or exposure, so as to function as acid can also be used.

Differing from the component (G), the component (B) generates acid upon exposure in step (2) and upon baking (PEB) in step (3). The component (B) itself does not need to exhibit acidity.

As the component (B), there is no particular limitation, and any of the known acid generators used in conventional chemically amplified resist compositions can be used.

As the acid generator, a thermal acid generator which generates acid upon heating and a photoacid generator which generates acid upon exposure can be mentioned. Examples of such acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

These acid generator components are generally known as photoacid generators (PAG), but also function as thermal acid generators (TAG). Therefore, the acid generator component usable in the present invention can be appropriately selected from those which have been conventionally known as acid generators for chemically amplified resist compositions.

A "thermal acid generator which generates acid upon heating" refers to a component which generates acid upon heating preferably at a PEB temperature or lower in step (3), i.e., 200° C. or lower, and more preferably at 50 to 150° C. By selecting a component which generates acid with a heating temperature of PEB temperature or lower, the operations becomes easy. Further, it becomes possible to control the generation of acid from the thermal acid generator and the deprotection reaction of the base component at different temperatures. More preferably, by selecting a component which generates acid at 50° C. or higher, the stability in the resist composition becomes excellent.

As the onium salt acid generator for the component (B), those in which have at least one anion group selected from a sulfonate anion, a carboxylate anion, a sulfonylimide anion, a bis(alkylsulfonyl)imide anion and a tris(alkylsulfonyl)methide anion within the anion moiety is preferable. More specifically, the same anion moieties as those described above for the component (G1) can be mentioned.

Further, as the cation moiety, a cation moiety represented by general formula (b-c1) or (b-c2) shown below is preferable.

[Chemical Formula 62]

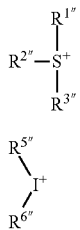

In the formulae, $R^{1\prime\prime}$ to $R^{3\prime\prime}$, $R^{5\prime\prime}$ and $R^{6\prime\prime}$ each independently represents an aryl group which may have a substituent, an alkyl group which may have a substituent or an alkenyl group which may have a substituent, provided that, in formula (b-c1), two of $R^{1\prime\prime}$ to $R^{3\prime\prime}$ may be mutually bonded to form a ring with the sulfur atom; and $R^{4\prime\prime}$ represents an alkyl group which may have a substituent, a halogenated alkyl group which may have a substituent, an aryl group which may have a substituent or an alkenyl group which may have a substituent.

In formula (b-c1), $R^{1\prime\prime}$ to $R^{3\prime\prime}$ each independently represents an aryl group which may have a substituent or an alkyl group which may have a substituent. Two of $R^{1\prime\prime}$ to $R^{3\prime\prime}$ may be mutually bonded to form a ring with the sulfur atom.

Examples of the aryl group for $R^{1\prime\prime}$ to $R^{3\prime\prime}$ include an unsubstituted aryl group of 6 to 20 carbon atoms; a substituted aryl group in which part or all of the hydrogen atoms of the aforementioned unsubstituted aryl group has been substituted with an alkyl group, an alkoxy group, a halogen atom, a hydroxy group, an oxo group (=O), an aryl group, an alkoxyalkyloxy group, an alkoxycarbonylalkyloxy group, —C(=O)—O—$R^{6\prime}$, —O—C(=O)—$R^{7\prime}$ or —O—$R^{8\prime}$. Each of $R^{6\prime}$, $R^{7\prime}$ and $R^{8\prime}$ independently represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms.

The unsubstituted aryl group for $R^{1\prime\prime}$ to $R^{3\prime\prime}$ is preferably an aryl group having 6 to 10 carbon atoms because it can be synthesized at a low cost. Specific examples thereof include a phenyl group and a naphthyl group.

The alkyl group as the substituent for the substituted aryl group represented by $R^{1\prime\prime}$ to $R^{3\prime\prime}$ is preferably an alkyl group having 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

As the aryl group as the substituent for the substituted aryl group, the same aryl groups as those described for $R^{1\prime\prime}$ to $R^{3\prime\prime}$ can be mentioned.

Examples of alkoxyalkyloxy groups as the substituent for the substituted aryl group include groups represented by a general formula shown below:

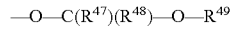

—O—C($R^{47}$)($R^{48}$)—O—$R^{49}$

In the formula, $R^{47}$ and $R^{48}$ each independently represents a hydrogen atom or a linear or branched alkyl group; and $R^{49}$ represents an alkyl group.

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below:

—O—$R^{50}$—C(=O)—O—$R^{56}$

In the formula, $R^{50}$ represents a linear or branched alkylene group, and $R^{56}$ represents a tertiary alkyl group.

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

Examples of the tertiary alkyl group for $R^{56}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methyl ethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which $R^{56}$ in the group represented by the aforementioned general formula: —O—$R^{50}$—C(=O)—O—$R^{56}$ has been substituted with $R^{56'}$ can also be mentioned. $R^{56'}$ represents a hydrogen atom, an alkyl group, a fluorinated alkyl group or an aliphatic cyclic group which may contain a hetero atom.

The alkyl group for $R^{56'}$ is the same as defined for the alkyl group for the aforementioned $R^{49}$.

Examples of the fluorinated alkyl group for $R^{56'}$ include groups in which part or all of the hydrogen atoms within the alkyl group for $R^{49}$ has been substituted with a fluorine atom.

Examples of the aliphatic cyclic group for $R^{56'}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

As an aliphatic cyclic group for $R^{56'}$ which does not contain a hetero atom, a group in which one or more hydrogen atoms have been removed from a monocycloalkane or a polycycloalkane such as a bicycloalkane, a tricycloalkane or a tetracycloalkane can be mentioned. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include groups represented by the aforementioned formulae (L1) to (L6) and (S1) to (S4).

As the aliphatic cyclic group for $R^{56'}$ in which a hydrogen atom has been substituted with a hetero atom, an aliphatic cyclic group in which a hydrogen atom has been substituted with an oxygen atom (=O) can be mentioned.

In formulae —C(=O)—O—$R^{6'}$, —O—C(=O)—$R^{7'}$ and —O—$R^{8'}$, $R^{6'}$, $R^{7'}$ and $R^{8'}$ each independently represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms.

The linear or branched, saturated hydrocarbon group preferably has 1 to 25 carbon atoms, more preferably 1 to 15, and still more preferably 4 to 10.

Examples of the linear, saturated hydrocarbon group include a methyl group, an ethyl group, a propyl group, a butyl group, a pentyl group, a hexyl group, a heptyl group, an octyl group, a nonyl group and a decyl group.

Examples of the branched, saturated hydrocarbon group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group, but excluding tertiary alkyl groups.

The linear or branched, saturated hydrocarbon group may have a substituent. Examples of the substituent include an alkoxy group, a halogen atom, a halogenated alkyl group, a hydroxyl group, an oxygen atom (=O), a cyano group and a carboxy group.

The alkoxy group as the substituent for the linear or branched saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched, saturated alkyl group include a fluorine atom, a chlorine atom, a bromine atom and an iodine atom, and a fluorine atom is preferable.

Example of the halogenated alkyl group as the substituent for the linear or branched, saturated hydrocarbon group includes a group in which part or all of the hydrogen atoms within the aforementioned linear or branched, saturated hydrocarbon group have been substituted with the aforementioned halogen atoms.

The cyclic saturated hydrocarbon group of 3 to 20 carbon atoms for $R^{6'}$, $R^{7'}$ and $R^{8'}$ may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

The cyclic, saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one hydrogen atom has been removed therefrom, can be used. Further, the ring may contain an ester bond (—C(=O)—O—). More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituent groups as those for the aforementioned linear or branched alkyl group, or a lower alkyl group can be used.

Alternatively, $R^{6\prime}$, $R^{7\prime}$ and $R^{8\prime}$ may be a combination of a linear or branched alkyl group and a cyclic group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the linear aliphatic unsaturated hydrocarbon group for $R^{6\prime}$, $R^{7\prime}$ and $R^{8\prime}$ include a vinyl group, a propenyl group (an allyl group) and a butynyl group.

Examples of the branched aliphatic unsaturated hydrocarbon group for $R^{6\prime}$, $R^{7}$, and $R^{8\prime}$ include a 1-methylpropenyl group and a 2-methylpropenyl group.

The aforementioned linear or branched, aliphatic unsaturated hydrocarbon group may have a substituent. Examples of substituents include the same substituents as those which the aforementioned linear or branched alkyl group may have.

Among the aforementioned examples, as $R^{7\prime}$ and $R^{8\prime}$, in terms of improvement in lithography properties and shape of the resist pattern, a linear or branched, saturated hydrocarbon group of 1 to 15 carbon atoms or a cyclic saturated hydrocarbon group of 3 to 20 carbon atoms is preferable.

Examples of the alkyl group for $R^{1\prime\prime\prime}$ to $R^{3\prime\prime\prime}$ include linear, branched or cyclic alkyl groups of 1 to 10 carbon atoms. Among these, alkyl groups of 1 to 5 carbon atoms are preferable as the resolution becomes excellent. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkenyl group for $R^{1\prime\prime\prime}$ to $R^{3\prime\prime\prime}$ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

When two of $R^{1\prime\prime\prime}$ to $R^{3\prime\prime\prime}$ are bonded to each other to form a ring with the sulfur atom, it is preferable that the two of $R^{1\prime\prime\prime}$ to $R^{3\prime\prime\prime}$ form a 3 to 10-membered ring including the sulfur atom, and it is particularly desirable that the two of $R^{1\prime\prime\prime}$ to $R^{3\prime\prime\prime}$ form a 5 to 7-membered ring including the sulfur atom.

Preferable examples of the cation moiety of the compound represented by the aforementioned formula (b-c1) are shown below.

[Chemical Formula 63]

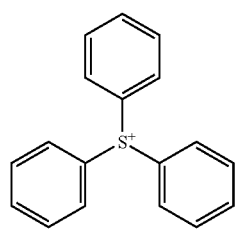

(b-1-1)

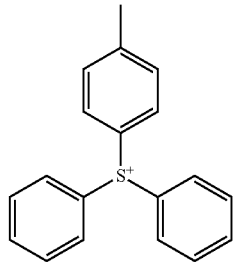

(b-1-2)

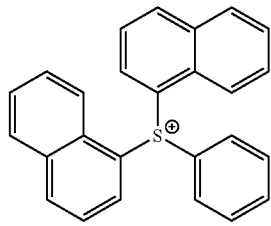

(b-1-3)

[Chemical Formula 64]

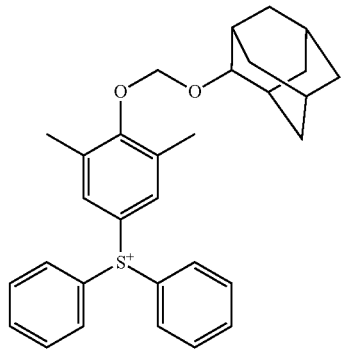

(b-1-4)

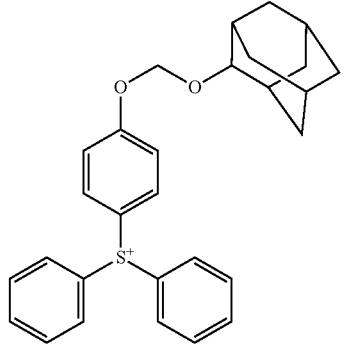

(b-1-5)

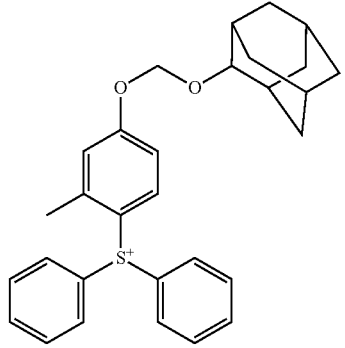

(b-1-6)

[Chemical Formula 65]
(b-1-7)
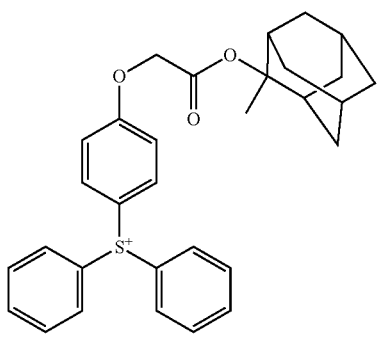
(b-1-8)
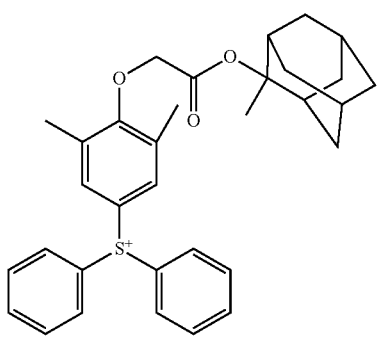
(b-1-9)
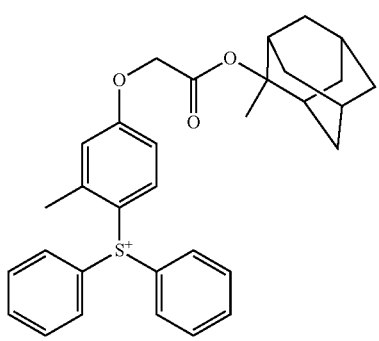
[Chemical Formula 66]
(b-1-10)
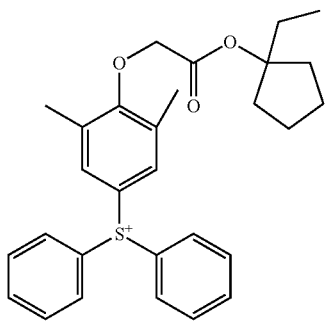
(b-1-11)
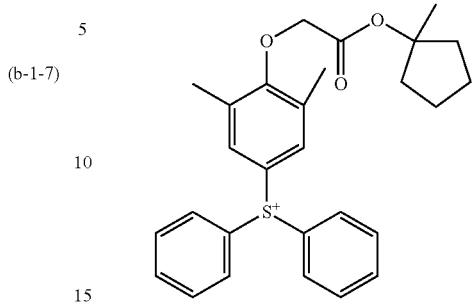
(b-1-12)
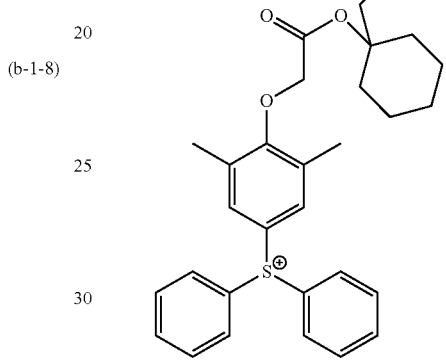
(b-1-13)
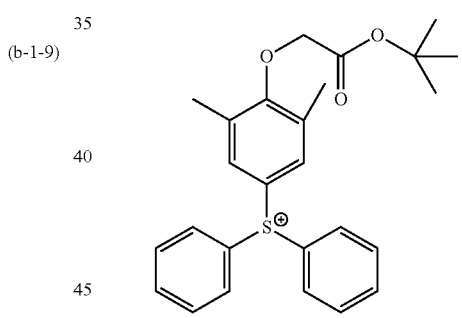
[Chemical Formula 67]
(b-1-14)
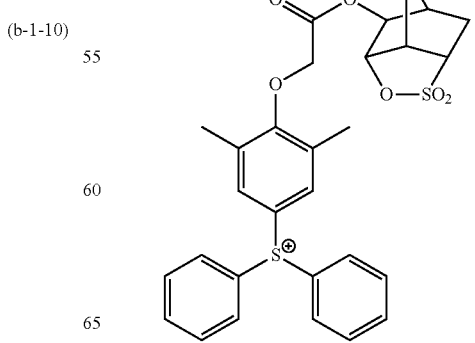

(b-1-15)
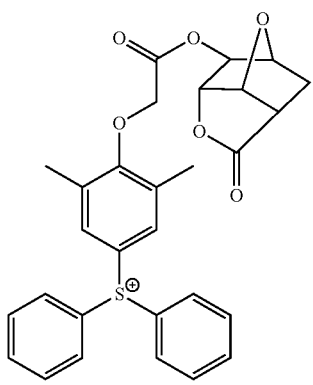
(b-1-16)
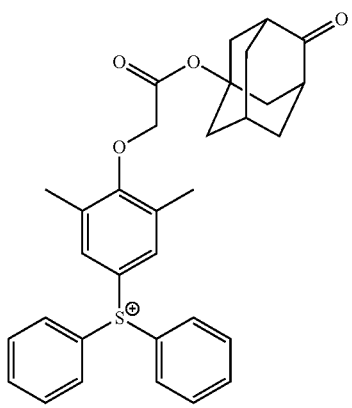
[Chemical Formula 68]
(b-1-17)
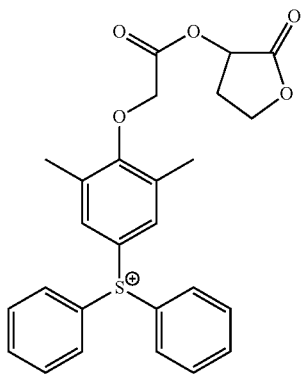
(b-1-18)
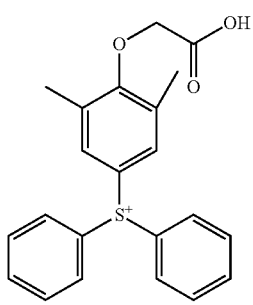
(b-1-19)
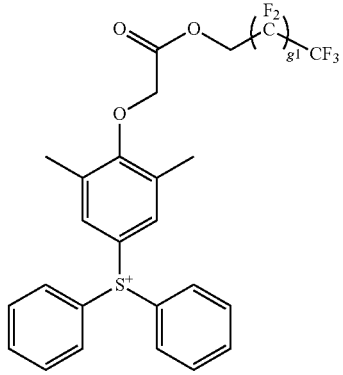
In the formula, g1 represents a recurring number, and is an integer of 1 to 5.
[Chemical Formula 69]
(b-1-20)
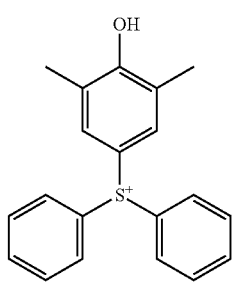
(b-1-21)
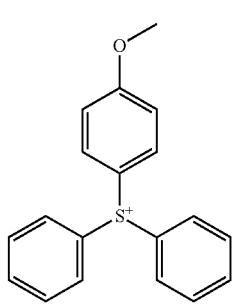
(b-1-22)
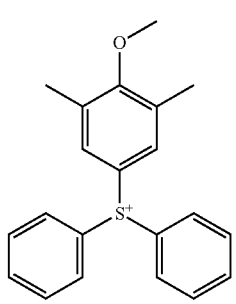

-continued
[Chemical Formula 70]
(b-1-23)
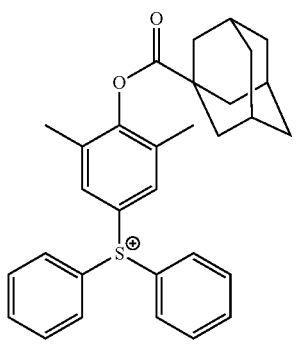
(b-1-24)
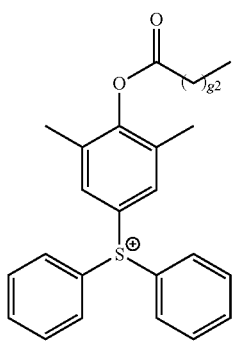
(b-1-25)
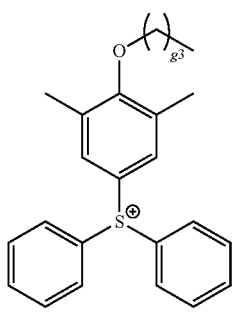
In the formula, g2 and g3 represent recurring numbers, wherein g2 is an integer of 0 to 20, and g3 is an integer of 0 to 20.
[Chemical Formula 71]
(b-1-26)
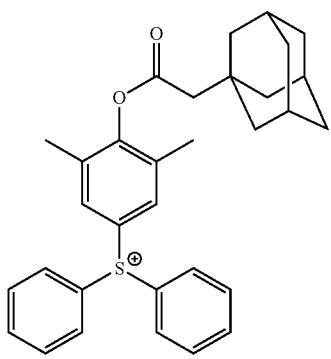
-continued
(b-1-27)
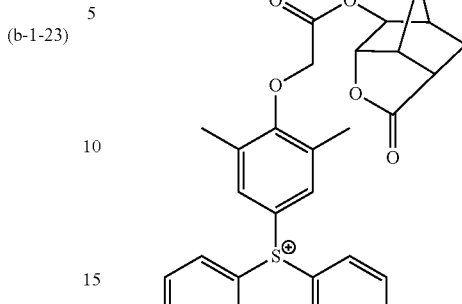
(b-1-28)
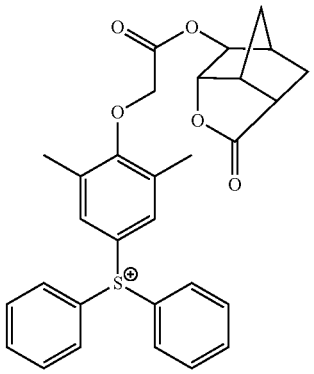
[Chemical Formula 72]
(b-1-29)
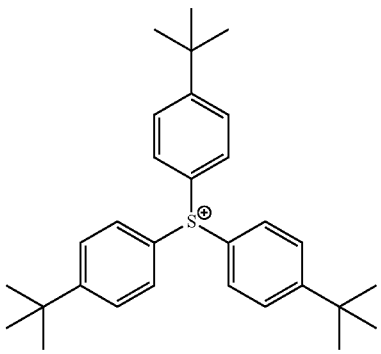
(b-1-30)
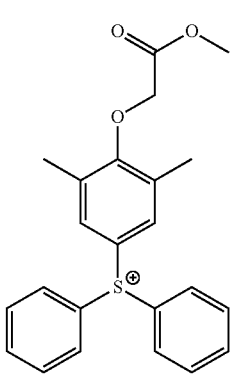

(b-1-31)
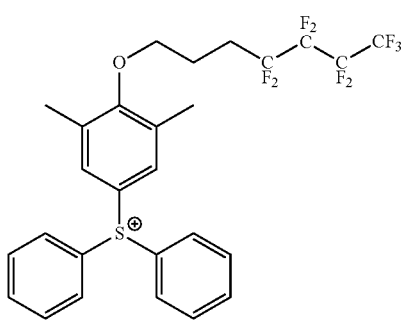
[Chemical Formula 73]
(b-1-32)
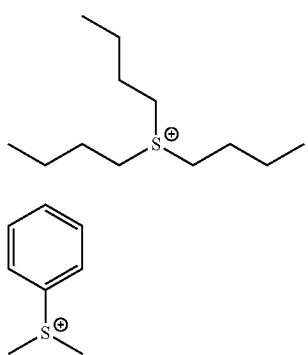
[Chemical Formula 74]
(b-1-34)
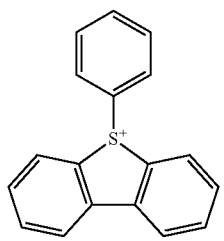
(b-1-35)
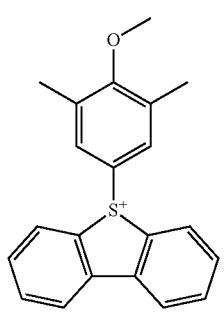
(b-1-36)
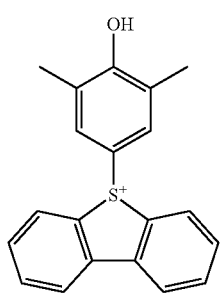
(b-1-37)
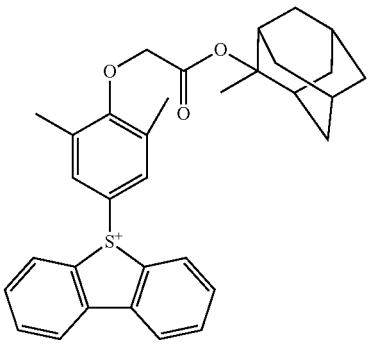
(b-1-38)
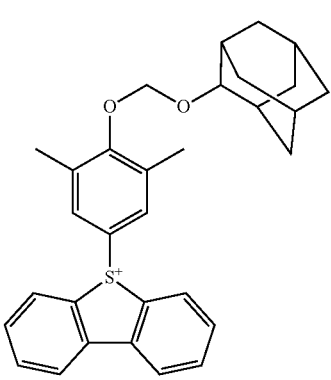
(b-1-39)
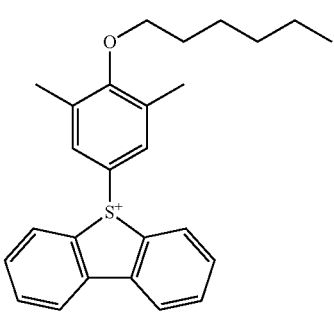
(b-1-40)
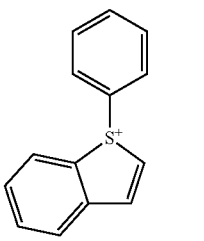
(b-1-41)
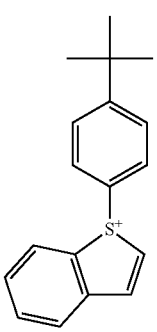

[Chemical Formula 75]

(b-1-42)
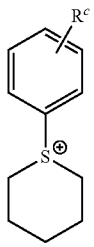

(b-1-43)
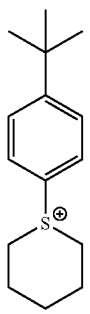

(b-1-44)
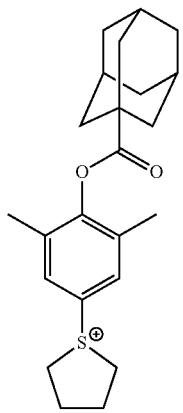

(b-1-45)
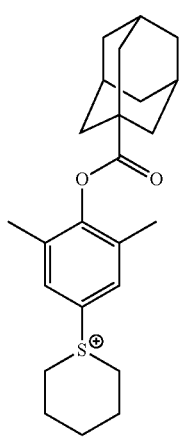

(b-1-46)
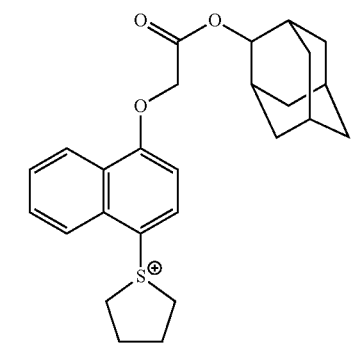

(b-1-47)
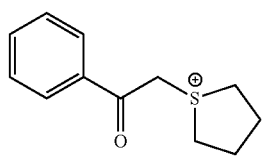

(b-1-48)
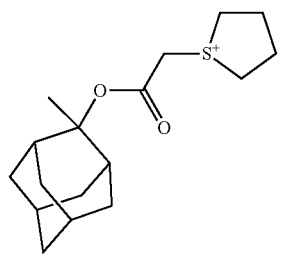

In the formula, $R^C$ represents a substituent described above in the explanation of the aforementioned substituted aryl group (an alkyl group, an alkoxy group, an alkoxyalkyloxy group, an alkoxycarbonylalkyloxy group, a halogen atom, a hydroxy group, an oxo group (=O), an aryl group, —C(=O)—O—$R^{6'}$, —O—C(=O)—$R^{7'}$, and —O—$R^{8'}$).

In formula (b-c2), $R^{5'''}$ and $R^{6'''}$ each independently represents an aryl group which may have a substituent or an alkyl group which may have a substituent.

As the aryl group for $R^{5'''}$ and $R^{6'''}$, the same aryl groups as those described above for $R^{1''}$ to $R^{3''}$ can be used.

As the alkyl group for $R^{5'''}$ and $R^{6'''}$, the same alkyl groups as those described above for $R^{1''}$ to $R^{3''}$ can be used.

As the alkenyl group for $R^{5'''}$ and $R^{6'''}$, the same as the alkenyl groups for $R^{1''}$ to $R^{3''}$ can be used.

Specific examples of the cation moiety of the compound represented by general formula (b-c2) include diphenyliodonium and bis(4-tert-butylphenyl)iodonium.

In the present description, an oximesulfonate acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 76]

(B-1)
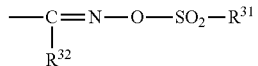

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 77]

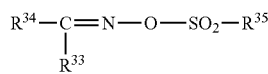

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 78]

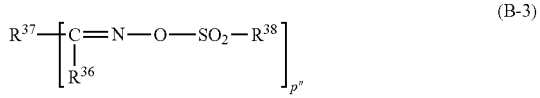

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4- nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyl oxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethyl sulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 79]

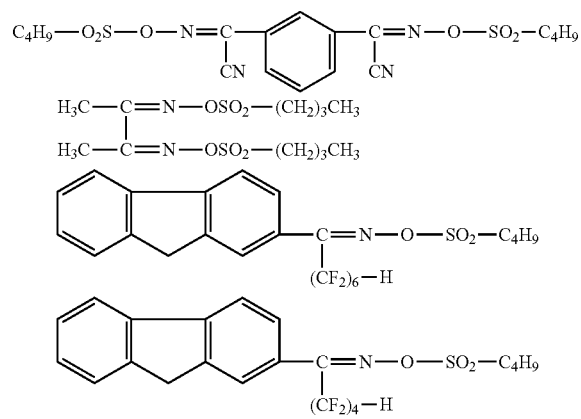

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyphexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

In the case where the resist composition contains the component (B), when the component (B) is a thermal acid generator, the amount of the component (B) relative to 100 parts by weight of the component (A) is preferably within a range from 0.5 to 30 parts by weight, more preferably from 1 to 20 parts by weight. When the component (B) is a photoacid generator, the amount of the component (B) is preferably within a range from 0.5 to 30 parts by weight, more preferably from 1 to 20 parts by weight. When the amount of the component (B) is within the above-mentioned range, formation of a resist pattern can be satisfactorily performed. When the amount of the component (B) is at least as large as the lower limit of the above-mentioned range, the solubility of the resist film in an alkali developing solution can be reliably increased, thereby improving the resolution. On the other hand, when the amount of the component (B) is no more than the upper limit of the above-mentioned range, the sensitivity becomes excellent. Further, in the case of a photoacid generator, when the amount of the component (B) is no more than the upper limit of the above-mentioned range, the transparency of the resist film becomes excellent.

When the resist composition contains the component (B), the amount of the component (B) based on the total of the component (G) and the component (B) is preferably 50% by weight or less, and more preferably 20% by weight or less.

Organic Solvent Component; Component (S)

The resist composition of the present invention is produced by dissolving the component (A), the component (C) and the component (Z) in an organic solvent component (S).

As the component (S), 1 kind of component may be used, or a combination of 2 or more kinds of components may be used.

The component (S) has a sum [Σ(T×r/100)] of a product of a product of the boiling point T (° C.) of an organic solvent within the organic solvent component (S) and the proportion r (weight %) of the organic solvent within the organic solvent component (S) is 160° C. or lower, preferably 155° C. or lower, more preferably 100 to 150° C., and most preferably 120 to 146° C.

By virtue of using an organic solvent component (S) in which the sum [Σ(T×r/100)] of the product is 160° C. or lower, a resist film exhibiting an excellent uniformity of the film thickness can be formed on a substrate. By using an organic solvent component (S) in which the sum of the product is no more than the lower limit of the preferable range, nonuniform coating and generation of streaks can be suppressed in the application of the resist composition on a substrate. As a result, the formed film can be prevented from being opaque and non-transparent, and a transparent film can be obtained.

In the present invention, "boiling point" refers to the boiling point under a pressure of 1 atm.

With respect to the component (S), the sum $[\Sigma(T \times r/100)]$ of the product of the boiling point T (° C.) of the organic solvent and the proportion r (weight %) of the organic solvent within the organic solvent component (S) is determined as follows.

In the case where the component (S) contains only propylene glycol monomethyl ether acetate (boiling: 146° C.), T=146.0° C. and r=100 wt %, meaning that the sum of the product $[\Sigma(T \times r/100)]=146.0 \times 100/100=146.0°$ C.

In the case where the component (S) is a mixed solvent of propylene glycol monomethyl ether acetate (boiling: 146.0° C.; PGMEA) and propylene glycol monomethyl ether (boiling: 132.0° C.; PGME) (PGMEA/PGME=60/40), $T_{PGMEA}=146.0°$ C., $T_{PGME}=132.0°$ C., $r_{PGMEA}=60$ wt % and $r_{PGME}=40$ wt %, meaning that the sum of the product $[\Sigma(T \times r/100)]=(146.0 \times 60+132.0 \times 40)/100=140.4°$ C.

With respect to the component (S), the kind of the organic solvent and the mixing ratio can be appropriately selected such that the sum of the product $[\Sigma(T \times r/100)]$ becomes 160° C. or lower.

As the component (S), one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol and dipropylene glycol; polyhydric alcohol derivatives including compounds having an ester bond, such as ethylene glycol monoacetate, diethylene glycol monoacetate, propylene glycol monoacetate, and dipropylene glycol monoacetate, and compounds having an ether bond, such as a monoalkyl ether (such as a monomethyl ether, monoethyl ether, monopropyl ether or monobutyl ether) or a monophenyl ether of any of these polyhydric alcohols or compounds having an ester bond [among these derivatives, propylene glycol monomethyl ether acetate and propylene glycol monomethyl ether are preferred]; cyclic ethers such as dioxane; esters such as methyl lactate, ethyl lactate, methyl acetate, ethyl acetate, butyl acetate, methyl pyruvate, ethyl pyruvate, propyl propionate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene; chain-like structure alcoholic organic solvents such as propylene glycol, 1-butoxy 2-propanol, n-hexanol, 2-heptanol, 3-heptanol, 1-heptanol, 5-methyl-1-hexanol, 6-methyl-2-heptanol, 1-octanol, 2-octanol, 3-octanol, 4-octanol, 2-ethyl-1-hexanol, 2-(2-butoxyethoxy)ethanol, n-pentyl alcohol, s-pentyl alcohol, t-pentyl alcohol, isopentyl alcohol, isobutanol (also known as isobutyl alcohol or 2-methyl-1-propanol), isopropyl alcohol, 2-ethylbutanol, neopentyl alcohol, n-butanol, s-butanol, t-butanol, 1-propanol, n-hexanol, 2-heptanol, 3-heptanol, 2-methyl-1-butanol, 2-methyl-2-butanol and 4-methyl-2-pentanol; and cyclic structure alcoholic organic solvents such as cyclopentanemethanol, 1-cyclopentylethanol, cyclohexanol, cyclohexanemethanol, cyclohexaneethanol, 1,2,3,6-tetrahydrobenzyl alcohol, exo-norborneol, 2-methylcyclohexanol, cycloheptanol, 3,5-dimethylcyclohexanol, and benzyl alcohol.

In the present invention, the term "alcohol organic solvent" refers to a compound in which at least one hydrogen atom within an aliphatic hydrocarbon has been substituted with a hydroxyl group, and is a liquid at normal temperature (room temperature) and normal pressure (atmospheric pressure). The structure of the main chain constituting the aforementioned aliphatic hydrocarbon may be a chain-like structure or a cyclic structure, or may include a cyclic structure within the chain-like structure, or may include an ether bond within the chain-like structure.

Among the above examples, at least one member selected from propylene glycol monomethyl ether acetate (PGMEA), propylene glycol monomethyl ether (PGME), cyclohexanone, ethyl lactate, γ-butyrolactone, butyl acetate, butyl propionate, ethyl ethoxypropionate, 1-butoxy-2-propanol and isobutanol is preferable.

In the case where a combination of 2 or more kinds of organic solvents are used as the component (S), preferable examples include a combination of PGMEA and PGME, a combination of PGMEA, PGME and cyclohexanone, a combination of PGMEA and isobutanol, a combination of PGMEA and butyl acetate, a combination of butyl propionate and PGMEA, a combination of butyl propionate and PGME, a combination of PGMEA and ethyl lactate, a combination of PGMEA and 1-butoxy-2-propanol, a combination of PGMEA and ethyl ethoxypropionate, a combination of PGMEA and cyclohexanone, and a combination of PGMEA and γ-butyrolactone.

In terms of further improving the uniformity of the film thickness of the resist film, it is preferable to use a combination of organic solvents having a boiling point of 160° C. or lower. Among these, a mixed solvent of a combination of organic solvents having a boiling point of 150° C. or lower, or a mixed solvent containing an organic solvent having a boiling point of 150° C. or lower as a main component (51 to 95 wt %) and supplementarily combining (5 to 49 wt %) an organic solvent having a boiling point of 150 to 160° C. is more preferable.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

Other Components

In the resist composition of the present invention, a component other than the aforementioned components, such as an acid amplifier component, a fluorine additive, an amine or the like can be blended.

Acidic Amplifier Component (H)

In the present invention, the component (H) is decomposed by an acid to generate a free acid, and the free acid further decomposes the component (H) to further generate free acid. In this manner, by the action of acid, the component (H) is serially decomposed, and generates many free acid molecules.

The component (H) is not particularly limited, as long as it is decomposable by the action of an acid, and is capable of further generating acid to self-catalytically amplify acid.

Preferable examples of the component (H) include compounds having a bridged-carbon ring skeleton structure.

Here, the term "compound having a bridged-carbon ring skeleton structure" refers to a compound which has a structure of a bridging bond formed by a plurality of carbon rings in a molecule thereof.

By virtue of the compound having a bridged-carbon ring skeleton structure having a bridging bond, the molecule becomes rigid, and the thermal stability of the compound is improved.

The number of carbon rings is preferably from 2 to 6, and more preferably 2 or 3.

The bridged carbon ring may have part or all of the hydrogen atoms substituted with an alkyl group, an alkoxy group or the like. The alkyl group preferably has 1 to 6 carbon atoms, more preferably 1 to 3, and specific examples of the alkyl group include a methyl group, an ethyl group and a propyl group. The alkoxy group preferably has 1 to 6 carbon atoms, more preferably 1 to 3, and specific examples of the alkoxy group include a methoxy group and an ethoxy group. The bridged carbon ring may have an unsaturated bond such as a double bond.

In the present invention, it is most preferable that the bridged carbon has, on the ring thereof, a hydroxy group and a sulfonate group represented by general formula (Hs) shown below bonded to the carbon atom adjacent to the carbon atom having the hydroxy group bonded thereto.

[Chemical Formula 80]

—OSO$_2$—R$^0$        (Hs)

In the formula, R$^0$ represents an aliphatic group, an aromatic group or a heterocyclic group.

In the aforementioned formula (Hs), R$^0$ represents an aliphatic group, an aromatic group or a heterocyclic group.

Examples of the aliphatic group for R$^0$ include a chain-like or cyclic alkyl group or an alkenyl group, and preferably has 1 to 12 carbon atoms, more preferably 1 to 10 carbon atoms.

The aromatic group may be either a monocyclic group or a polycyclic group, and specific examples thereof include aryl groups.

The heterocyclic group may be a monocyclic group or a polycyclic group, and specific examples thereof include groups which are derived from various conventional heterocyclic compounds.

The aforementioned aliphatic group, aromatic group and heterocyclic group may have a substituent, and examples of the substituent include a halogen atom, an alkyl group, an alkoxy group, an amino group, a substituted amino group and an oxygen atom (=O).

Specific examples of the aforementioned aliphatic group and the aromatic group include a methyl group, an ethyl group, a propyl group, a butyl group, an acyl group, a hexyl group, a vinyl group, a propylene group, an allyl group, a cyclohexyl group, a cyclooctyl group, a bicyclohydrocarbon group, a tricyclohydrocarbon group, a phenyl group, a tolyl group, a benzyl group, a phenethyl group, a naphthyl group, a naphthylmethyl group, and substitution products thereof.

Examples of the heterocyclic group include groups derived from various heterocyclic groups, such as a 5-membered ring compound containing one hetero atom or a condensed ring compound thereof (e.g., furan, thiophene, pyrrole, benzofuran, thionaphthene, indole or carbazole); a 5-membered ring compound containing two hetero atoms or a condensed ring compound thereof (e.g., oxazole, thiazole or pyrazole); a 6-membered ring compound containing one hetero atom or a condensed ring compound thereof (e.g., pyran, pyrone, coumarin, pyridine, quinoline, isoquinoline or acridine); and a 5-membered ring compound containing two hetero atoms or a condensed ring compound thereof (e.g., pyridazine, pyrimidine, pyrazine or to phthalazine).

In the present invention, when the component (H) has, on the bridged carbon ring, a hydroxy group and a sulfonate group represented by the aforementioned general formula (Hs), such a component (H) is decomposed by the action of an acid to generate a new acid (R$^0$SO$_3$H).

In this manner, one acid increases in one reaction, and the reaction is accelerated as the reaction proceeds, thereby serially decomposing the component (H).

In such a case, the strength of the generated acid in terms of the acid dissociation constant (pKa) is preferably 3 or less, and most preferably 2 or less. When the pKa is 3 or less, the generated acid itself is likely to induce the self-decomposition. On the other hand, when the generated acid has a weaker strength, it becomes difficult to induce the self-decomposition.

Examples of the free acid (R$^0$SO$_3$H) generated by the above reaction include methanesulfonic acid, ethanesulfonic acid, propanesulfonic acid, butanesulfonic acid, pentanesulfonic acid, hexanesulfonic acid, heptanesulfonic acid, octanesulfonic acid, cyclohexanesulfonic acid, camphorsulfonic acid, trifluoromethanesulfonic acid, 2,2,2-trifluoroethanesulfonic acid, benzenesulfonic acid, p-toluenesulfonic acid, p-bromobenzenesulfonic acid, p-nitrobenzenesulfonic acid, 2-thiophenesulfonic acid, 1-naphthalenesulfonic acid and 2-naphthalenesulfonic acid.

Specific examples of the component (H) include compounds represented by general formulae (H1) to (H4) shown below (hereafter, the compounds corresponding to general formulae are respectively referred to as "compounds (H1) to (H4)").

[Chemical Formula 81]

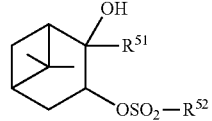 (H1)

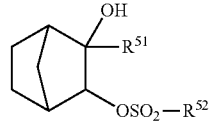 (H2)

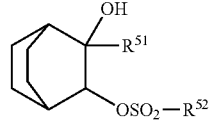 (H3)

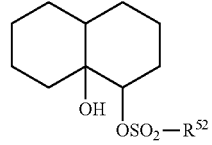 (H4)

In the formulae, R$^{51}$ represents a hydrogen atom, an aliphatic group or an aromatic group; and R$^{52}$ represents an aliphatic group, an aromatic group or a heterocyclic group.

In the aforementioned general formulae (H1) to (H3), R$^{51}$ represents a hydrogen atom, an aliphatic group or an aromatic group. The aliphatic group and the aromatic group for $R^{51}$ is the same as defined for the aliphatic group and the aromatic group for the aforementioned $R^0$. As $R^{51}$, an aliphatic group or an aromatic group is preferable, an aliphatic group is more preferable, a lower alkyl group is still more preferable, and a methyl group is most preferable.

In the aforementioned general formulae (H1) to (H4), $R^{52}$ represents an aliphatic group, an aromatic group or a heterocyclic group, and is the same as defined for $R^0$. As $R^{52}$, an aliphatic group or an aromatic group is preferable, and an aliphatic group is more preferable.

With respect to the compounds (H1) to (H4), the compound (H1) has a bridge bond on the 1st and 3rd positions of the bicyclo compound, the compounds (H2) and (H3) has a bridge bond on the 1st and 4th positions of the bicyclo compound, and the compound (H4) has a bridge bond on the 1st and 6th positions of the bicyclo compound (decarine).

Therefore, in the compounds (H1) to (H4), the conformation change of the cyclohexane ring is greatly suppressed, and hence, the ring structure exhibits rigidity.

As the component (H), for example, a compound in which the bridged carbon has, on the ring thereof, a hydroxy group and a sulfonate group represented by general formula (Hs) bonded to the carbon atom adjacent to the carbon atom having the hydroxy group bonded thereto (such as the compounds (H1) to (H4)) can be readily synthesized by reacting a diol compound with a halide of the sulfonic acid. The diol compound has two isomers, namely, cis-isomer and trans-isomer, but the cis-isomer is thermally stable, and is therefore preferably used. Further, such a compound can be stably stored as long as an acid does not coexist.

Specific examples of preferable component (H) are shown below.

[Chemical Formula 82]

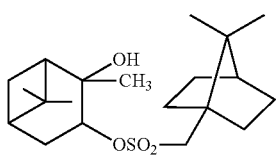
(H1-1)

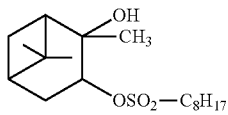
(H1-2)

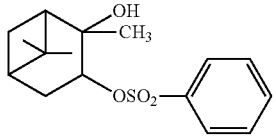
(H1-3)

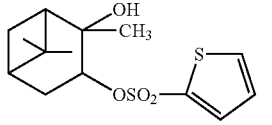
(H1-4)

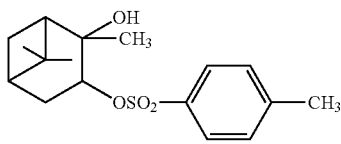
(H1-5)

-continued

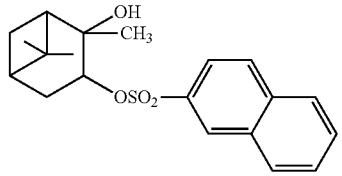
(H1-6)

[Chemical Formula 83]

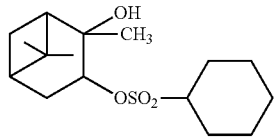
(H1-7)

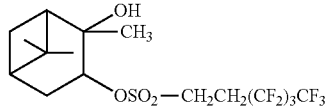
(H1-8)

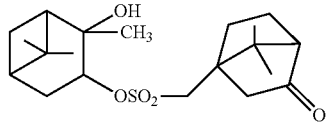
(H1-9)

[Chemical Formula 84]

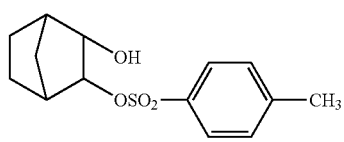
(H2-1)

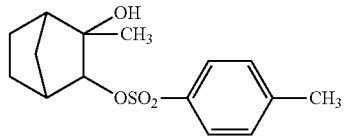
(H2-2)

Among the above examples, as the component (H), in terms of the effects of the present invention (resolution, lithography properties), the compound (H1) or the compound (H2) is preferable, and the compound (H1) is more preferable. More specifically, it is preferable to use at least one member selected from the group consisting of compounds represented by chemical formulae (H1-1) to (H1-9), and it is most preferable to use a compound represented by chemical formula (H1-9).

As the component (H), one type of compound may be used, or two or more types of compounds may be used in combination.

When the resist composition of the present invention contains the component (H), the amount of the component (H) relative to 100 parts by weight of the component (A) is preferably within a range from 0.1 to 30 parts by weight, and more preferably from 1 to 20 parts by weight. When the amount of the component (H) is at least as large as the lower limit of the above-mentioned range, the resolution is improved. On the other hand, when the amount of the component (H) is no more than the upper limit of the above-mentioned range, the sensitivity is improved.

When the component (H) and the component (G) are used in a combination, the mixing ratio of the component (H) to the component (G) in terms of molar ratio is preferably from 9:1 to 1:9, more preferably from 9:1 to 5:5, and most preferably from 9:1 to 6:4. When the ratio of the component (H) is at least as large as the lower limit of the above-mentioned range, the resolution is improved. On the other hand, when the ratio of the component (H) is no more than the upper limit of the above-mentioned range, the sensitivity is improved.

Further, when the component (H) and the component (B) are used in a combination, the mixing ratio of the component (H) to the component (13) in terms of molar ratio is preferably from 9:1 to 1:9, more preferably from 9:1 to 5:5, and most preferably from 9:1 to 6:4. When the ratio of the component (H) is at least as large as the lower limit of the above-mentioned range, the resolution is improved. On the other hand, when the ratio of the component (H) is no more than the upper limit of the above-mentioned range, the sensitivity is improved.

Fluorine Additive; Component (F)

In the resist composition of the present invention, a fluorine additive (hereafter, referred to as "component (F)") may be blended for imparting water repellency to the resist film.

As the component (F), for example, a fluorine-containing polymeric compound described in Japanese Unexamined Patent Application, First Publication No. 2010-002870.

Specific examples of the component (F) include polymers having a structural unit (f1) represented by general formula (f1-1) shown below. As such polymer, a polymer (homopolymer) consisting of a structural unit (f1); a copolymer of a structural unit represented by formula (f1-1) shown below and the aforementioned structural unit (a1); and a copolymer of a structural unit represented by the formula (f1-1) shown below, a structural unit derived from acrylic acid or methacrylic acid and the aforementioned structural unit (a1) are preferable. As the structural unit (a1)) to be copolymerized with a structural unit represented by formula (f1-1) shown below, a structural unit represented by the aforementioned formula (a1-0-1) is preferable, and a structural unit represented by the aforementioned formula (a1-1-32) is particularly desirable.

[Chemical Formula 85]

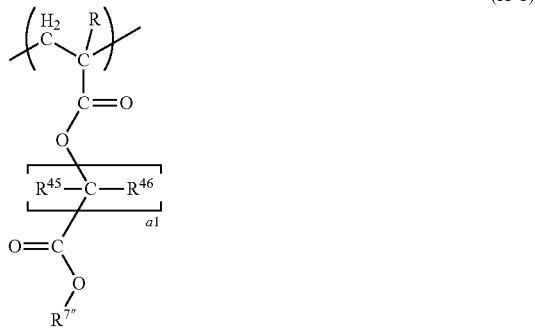

(f1-1)

In the formula, R is the same as defined above; $R^{45}$ and $R^{46}$ each independently represents a hydrogen atom, a halogen atom, an alkyl group of 1 to 5 carbon atoms or a halogenated alkyl group of 1 to 5 carbon atoms, provided that the plurality of $R^{45}$ and $R^{46}$ may be the same or different; a1 represents an integer of 1 to 5; and $R^{7\prime\prime}$ represents an organic group containing a fluorine atom.

In formula (f1-1), R is the same as defined above. As R, a hydrogen atom or a methyl group is preferable.

In formula (f1-1), examples of the halogen atom for $R^{45}$ and $R^{46}$ include a fluorine atom, a chlorine atom, a bromine atom and an iodine atom, and a fluorine atom is particularly desirable. Examples of the alkyl group of 1 to 5 carbon atoms for $R^{45}$ and $R^{46}$ include the same alkyl group of 1 to 5 carbon atoms for R defined above, and a methyl group or an ethyl group is preferable. Specific examples of the halogenated alkyl group of 1 to 5 carbon atoms represented by $R^{4\prime}$ or $R^{46}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $R^{45}$ and $R^{46}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), a1 represents an integer of 1 to 5, preferably an integer of 1 to 3, and more preferably 1 or 2.

In formula (f1-1), $R^{7\prime\prime}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $R^{7\prime\prime}$, a fluorinated hydrocarbon group of 1 to 5 carbon atoms is preferable, and a methyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

When the resist composition of the present invention contains the component (F), the amount of the component (F) relative to 100 parts by weight of the component (A) is preferably within a range from 0.5 to 10 parts by weight.

Amine; Component (D)

In the resist composition of the present invention, an amine (D) (hereafter, referred to as "component (D)") may be blended.

When the resist composition contains the component (G) as an acid supply component, there is a possibility that, in the resist composition solution, the solubility of the component (A) in an alkali developing solution is increased by the component (G) and the like. This phenomenon can be suppressed by controlling the component (G) to an appropriate acidity; however, the phenomenon can also be controlled by adding the component (D) to decrease the acidity of the component (G) in the resist composition solution. It is preferable to use the component (D) because the freedom of choice of the material for the component (G) is improved.

In addition, by virtue of the presence of the component (D) during the storage of the resist composition, the storage stability of the resist composition after preparation can be improved. Moreover, by virtue of the component (D) being removed from the resist film before the neutralization in step (3), the component (D) does not obstruct the neutralization between the base generated from the component (C) and the acid derived from the component (Z), thereby enabling to obtain excellent lithography properties and excellent pattern shape.

A multitude of these components (D) have already been proposed, and any of these known compounds may be used. Among these, as the component (D), a compound exhibiting a pKa which is the same or smaller than the pKa of the cation moiety of the component (G1) is preferable. That is, the pKa of the component (D) is preferably 7 or less, and more preferably 6 or less.

When the resist composition contains the component (G1), in terms of preventing salt exchange between the cation moiety of the component (G1) and the component (D), it is more preferable that the component (D) exhibits a pKa which is the same or smaller than the pKa of the cation moiety of the component (G1).

When the resist composition contains the component (G2), in terms of preventing the acidity of the component (G2) from extremely decreasing, the basicity of the component (D) is preferably low, and the pKa of the component (D) is preferably 7 or less, and more preferably 6 or less.

Examples of the component (D) which satisfies such pKa include an amine in which one "H$^+$" bonded to the nitrogen atom (N) has been removed from formula (G1c-1) described in the explanation of the component (G1). Specifically, preferable examples include the above-mentioned compounds given as specific examples of formula (G1c-11) and (G1c-13) in which the terminal "NH$_3^+$" has been replaced by "NH$_2$"; and compounds given as specific examples of formula (G1c-12) in which "NH$^+$" within the ring has been replaced by "N".

In addition, the component (D) is preferably an amine having a relatively low boiling point. By virtue of using an amine having a relatively low boiling point, the component (D) can be removed from the resist film during the formation of the resist film on a substrate in step (1).

As such component (D) which satisfies the above boiling point, an amine having a boiling point of 130° C. or lower is preferable, an amine having a boiling point of 100° C. or lower is more preferable, and an amine having a boiling point of 90° C. or lower is most preferable.

Specific examples of the component (D) which satisfies the above boiling point include aliphatic amine compounds which have a fluorinated alkyl group, such as trifluoroethylamine (2,2,2-trifluoroethylamine), pentafluoropropylamine (2,2,3,3,3-pentafluoropropylamine), heptafluorobutylamine (1H,1H-heptafluorobutylamine), nonafluoropentylamine (1H,1H-nonafluoropentylamine), undecafluorohexylamine (1H,1H-undecafluorohexylamine), bis(2,2,2-trifluoroethyl)amine, bis(2,2,3,3,3-pentafluoropropyl)amine and 1-(2,2,2-trifluoroethyl)pyrrolidine; pyridine compounds, such as pyridine and pentafluoropyridine; and oxazole compounds, such as oxazole and isooxyazole.

As the component (D), one type of compound may be used alone, or two or more types may be used in combination.

When the resist composition of the present invention contains the component (D), the amount of the component (D) relative to 100 parts by weight of the component (A) is preferably within a range from 0.01 to 20.0 parts by weight, more preferably from 1 to 15 parts by weight, and still more preferably from 2 to 10 parts by weight. When the amount of the component (D) is within the above-mentioned range, the storage stability can be improved, thereby improving the lithography properties and the resist pattern shape.

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, dyes, sensitizers and base amplifiers.

As the sensitizer, conventional sensitizers can be used, and specific examples thereof include benzophenone-type sensitizers, such as benzophenone and p,p'-tetramethyldiaminobenzophenone; carbazole-type sensitizers; acetophen-type sensitizers; naphthalene-type sensitizers; phenol-type sensitizers; anthracene-type sensitizers, such as 9-ethoxyanthracene; biacetyl; eosin; rose bengal; pyrene; phenothiazine; and anthrone. In the resist composition, the amount of the sensitizer, relative to 100 parts by weight of the component (A) is preferably from 0.5 to 20 parts by weight.

A base amplifier is decomposed by the action of a base in a chain reaction, and is capable of generating a large amount of base using a small amount of base. Therefore, by blending a base amplifier, the sensitivity of the resist composition can be improved. As the base amplifier, for example, those described in Japanese Unexamined Patent Application, First Publication No. 2000-330270 and Japanese Unexamined Patent Application, First Publication No. 2008-174515 can be used.

According to the resist composition of the present invention, when a resist film is formed without conducting "prebake" after applying the resist composition to the substrate and until exposure, a resist film can be formed on the substrate with a high uniformity of the film thickness.

Conventionally, after applying a resist composition to a substrate, prebaking was conducted. By conducting prebaking, the uniformity of the film thickness of the resist film formed on the substrate is enhanced. On the other hand, in order to perform patterning of a minute pattern with a high precision, it becomes important to control the film thickness to be uniform in the formation of a resist film on a substrate.

In the resist composition of the present invention, as the organic solvent component (S) for dissolving the resist materials, a component in which the sum $[\Sigma(T \times r/100)]$ of the product of the boiling point T (° C.) of the organic solvent and the proportion r (weight %) of the organic solvent within the organic solvent component (S) is 160° C. or lower is used. By virtue of the sum of the product being 160° C. or lower, the component (S) need not contain an organic solvent having a high boiling point as a main component (50% by weight or more). Therefore, even when a resist composition containing the component (S) is applied to a substrate only by spin coating, the component (S) is volatilized so as to be reliably removed. As such, the organic solvent hardly remains in the resist film. In contrast, in the case where a resist composition containing a component (S) in which the sum of the product exceeds 160° C. (e.g., a component (S) containing an organic solvent having a high boiling point as a main component) is used, it is considered that the organic solvent is likely to remain in the resist film (thereby deteriorating the uniformity of the film thickness).

In addition, a resist composition containing a component (S) in which the sum of the product is 160° C. or lower exhibits excellent coatability on a substrate.

For the reasons as described above, it is presumed that, according to the resist composition of the present invention, a resist film in which the uniformity of the film thickness is high can be formed on a substrate even without conducting prebaking.

The resist composition of the present invention is preferably used in step (1') of the method of forming a resist pattern according to the third aspect including steps (1') to (4') described below.

<<Third Aspect: Method of Forming Resist Pattern (II)>>

The method of forming a resist pattern according to a third aspect of the present invention (hereafter, sometimes referred to as "method of forming resist pattern (II)") includes: a step (1') in which a resist composition including a base component that exhibits increased solubility in an alkali developing solution, a photobase generator component that generates base upon exposure and an acid supply component dissolved in an organic solvent component (S) is applied to a substrate to form a resist film, wherein a sum [Σ(T×r/100)] of a product of the boiling point T (° C.) of an organic solvent within the organic solvent component (S) and the proportion r (weight %) of the organic solvent within the organic solvent component (S) is 160° C. or lower; a step (2') in which the resist film is subjected to exposure without being subjected to prebaking; a step (3') in which baking is conducted after the step (2'), such that, at an exposed portion of the resist film, the base generated from the photobase generator component upon the exposure and an acid derived from the acid supply component are neutralized, and at an unexposed portion of the resist film, the solubility of the base component in an alkali developing solution is increased by the action of the acid derived from the acid supply component; and a step (4') in which the resist film is subjected to an alkali development, thereby forming a negative-tone resist pattern in which the unexposed portion of the resist film has been dissolved and removed.

In the method of forming a resist pattern (II), the resist composition used in step (1') is the same as defined for the aforementioned resist composition of the present invention.

The steps (1') to (4') in the method of forming a resist pattern (II) are respectively the same as defined for steps (1) to (4) in the aforementioned method of forming a resist pattern (I), except that the resist composition according to the second aspect is used in step (1').

In step (1') of the method of forming a resist pattern (II), by virtue of using the resist composition according to the second aspect, the component (S) is volatilized so as to be reliably removed. As such, the organic solvent hardly remains in the resist film, and the uniformity of the film thickness becomes excellent. In addition, the coatability on a substrate is excellent, and hence, nonuniform coating on the surface of the resist film formed can be suppressed. Further, as the resist film becomes thinner, the effects that the resist composition can be more uniformly applied to the substrate 1; the organic solvent is less likely to remain in the resist film, so that the resist film can be more reliably dried; and the uniformity of the film thickness of the resist film 2 (the in-plane uniformity of the resist film 2 on the substrate 1) can be improved, becomes significant.

According to the method of forming a resist pattern (II) described above, a negative-tone resist pattern can be formed with a high resolution by a developing process in which a chemically amplified resist composition conventionally known as a positive type is used in combination with an alkali developing solution.

In the third aspect of the present invention, in the formation of a minute pattern, after applying the resist composition of the second aspect on a substrate to form a resist film, prebaking (PAB) is not conducted, and the resist film is subjected to exposure, followed by baking (PEB) and alkali developing, thereby forming a high contrast image. In particular, in the case where a resist composition containing an acidic compound as an acid supply component, the effects of the present invention becomes significant. As such, in the third aspect of the present invention, by virtue of not conducting prebaking (PAB), so as to prevent the acid supply component from acting on the resist film as an acid, a high contrast can be achieved with respect to the formed resist pattern, thereby improving the resolution.

Further, in the method of forming a resist pattern (II), by virtue of using the resist composition of the present invention in step (1'), a resist film exhibiting an excellent uniformity of the film thickness can be formed on a substrate. This effect becomes more significant as the film thickness of the resist film becomes smaller. Moreover, according to the aforementioned method of forming a resist pattern, a minute patterning can be performed with precision.

Further, according to the method of forming a resist pattern (II), the resolution becomes excellent in a resist pattern (such as an isolated trench pattern, an extremely small, dense contact hole pattern, or the like) having a region where the optical strength becomes weak (region where irradiation by exposure is not satisfactorily reached) is likely to be generated in a film thickness direction.

Further, by the method of forming a resist pattern according to the present invention, it is possible to form a highly densed resist pattern. For example, it becomes possible to form a contact hole pattern in which each of the holes are close to each other with excellent shapes, e.g., the distance between the holes is about 30 to 50 nm.

Furthermore, the method of forming a resist pattern (II) can be performed by existing exposure apparatuses and existing facilities.

In the method of forming a resist pattern according to the present invention, since prebaking is not conducted after applying a resist composition on a substrate to form a resist film in step (1') and until subjecting the resist film to exposure, the number of steps can be reduced, as compared to a conventional method of forming a resist pattern.

Moreover, by using a double exposure method in the method of forming a resist pattern (II), the number of steps can be reduced as compared to a double patterning in which each of a lithography step and a patterning step are performed at least twice.

<<Method of Forming Resist Pattern According to Fourth Aspect>>

The method of forming a resist pattern according to a fourth aspect of the present invention (hereafter, sometimes referred to as "method of forming a resist pattern (III)") includes: a step (1") in which a resist composition including a base component that exhibits increased solubility in an alkali developing solution, a photobase generator component that generates base upon exposure and an acid supply component is applied to a substrate by a spin-coat method to form a resist film; a step (2") in which the resist film is subjected to exposure without being subjected to prebaking; a step (3") in which baking is conducted after the step (2"), such that, at an exposed portion of the resist film, the base generated from the photobase generator component upon the exposure and an acid derived from the acid supply component are neutralized, and at an unexposed portion of the resist film, the solubility of the base component in an alkali developing solution is increased by the action of the acid derived from the acid supply component; and a step (4") in which the resist film is subjected to an alkali development, thereby forming a negative-tone resist pattern in which the unexposed portion of the resist film has been dissolved and removed, wherein, in application of the resist composition in step (1"), a rotation time after supplying the resist composition on the substrate is 50 seconds or more.

The steps (1") to (4") in the method of forming a resist pattern (III) are respectively the same as defined for steps (1) to (4) in the aforementioned method of forming a resist pattern (1), except that, in application of the resist composition in step (1"), a rotation time after supplying the resist composition on the substrate is 50 seconds or more.

In step (1") of the method of forming a resist pattern (III), the method of applying the resist composition to the substrate 1 to form a resist film 2 is not particularly limited, and the resist film 2 can be formed by a conventional method.

For example, the resist composition can be applied to the substrate 1 by a conventional method using a spinner or the like, followed by drying at room temperature on a cooling plate or the like, so as to volatilize the organic solvent, thereby forming a resist film 2. In general, after supplying (applying) a resist composition on the substrate 1, at least one rotation step is conducted. In the method of forming a resist pattern (III), it is necessary that the total rotation time (hereafter, referred to as "rotation time") of all rotation steps after application is 50 seconds or more. The rotation time is preferably 55 seconds or more, and more preferably 60 seconds or more. The longer the total rotation time, the better the film formability, and hence, the risk of elution can be reduced in an immersion exposure process. In consideration of the throughput, the upper limit of the rotation time is preferably 180 seconds or less, and more preferably 150 seconds or less.

Among the entire rotation steps, a main rotation step which determines the film thickness of the resist film is provided.

The main rotation time depends on the entire rotation time, but it is preferable that the main rotation time is set to be long in terms of the uniformity of the film thickness. However, the main rotation time will not be equal to the total rotation time. In consideration of edge rinse and back rinse of the wafer, and time required for acceleration to reach the main rotation, generally, in the entire rotation steps, about 15 to 20 seconds is set apart from the main rotation steps.

In the method of forming a resist pattern (III), in the entire rotation steps, the main rotation time of the main rotation step in which the film thickness of the resist film is determined is preferably 10 seconds or more, more preferably 20 seconds or more, still more preferably 30 seconds or more, and most preferably 60 seconds or more. The upper limit of the main rotation time is appropriately selected depending on the total rotation time.

Further, the number of rotation in the main rotation step is preferably 1,000 to 4,000 rpm, more preferably 1,000 to 3,000 rpm, and still more preferably 1,000 to 2,000 rpm.

The rotation step is generally performed in a plurality of steps. In each step, the rotation time and the number of rotation is appropriately adjusted depending on the film thickness of the resist film to be formed. For example, in the case where the main rotation time is 30 seconds, the time and the rotation number in each step from the application until the entire rotation steps finish can be set as follows.

TABLE 1

| Step | Time (seconds) | Numer of rotation (rpm) |
|---|---|---|
| 1 | 10.0 | 0 |
| 2 | 3.0 | 800 |
| 3 | 30.0 | 1500 |
| 4 | 5.0 | 1500 |
| 5 | 1.0 | 800 |
| 6 | 5.0 | 1500 |
| 7 | 5.0 | 800 |
| 8 | 1.0 | 1250 |
| 9 | 5.0 | 2000 |
| 10 | 1.0 | 0 |

In the above example of the rotation steps, the number of rotation in step 1 and step 10 is 0 rpm, and is therefore, not included in the total rotation time in the present invention. Specifically, step 1 is prior to starting the rotation. During this time, the resist composition is supplied to a substrate such as a wafer. Step 10 is the stopping time in which the rotation step is finished.

A so-called pre-wet step may be conducted before step 1. Further, in this case, the rotation is stopped in step 1; however, it is possible to supply the resist composition to a substrate such as a wafer while rotating. In the case where the resist composition is supplied while rotating, the rotation time during the supplying is included in the "rotation time after supplying a resist solution to the substrate".

In the above example of the rotation steps, the rotation time in steps 2 to 9 is the total rotation time in the present invention, i.e., 55 seconds.

Step 2 is an acceleration step for transferring to the main rotation step.

Step 3 is the main rotation step.

Step 4 is a step in which an arm nozzle to be used in the rinse step from step 5 is moved. This step is formally included, and the arm nozzle may be moved within the main rotation step (the last 5 seconds of the main rotation step). In such a case, the total rotation time may be substantially shortened 5 seconds to be 50 seconds. Further, in such a case, since step 4 is a different step from the main rotation step, the number of rotation may be changed from that of the main rotation.

Steps 5 to 8 is a rinse step. In this case, a rinse treatment of the edge portion of the wafer (edge rinse) is conducted for 12 seconds in steps 5 to 8, and a rinse treatment of the back face of the wafer (back rinse) is conducted for 10 seconds in steps 6 and 7. The rinse treatment time depends on the object of the rinse treatment, but is generally about 10 seconds or more.

Step 9 is a step of shaking off the rinse liquid and the like.

In general, each step of the rotation step includes an object such as a rinse treatment. In the present invention, it is necessary that the total rotation time is 50 seconds or more in order to obtain an excellent film formability even when the prebake step is omitted. Hence, in the above example of the rotation steps, all of steps 2 to 9 contribute to the film formability. Therefore, apart from the steps shown above, a rotation step for improving the film formability may be separately conducted.

In the present invention, in view of the fact that the uniformity of the film thickness becomes excellent in addition to the improvement in the film formability for reducing the risk of elution, it is preferable to increase the proportion of the main rotation time within the total rotation time. Specifically, the main rotation time is preferably 15% or more of the total rotation time, more preferably 30% or more, and still more preferably 40% or more. The upper limit can be appropriately selected depending on the total rotation time, for example, 85% or less.

In the method of forming a resist pattern (III), by virtue of the rotation time after supplying the resist solution to the substrate being 50 seconds or more, elution of a substance from the formed resist film can be suppressed. Therefore, it is expected that generation of defects can be reduced particularly in an immersion exposure process.

(Resist Composition)

In the method of forming a resist pattern (III), a resist composition containing a base component that exhibits increased solubility in an alkali developing solution (hereafter, referred to as "component (A)"), a photobase generator component that generates a base upon exposure (hereafter, referred to as "component (C)"), and an acid supply component (hereafter, referred to as "component (Z)") is used.

As the resist composition, the same resist composition as that in the aforementioned method of forming a resist pattern (I) can be used.

It is preferable that the resist composition further contains an amine.

According to the method of forming a resist pattern (III) described above, a negative-tone resist pattern can be formed with a high resolution by a developing process in which a chemically amplified resist composition conventionally known as a positive type is used in combination with an alkali developing solution.

According to the method of forming a resist pattern (III), in the formation of a minute pattern, after applying a resist composition on a substrate to form a resist film, prebaking (PAB) is not conducted, and the resist film is subjected to exposure, followed by baking (PEB) and alkali developing, thereby forming a high contrast image. As such, in the present invention, by virtue of not conducting prebaking (PAB), a high contrast can be achieved with respect to the formed resist pattern, thereby improving the resolution.

Further, according to the method of forming a resist pattern (III), the resolution becomes excellent in a resist pattern (such as an isolated trench pattern, an extremely small, dense contact hole pattern, or the like) having a region where the optical strength becomes weak (region where irradiation by exposure is not satisfactorily reached) is likely to be generated in a film thickness direction.

Further, by the method of forming a resist pattern (III), it is possible to form a highly densed resist pattern. For example, it becomes possible to form a contact hole pattern in which each of the holes are close to each other with excellent shapes, e.g., the distance between the holes is about 30 to 50 nm.

Furthermore, the method of forming a resist pattern (III) can be performed by existing exposure apparatuses and existing facilities.

In the method of forming a resist pattern (III), since prebaking is not conducted after applying a resist composition on a substrate to form a resist film in step (1″) and until subjecting the resist film to exposure, the number of steps can be reduced, as compared to a conventional method of forming a resist pattern.

Moreover, by using a double exposure method in the method of forming a resist pattern (III), the number of steps can be reduced as compared to a double patterning in which each of a lithography step and a patterning step are performed at least twice.

In the method of forming a resist pattern (III), by virtue of the rotation time after supplying the resist solution to the substrate being 50 seconds or more, the film formability becomes excellent, and elution of a substance from the formed resist film can be suppressed. Therefore, it is expected that generation of defects can be reduced particularly in an immersion exposure process. With respect to a resist film formed by the method of the present invention, the reason why elution of a substance from the resist film can be suppressed has not been elucidated yet. However, it is presumed that, by increasing the rotation time in the formation of the resist film, particularly the main rotation time, the amount of solvent remaining within the resist film can be suppressed.

Moreover, in the method of forming a resist pattern (III), instead of conducting no prebake (PAS), the rotation time after supplying the resist solution to the substrate is increased to 50 seconds or more, which is longer than the conventional rotation time. As a result, it is expected that the risk of delamination of the film can be reduced.

EXAMPLES

As follows is a description of examples of the present invention, although the scope of the present invention is by no way limited by these examples.

First Aspect

Production of Resist Composition

The components shown in Table 2 were mixed together and dissolved to obtain resist compositions.

TABLE 2

| | Component (A) | Component (C) | Component (G) | Component (F) | Component (S) |
|---|---|---|---|---|---|
| Resist composition (1) | (A)-1 [100] | (C)-1 [15.0] | (G)-1 [15.0] | (F)-1 [3.0] | (S)-1 [3300] |
| Resist composition (2) | (A)-2 [100] | (C)-1 [15.0] | (G)-1 [15.0] | (F)-1 [3.0] | (S)-1 [3300] |

In Table 2, the values in brackets [ ] indicate the amount (in terms of parts by weight) of the component added, and the reference characters indicate the following.

(A)-1: a copolymer represented by chemical formula (A1-1) shown below. Mw: 7,000, Mw/Mn: 1.56. In the chemical formula, the subscript numerals shown on the bottom right of the parentheses ( ) indicate the percentage (mol %) of the respective structural units.

(A)-2: a copolymer represented by chemical formula (A1-2) shown below. Mw: 7,000, Mw/Mn: 1.57. In the chemical formula, the subscript numerals shown on the bottom right of the parentheses ( ) indicate the percentage (mol %) of the respective structural units.

[Chemical Formula 86]

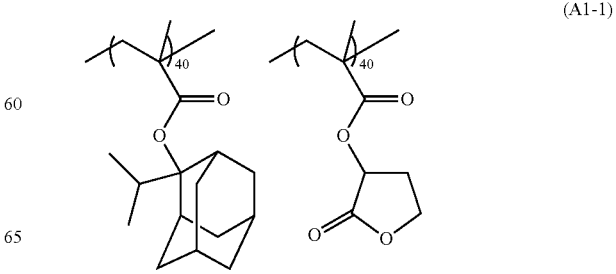

(A1-1)

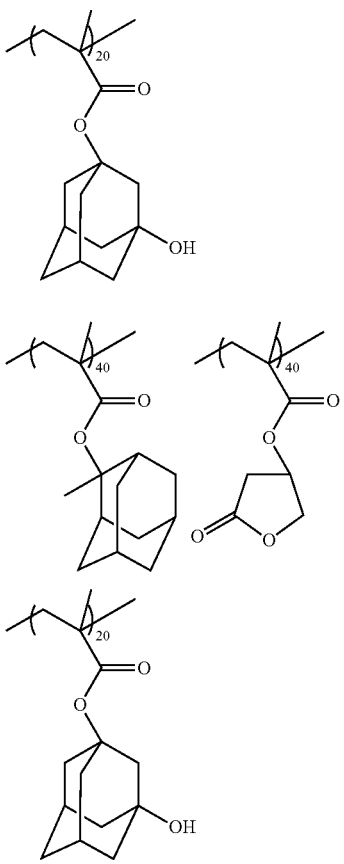

(C)-1: a compound represented by chemical formula (C)-1 shown below.

(G)-1: a compound represented by chemical formula (G)-1 shown below.

(F)-1: a polymer represented by chemical formula (F)-1 shown below. Mw: 24,000, Mw/Mn: 1.38. In the chemical formula, the subscript numerals shown on the bottom right of the parentheses ( ) indicate the percentage (mol %) of the respective structural units.

[Chemical Formula 87]

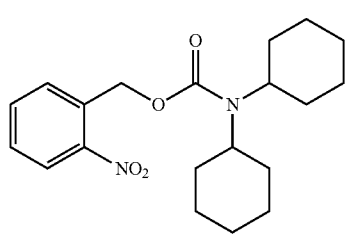

(C)-1

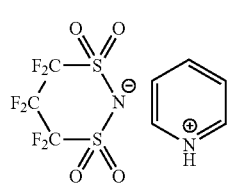

(G)-1

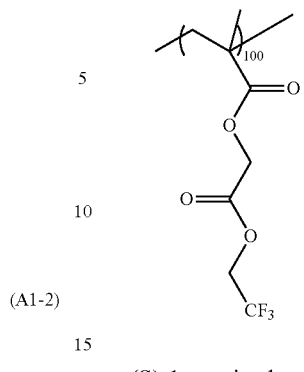

(A1-2)

(S)-1: a mixed solvent of propylene glycol monomethyl ether acetate/propylene glycol monomethyl ether=60/40 (weight ratio).

Formation of Resist Pattern

Examples 1 to 3

Step (1)

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 82 nm.

Then, the resist composition (1) or the resist composition (2) was spin-coated on the organic antireflection film, thereby forming a resist film having a film thickness indicated in Table 3.

Step (2)

Subsequently, without conducting prebaking (PAB) of the thus formed resist film, the resist film was irradiated with an ArF excimer laser (193 nm) through a photomask (half tone) targeting an SL pattern with a space width of 130 nm and a pitch of 260 nm, using an ArF exposure apparatus NSR-S302 (manufactured by Nikon Corporation; NA (numerical aperture)=0.60, ⅔ annular).

Step (3)

Next, a baking treatment (PEB: post exposure bake) was conducted at a temperature indicated in Table 3 for 60 seconds.

Step (4)

Thereafter, alkali developing was conducted for 30 seconds at 23° C. in a 2.38% by weight aqueous solution of tetramethylammonium hydroxide (TMAH) (product name: NMD-3; manufactured by Tokyo Ohka Kogyo Co., Ltd.).

Formation of Resist Pattern

Comparative Examples 1 to 3

Step (1a)

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 82 nm.

Then, the resist composition (1) or the resist composition (2) was spin-coated on the organic antireflection film, and was then prebaked (PAB) and dried on a hotplate at a heating temperature indicated in Table 3 for 60 seconds, thus forming a resist film having a film thickness of 100 nm.

Step (2)

Subsequently, the resist film was irradiated with an ArF excimer laser (193 nm) through a photomask (half tone) targeting an SL pattern with a space width of 130 nm and a pitch of 260 nm, using an ArF exposure apparatus NSR-S302 (manufactured by Nikon Corporation; NA (numerical aperture)=0.60, 2/3 annular).

Step (3)

Next, a post exposure bake treatment (PEB) was conducted at a temperature indicated in Table 3 for 60 seconds.

Step (4)

Thereafter, alkali developing was conducted for 30 seconds at 23° C. in a 2.38% by weight aqueous solution of tetramethylammonium hydroxide (TMAH) (product name: NMD-3; manufactured by Tokyo Ohka Kogyo Co., Ltd.).

Evaluation of Resolution

With respect to the formation of the above resist pattern targeting an SL pattern having a space width of 130 nm (pitch: 260 nm), the resolution was evaluated by the following criteria. The results are shown in Table 3.

(Criteria)

A: Unexposed portions of the resist film were dissolved and removed, a high contrast image was obtained, and an SL pattern was formed with a high resolution.

B: Could not be resolved, or although a pattern was formed, the resolution was low.

TABLE 3

| | | Film thickness of resist film (nm) | Heating temperature for PAB (° C.) | Heating temperature for PEB (° C.) | Resolution |
|---|---|---|---|---|---|
| Comp. Ex. 1 | Resist composition (1) | 100 | 70 | 90 | B |
| Comp. Ex. 2 | | | 80 | | B |
| Ex. 1 | | | No prebake | | A |
| Ex. 2 | | | 250 | No prebake | A |
| Comp. Ex. 3 | Resist composition (2) | 100 | 80 | 120 | B |
| Ex. 3 | | | No prebake | | A |

From the results shown in Table 3, it was found that, according to the method of forming a resist pattern of Examples 1 to 3, a negative-tone pattern could be formed with a high resolution.

Second Aspect

Production of Resist Composition

Examples 4 to 18, Comparative Examples 4 to 7

The components shown in Table 4 were mixed together and dissolved to obtain resist compositions.

TABLE 4

| Resist composition | Component (A) | Component (C) | Component (G) | Component (F) | Component (S) |
|---|---|---|---|---|---|
| Ex. 4 | (A)-1-1 [100] | (C)-1 [15.0] | (G)-1 [15.0] | (F)-1 [3.0] | (S)-2 [3300] |
| Ex. 5 | (A)-1-1 [100] | (C)-1 [15.0] | (G)-1 [15.0] | (F)-1 [3.0] | (S)-3 [3300] |
| Ex. 6 | (A)-1-1 [100] | (C)-1 [15.0] | (G)-1 [15.0] | (F)-1 [3.0] | (S)-4 [3300] |
| Ex. 7 | (A)-1-1 [100] | (C)-1 [15.0] | (G)-1 [15.0] | (F)-1 [3.0] | (S)-5 [3300] |
| Ex. 8 | (A)-1-1 [100] | (C)-1 [15.0] | (G)-1 [15.0] | (F)-1 [3.0] | (S)-6 [3300] |
| Ex. 9 | (A)-1-1 [100] | (C)-1 [15.0] | (G)-1 [15.0] | (F)-1 [3.0] | (S)-7 [3300] |
| Ex. 10 | (A)-1-1 [100] | (C)-1 [15.0] | (G)-1 [15.0] | (F)-1 [3.0] | (S)-8 [3300] |
| Ex. 11 | (A)-1-1 [100] | (C)-1 [15.0] | (G)-1 [15.0] | (F)-1 [3.0] | (S)-9 [3300] |
| Ex. 12 | (A)-1-1 [100] | (C)-1 [15.0] | (G)-1 [15.0] | (F)-1 [3.0] | (S)-10 [3300] |
| Ex. 13 | (A)-1-1 [100] | (C)-1 [15.0] | (G)-1 [15.0] | (F)-1 [3.0] | (S)-11 [3300] |
| Ex. 14 | (A)-1-1 [100] | (C)-1 [15.0] | (G)-1 [15.0] | (F)-1 [3.0] | (S)-12 [3300] |
| Ex. 15 | (A)-1-1 [100] | (C)-1 [15.0] | (G)-1 [15.0] | (F)-1 [3.0] | (S)-13 [3300] |
| Ex. 16 | (A)-1-1 [100] | (C)-1 [15.0] | (G)-1 [15.0] | (F)-1 [3.0] | (S)-14 [3300] |
| Ex. 17 | (A)-1-1 [100] | (C)-1 [15.0] | (G)-1 [15.0] | (F)-1 [3.0] | (S)-15 [3300] |
| Ex. 18 | (A)-1-2 [100] | (C)-1 [15.0] | (G)-1 [15.0] | (F)-1 [3.0] | (S)-2 [3300] |
| Comp. Ex. 4 | (A)-1-1 [100] | (C)-1 [15.0] | (G)-1 [15.0] | (F)-1 [3.0] | (S)-16 [3300] |
| Comp. Ex. 5 | (A)-1-2 [100] | (C)-1 [15.0] | (G)-1 [15.0] | (F)-1 [3.0] | (S)-17 [3300] |
| Comp. Ex. 6 | (A)-1-1 [100] | (C)-1 [15.0] | (G)-1 [15.0] | (F)-1 [3.0] | (S)-18 [3300] |
| Comp. Ex. 7 | (A)-1-2 [100] | (C)-1 [15.0] | (G)-1 [15.0] | (F)-1 [3.0] | (S)-19 [3300] |

In Table 4, the values in brackets [ ] indicate the amount (in terms of parts by weight) of the component added, and the reference characters indicate the following.

(A)-1-1: a copolymer represented by chemical formula (A1-1-1) shown below. Mw: 7,000, Mw/Mn: 1.56. In the chemical formula, the subscript numerals shown on the bottom right of the parentheses ( ) indicate the percentage (mol %) of the respective structural units.

(A)-1-2: a copolymer represented by chemical formula (A1-1-2) shown below. Mw: 4,500, Mw/Mn: 1.45. In the chemical formula, the subscript numerals shown on the bottom right of the parentheses ( ) indicate the percentage (mol %) of the respective structural units.

(C)-1: a compound represented by the aforementioned chemical formula (C)-1.

(G)-1: a compound represented by the aforementioned chemical formula (G)-1.

(F)-1: a polymer represented by the aforementioned chemical formula (F)-1.

[Chemical Formula 88]

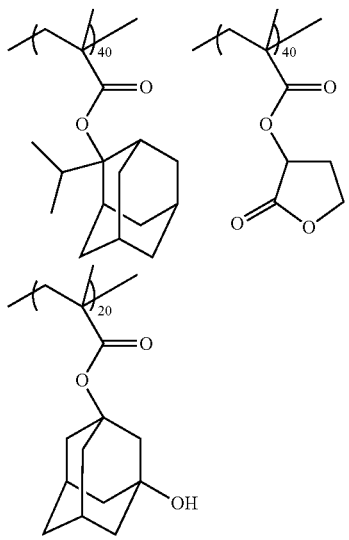

(S)-2: propyleneglycol monomethyletheracetate (PGMEA).

(S)-3: a mixed solvent of PGMEA/propylene glycol monomethyl ether (PGME)=60/40 (weight ratio)

(S)-4: a mixed solvent of PGMEA/PGME/cyclohexanone (CH)=45/30/25 (weight ratio)

(S)-5: a mixed solvent of PGMEA/isobutanol (IBA)=80/20 (weight ratio)

(S)-6: a mixed solvent of PGMEA/butyl acetate (BuAc)=80/20 (weight ratio)

(S)-7: a mixed solvent of butyl propionate (nBP)/PGMEA=80/20 (weight ratio)

(S)-8: a mixed solvent of nBP/PGME=80/20 (weight ratio)

(S)-9: a mixed solvent of PGMEA/ethyl lactate (EL)=60/40 (weight ratio)

(S)-10: a mixed solvent of PGMEA/1-butoxy-2-propanol (DB)=90/10 (weight ratio)

(S)-11: a mixed solvent of PGMEA/ethyl 3-ethoxypropionate (EEP)=90/10 (weight ratio)

(S)-12: a mixed solvent of PGMEA/CH=90/10 (weight ratio)

(S)-13: a mixed solvent of PGMEA/γ-butyrolactone (GBL)=95/5 (weight ratio)

(S)-14: a mixed solvent of PGMEA/CH=40/60 (weight ratio)

(S)-15: EL (S)-16: a mixed solvent of PGMEA/GBL=40/60 (weight ratio)

(S)-17: a mixed solvent of PGMEA/DB=30/70 (weight ratio)

(S)-18: a mixed solvent of PGMEA/EEP=40/60 (weight ratio)

(S)-19: DB

The boiling points (under a pressure of 1 atm) are as follows.

PGMEA: 146° C., PGME: 132° C., CH: 156° C., IBA: 107° C., BuAc: 126° C., nBP: 145° C., EL: 154° C., DB: 170° C., EEP: 170° C., GBL: 204° C.

Formation of Resist Film

The resist composition of each example was dripped from a nozzle of a coating apparatus (product name: TEL ACT 8; manufactured by Tokyo Elctron Limited) onto an 8-inch silicon wafer near the center thereof, followed by spin coating, thereby forming a resist film having a film thickness of 100 nm over the entire surface of the silicon wafer.

With respect to each resist film, no prebaking was conducted, and the resist film was allowed to stand on a cooling plate at 23° C. for 60 seconds.

Evaluation of Uniformity of Film Thickness of Resist Film

With respect to a formed resist film, the resist film thickness (nm) was measured at 20 measuring points on a line within the silicon wafer surface, using a resist film thickness measuring apparatus Nanospec (manufactured by Nanometrics Incorporated). From the measurement results, 3σ of the resist film thickness was determined, so as to evaluate the uniformity of the film thickness of the resist film. The results are shown in Table 5.

"3σ" is a value of 3 times the standard deviation (σ) determined from the measurement results with respect to 20 predetermined points within the silicon wafer surface. The smaller the 3σ value, the smaller the variation of the film thickness within the surface, meaning that a resist film with a high uniformity of the film thickness was obtained. In the present evaluation, when the 3σ value was less than 2.0, the uniformity of the film thickness was regarded as being excellent, and when the 3σ was 2.0 or more, the uniformity of the film thickness was regarded as being poor.

TABLE 5

|   | Component (S) | Mixing ratio r (weight ratio) | Boiling point T (° C.) | Sum of product Σ(T × r/100) | 3σ |
| --- | --- | --- | --- | --- | --- |
| Ex. 4 | PGMEA | 100 | 146.0 | 146.0 | 0.6 |
| Ex. 5 | PGMEA/PGME | 60/40 | 146.0/132.0 | 140.4 | 0.6 |
| Ex. 6 | PGMEA/PGME/CH | 45/30/25 | 146.0/132.0/156.0 | 144.3 | 0.6 |
| Ex. 7 | PGMEA/IBA | 80/20 | 146.0/107.0 | 138.2 | 0.5 |
| Ex. 8 | PGMEA/BuAc | 80/20 | 146.0/126.0 | 142.0 | 0.6 |
| Ex. 9 | nBP/PGMEA | 80/20 | 145.0/146.0 | 145.2 | 0.6 |

TABLE 5-continued

| | Component (S) | Mixing ratio r (weight ratio) | Boiling point T (°C.) | Sum of product $\Sigma(T \times r/100)$ | 3σ |
|---|---|---|---|---|---|
| Ex. 10 | nBP/PGME | 80/20 | 145.0/132.0 | 142.4 | 0.6 |
| Ex. 11 | PGMEA/EL | 60/40 | 146.0/154.0 | 149.2 | 0.8 |
| Ex. 12 | PGMEA/DB | 90/10 | 146.0/170.0 | 148.4 | 0.9 |
| Ex. 13 | PGMEA/EEP | 90/10 | 146.0/170.0 | 148.4 | 0.9 |
| Ex. 14 | PGMEA/CH | 90/10 | 146.0/156.0 | 147.0 | 0.9 |
| Ex. 15 | PGMEA/GBL | 95/5 | 146.0/204.0 | 148.9 | 0.7 |
| Ex. 16 | PGMEA/CH | 40/60 | 146.0/156.0 | 152.0 | 2.1 |
| Ex. 17 | EL | 100 | 154.0 | 154.0 | 2.5 |
| Ex. 18 | PGMEA | 100 | 146.0 | 146.0 | 0.6 |
| Comp. Ex. 4 | PGMEA/GBL | 40/60 | 146.0/204.0 | 180.8 | Over 10 |
| Comp. Ex. 5 | PGMEA/DB | 30/70 | 146.0/170.0 | 162.8 | 3.5 |
| Comp. Ex. 6 | PGMEA/EEP | 40/60 | 146.0/170.0 | 160.4 | 3.0 |
| Comp. Ex. 7 | DB | 100 | 170.0 | 170.0 | 4.8 |

From the results shown in Table 5, it was found that, according to the resist compositions of Examples 4 to 18, a resist film could be formed on a substrate with a high uniformity of the film thickness.

Formation of Resist Pattern

Example 19

Step (1')

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 82 nm.

Then, the resist composition of Example 5 was spin-coated on the organic antireflection film, thereby forming a resist film having a film thickness of 100 nm.

Step (2')

Without conducting prebaking (PAB) of the thus formed resist film, the substrate was allowed to stand on a cooling plate at 23° C. for 60 seconds. Then, the resist film was irradiated with an ArF excimer laser (193 nm) through a photomask (half tone) targeting an SL pattern with a space width of 130 nm and a pitch of 260 nm, using an ArF exposure apparatus NSR-S302 (manufactured by Nikon Corporation; NA (numerical aperture)=0.60, ⅔ annular).

Step (3')

Next, a baking treatment (PEB: post exposure bake) was conducted at 90° C. for 60 seconds.

Step (4')

Thereafter, alkali developing was conducted for 30 seconds at 23° C. in a 2.38% by weight aqueous solution of tetramethylammonium hydroxide (TMAH) (product name: NMD-3; manufactured by Tokyo Ohka Kogyo Co., Ltd.).

Evaluation of Resolution

With respect to the formation of the above resist pattern targeting an SL pattern having a space width of 130 nm (pitch: 260 nm), the resolution was evaluated.

As a result, by the method of forming a resist pattern according to Example 19, unexposed portions of the resist film were dissolved and removed, a high contrast image was obtained, and an SL pattern was formed with a high resolution.

Third Aspect

Production of Resist Composition

The components shown in Table 6 were mixed together and dissolved to obtain resist compositions.

TABLE 6

| | Component (A) | Component (C) | Component (G) | Component (D) | Component (F) | Component (S) |
|---|---|---|---|---|---|---|
| Resist composition (3) | (A)-1 [100] | (C)-1 [20.0] | (G)-2 [4.0] | (D)-1 [4.0] | (F)-1 [3.0] | (S)-1 [3721.5] |
| Resist composition (4) | (A)-1 [100] | (C)-1 [10.0] | (G)-1 [10.0] | (D)-1 [4.0] | (F)-1 [3.0] | (S)-1 [3721.5] |
| Resist composition (5) | (A)-2 [100] | (C)-1 [10.0] | (G)-1 [10.0] | (D)-1 [4.0] | (F)-1 [3.0] | (S)-1 [3721.5] |

In Table 6, the values in brackets [ ] indicate the amount (in terms of parts by weight) of the component added, and the reference characters indicate the following.

(A)-3: a copolymer represented by chemical formula (A1-3) shown below. Mw: 7,000, Mw/Mn: 1.57. In the chemical formula, the subscript numerals shown on the bottom right of the parentheses ( ) indicate the percentage (mol %) of the respective structural units.

(A)-4: a copolymer represented by chemical formula (A1-4) shown below. Mw: 7,000, Mw/Mn: 1.56. In the chemical formula, the subscript numerals shown on the bottom right of the parentheses ( ) indicate the percentage (mol %) of the respective structural units.

[Chemical Formula 89]

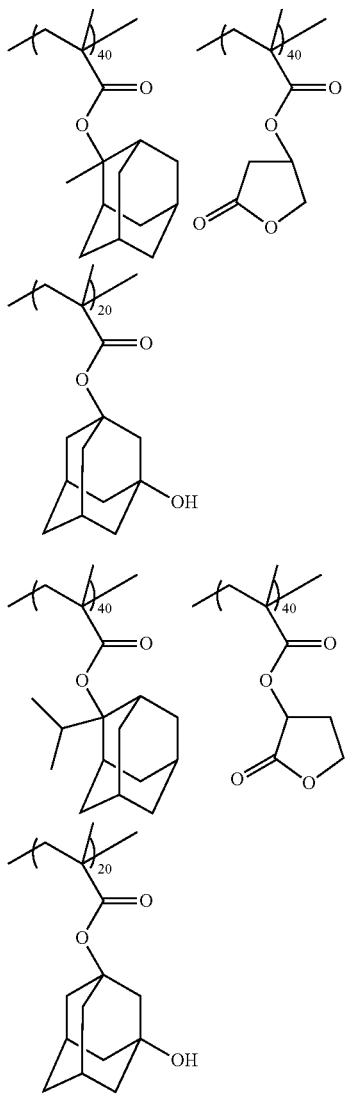

(C)-1: a compound represented by the aforementioned chemical formula (C)-1.

(G1-1): a compound represented by the aforementioned chemical formula (G1-1) (cation pKa=5.6, anion pKa=−11.55)

(G)-2: a compound represented by chemical formula (G)-2 shown below (pKa=−11.55)

(D)-1: heptafluorobutylamine ($CF_3CF_2CF_2CH_2NH_2$, boiling point=69° C., pKa=5.6).

(F)-1: a polymer represented by the aforementioned chemical formula (F)-1.

[Chemical Formula 90]

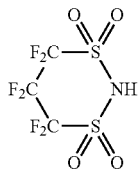

(G)-2

(S)-1: a mixed solvent of PGMEA/PGME=6/4 (weight ratio)

Examples 20 to 33, Comparative Examples 8 to 10

Reference Example 1

Evaluation of Elution

One of the aforementioned resist compositions (3) to (5) was applied to an 8-inch silicon wafer that had its surface treated with hexamethyldisilazane (HMDS), followed by rotating the spinner with the main rotation time and the rotation time (total rotation time) indicated in Table 7, thereby forming a resist film having a film thickness of 100 nm. After forming the resist film of each example and comparative example, the resist film was allowed to stand at 23° C. for 60 seconds. In Reference Example 1, the resist film was prebaked (PAB) at 90° C. for 60 seconds.

Subsequently, using VRC310S (product name; manufactured by S.E.S CO., LTD.), one droplet of pure water (150 μL) was moved from the center of the wafer in a circular manner at room temperature at a constant linear velocity (total area of the resist film that came in contact with the droplet: 221.56 $cm^2$).

Thereafter, the droplet was collected, and the component (G) was analyzed by an analyzing apparatus Agilent-HP1100 LC-MSD (product name; manufactured by Agilent Technologies), and the amount of the compound represented by formula (G)-2 which had eluted from the resist film ($\times 10^{-12}$ mol/$cm^2 \cdot s^{-1}$) was determined. The results are shown in Table 7.

TABLE 7

| | Resist composition | Rotation time (seconds) | Main rotation time (seconds) | Treatment after formation of resist film | Amount of elution ($\times 10^{-12}$ mol/$cm^2 \cdot s^{-1}$) |
|---|---|---|---|---|---|
| Comp. Ex. 8 | (3) | 45 | 20 | Allowed to stand at 23° C. for 60 seconds | 4.02 |
| Comp. Ex. 9 | (4) | 45 | 20 | Allowed to stand at 23° C. for 60 seconds | 8.08 |
| Comp. Ex. 10 | (5) | 45 | 20 | Allowed to stand at 23° C. for 60 seconds | 6.68 |
| Ex. 20 | (3) | 55 | 30 | Allowed to stand at 23° C. for 60 seconds | 1.42 |
| Ex. 21 | (4) | 55 | 30 | Allowed to stand at 23° C. for 60 seconds | 3.54 |
| Ex. 22 | (5) | 55 | 30 | Allowed to stand at 23° C. for 60 seconds | 3.86 |

TABLE 7-continued

| | Resist composition | Rotation time (seconds) | Main rotation time (seconds) | Treatment after formation of resist film | Amount of elution ($\times 10^{-12}$ mol/cm$^2 \cdot$ s$^{-1}$) |
|---|---|---|---|---|---|
| Ex. 23 | (3) | 55 | 10 | Allowed to stand at 23° C. for 60 seconds | 1.92 |
| Ex. 24 | (3) | 55 | 20 | Allowed to stand at 23° C. for 60 seconds | 1.56 |
| Ex. 25 | (3) | 65 | 40 | Allowed to stand at 23° C. for 60 seconds | 0.99 |
| Ex. 26 | (4) | 65 | 40 | Allowed to stand at 23° C. for 60 seconds | 2.60 |
| Ex. 27 | (5) | 65 | 40 | Allowed to stand at 23° C. for 60 seconds | 3.46 |
| Ex. 28 | (3) | 85 | 60 | Allowed to stand at 23° C. for 60 seconds | 1.04 |
| Ex. 29 | (4) | 85 | 60 | Allowed to stand at 23° C. for 60 seconds | 2.88 |
| Ex. 30 | (5) | 85 | 60 | Allowed to stand at 23° C. for 60 seconds | 1.90 |
| Ex. 31 | (3) | 145 | 120 | Allowed to stand at 23° C. for 60 seconds | 1.01 |
| Ex. 32 | (4) | 145 | 120 | Allowed to stand at 23° C. for 60 seconds | 2.08 |
| Ex. 33 | (5) | 145 | 120 | Allowed to stand at 23° C. for 60 seconds | 2.60 |
| Ref. Ex. 1 | (5) | 55 | 30 | Baking at 90° C. for 60 seconds | 3.75 |

In Examples 20 to 22 and Reference Example 1, spin coating was conducted under the same conditions as in the steps indicated in Table 1.

In Examples 23 and 24 in which the total rotation time was the same as that in Examples 20 to 22, the main rotation time was changed to those indicated in Table 7. Further, in Example 24, step 4 of the rotation steps indicated in Table 1 was changed to 15 seconds, and in Example 23, steps 4 and 9 were changed to 15 seconds, so as to adjust the total rotation time to 55 seconds.

In the other examples, among the steps of Examples 20 to 22, only the main rotation time was changed as indicated in Table 7.

Example 34

Formation of Resist Pattern (1)

Step (1)

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 79 nm.

Then, the aforementioned resist composition (5) was spin-coated on the organic antireflection film under the conditions of Example 22, thereby forming a resist film having a film thickness of 100 nm.

Step (2)

Subsequently, without conducting prebaking (PAB) of the thus formed resist film, the resist film was irradiated with an ArF excimer laser (193 nm) through a photomask (half tone) targeting an SL pattern with a space width of 130 nm and a pitch of 260 nm, using an ArF exposure apparatus NSR-S302 (manufactured by Nikon Corporation; NA (numerical aperture)=0.60, ⅔ annular).

Step (3)

Next, a baking treatment (PEB: post exposure bake) was conducted at 90° C. for 60 seconds.

Step (4)

Thereafter, alkali developing was conducted for 30 seconds at 23° C. in a 2.38% by weight aqueous solution of tetramethylammonium hydroxide (TMAH) (product name: NMD-3; manufactured by Tokyo Ohka Kogyo Co., Ltd.).

Reference Example 2

Formation of Resist Pattern (2)

Pattern formation was performed in the same manner as in Example 34, except that, in step (1), the aforementioned resist composition (5) was spin coated under the conditions of Reference Example 1.

As a result, according to the method of forming a resist pattern of Example 34, a 1:1 SL pattern of 130 nm could be formed. On the other hand, according to the method of forming a resist pattern of Reference Example 2, a 1:1 SL pattern of 130 nm could not be resolved.

From the results shown above, it was confirmed that, by the method of forming a resist pattern according to the present invention, a pattern could be formed with a high resolution, as compared to a conventional method of forming a resist pattern including a prebaking step. Further, from the results shown in Table 7, it was confirmed that, in Examples 20 to 33 in which the rotation time was 50 seconds or more, the amount of elution was reduced to about the same level or a lower level than Comparative Example 8 in which prebaking was conducted, meaning that a satisfactory film formability could be achieved without prebaking.

Furthermore, it was confirmed that the longer the rotation time, the smaller the amount of elution. On the other hand, in Comparative Examples 8 to 10 in which the rotation time was less than 50 seconds, the amount of elution was large, and the film formability was unsatisfactory.

In addition, in Examples 20, 23 and 24 in which the resist composition (3) was used and the total rotation time was 55 seconds, it was confirmed that, the longer the main rotation time, the smaller the amount of elution and the better the film formability.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a resist pattern, comprising:
    a step (1) in which a resist composition comprising a base component that exhibits increased solubility in an alkali developing solution under action of acid, a photobase generator component that generates base upon exposure and an acidic compound component are applied to a substrate to form a resist film;
    a step (2) in which the resist film is subjected to exposure without being subjected to prebaking;
    a step (3) in which baking is conducted after the step (2), such that, at an exposed portion of the resist film, the base generated from the photobase generator component upon the exposure and the acidic compound component are neutralized, and at an unexposed portion of the resist film, the solubility of the base component in an alkali developing solution is increased by the action of the acidic compound component; and
    a step (4) in which the resist film is subjected to an alkali development, thereby forming a negative-tone resist pattern in which the unexposed portion of the resist film has been dissolved and removed.

2. The method of forming a resist pattern according to claim 1, wherein the resist film formed in the step (1) has a film thickness of 300 nm or less.

3. The method of forming a resist pattern according to claim 1, wherein the step (2) comprises conducting exposure through an immersion medium.

4. The method of forming a resist pattern according to claim 1, wherein the acidic compound component is an acid salt having an acid strength sufficient for increasing the solubility of the base component in an alkali developing solution or an acid other than an acid salt.

5. A method of forming a resist pattern, comprising:
    a step (1') in which a resist composition comprising a base component that exhibits increased solubility in an alkali developing solution under action of acid, a photobase generator component that generates base upon exposure and an acidic compound component dissolved in an organic solvent component (S) is applied to a substrate to form a resist film, wherein the organic solvent component (S) satisfies the following relationship:

$$[\Sigma/(T \times r/100)] \leq 160° C.$$

wherein T represents the boiling point of an organic solvent within the organic solvent component (S) in terms of °C., and r represents the proportion of the organic solvent within the organic solvent component (S) in terms of weight %;
    a step (2') in which the resist film is subjected to exposure without being subjected to prebaking;
    a step (3') in which baking is conducted after the step (2'), such that, at an exposed portion of the resist film, the base generated from the photobase generator component upon the exposure and the acidic compound component are neutralized, and at an unexposed portion of the resist film, the solubility of the base component in an alkali developing solution is increased by the action of the acidic compound component; and
    a step (4') in which the resist film is subjected to an alkali development, thereby forming a negative-tone resist pattern in which the unexposed portion of the resist film has been dissolved and removed.

6. The method of forming a resist pattern according to claim 5, wherein the resist film formed in the step (1') has a film thickness of 300 nm or less.

7. The method of forming a resist pattern according to claim 5, wherein the step (2') comprises conducting exposure through an immersion medium.

8. The method of forming a resist pattern according to claim 5, wherein the acidic compound component is an acid salt having an acid strength sufficient for increasing the solubility of the base component in an alkali developing solution or an acid other than an acid salt.

9. A method of forming a resist pattern, comprising:
    a step (1") in which a resist composition comprising a base component that exhibits increased solubility in an alkali developing solution under action of acid, a photobase generator component that generates base upon exposure and an acidic compound component are applied to a substrate by a spin-coat method to form a resist film;
    a step (2") in which the resist film is subjected to exposure without being subjected to prebaking;
    a step (3") in which baking is conducted after the step (2"), such that, at an exposed portion of the resist film, the base generated from the photobase generator component upon the exposure and the acidic compound component are neutralized, and at an unexposed portion of the resist film, the solubility of the base component in an alkali developing solution is increased by the action of the acidic compound component; and
    a step (4") in which the resist film is subjected to an alkali development, thereby forming a negative-tone resist pattern in which the unexposed portion of the resist film has been dissolved and removed,
    wherein, in application of the resist composition in step (1"), a rotation time after supplying the resist composition on the substrate is 50 seconds or more.

10. The method of forming a resist pattern according to claim 9, wherein the step (2") comprises conducting exposure through an immersion medium.

11. The method of forming a resist pattern according to claim 9, wherein the resist composition comprises an amine.

12. The method of forming a resist pattern according to claim 9, wherein the acidic compound component is an acid salt having an acid strength sufficient for increasing the solubility of the base component in an alkali developing solution or an acid other than an acid salt.

* * * * *